(12) United States Patent  (10) Patent No.: US 9,264,693 B2
Kurokawa  (45) Date of Patent: Feb. 16, 2016

(54) MOTION RECOGNITION DEVICE

(71) Applicant: Semiconductor Energy Laboratory Co., Ltd., Atsugi-shi, Kanagawa-ken (JP)

(72) Inventor: Yoshiyuki Kurokawa, Sagamihara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 556 days.

(21) Appl. No.: 13/718,012

(22) Filed: Dec. 18, 2012

(65) Prior Publication Data

US 2013/0162778 A1   Jun. 27, 2013

(30) Foreign Application Priority Data

Dec. 26, 2011   (JP) .................................. 2011-284139
Jan. 18, 2012   (JP) .................................. 2012-007680
Jan. 26, 2012   (JP) .................................. 2012-014533

(51) Int. Cl.
*H04N 13/02* (2006.01)
*G01S 7/486* (2006.01)
*G01S 17/50* (2006.01)
*G01S 17/89* (2006.01)
(Continued)

(52) U.S. Cl.
CPC .............. *H04N 13/02* (2013.01); *G01S 7/4861* (2013.01); *G01S 7/4866* (2013.01); *G01S 17/50* (2013.01); *G01S 17/89* (2013.01); *G06T 7/204* (2013.01); *H01L 27/14601* (2013.01); *G06T 2207/10028* (2013.01)

(58) Field of Classification Search
None
See application file for complete search history.

(56) References Cited

U.S. PATENT DOCUMENTS 4,438,455 A   3/1984   Tabei
5,731,856 A   3/1998   Kim et al.
(Continued)

FOREIGN PATENT DOCUMENTS

EP   0837418 A   4/1998
EP   1737044 A   12/2006
(Continued)

OTHER PUBLICATIONS

International Search Report (Application No. PCT/JP2012/081434) Dated Jan. 22, 2013.
(Continued)

*Primary Examiner* — William C Vaughn, Jr.
*Assistant Examiner* — Eileen Adams
(74) *Attorney, Agent, or Firm* — Robinson Intellectual Property Law Office; Eric J. Robinson

(57) ABSTRACT

A motion recognition device capable of recognizing the motion of an object without contact with the object is provided. Further, a motion recognition device that has a simple structure and can recognize the motion of an object regardless of the state of the object is provided. By using a 3D TOF range image sensor in the motion recognition device, information on changes in position and shape is detected easily. Further, information on changes in position and shape of a fast-moving object is detected easily. Motion recognition is performed on the basis of pattern matching. Imaging data used for pattern matching is acquired from a 3D range measuring sensor. Object data is selected from imaging data on an object that changes over time, and motion data is estimated from a time change in selected object data. The motion recognition device performs operation defined by output data generated from the motion data.

11 Claims, 25 Drawing Sheets

(51) Int. Cl.
  *H01L 27/146* (2006.01)
  *G06T 7/20* (2006.01)

(56) References Cited

U.S. PATENT DOCUMENTS

| | | |
|---|---|---|
| 5,744,864 A | 4/1998 | Cillessen et al. |
| 5,965,875 A | 10/1999 | Merrill |
| 6,144,366 A | 11/2000 | Numazaki et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,747,638 B2 | 6/2004 | Yamazaki et al. |
| 7,009,690 B2 | 3/2006 | Kamon et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,271,835 B2 | 9/2007 | Iizuka et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,411,620 B2 | 8/2008 | Taniguchi et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,525,523 B2 | 4/2009 | Yamazaki et al. |
| 7,663,165 B2 | 2/2010 | Mouli |
| 7,674,650 B2 | 3/2010 | Akimoto et al. |
| 7,732,819 B2 | 6/2010 | Akimoto et al. |
| 8,344,306 B2 | 1/2013 | Kim |
| 2001/0046027 A1 | 11/2001 | Tai et al. |
| 2001/0046317 A1 | 11/2001 | Kamon et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0209651 A1 | 11/2003 | Iwasaki |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0126054 A1 | 6/2006 | Kamon et al. |
| 2006/0157760 A1 | 7/2006 | Hayashi et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0018075 A1 | 1/2007 | Cazaux et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0054319 A1 | 3/2008 | Mouli |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0187180 A1* | 8/2008 | Yui ............................ 382/107 |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0101948 A1 | 4/2009 | Park et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0228841 A1 | 9/2009 | Hildreth |
| 2009/0278825 A1 | 11/2009 | Hosono et al. |
| 2009/0279738 A1* | 11/2009 | Sasaki ........................ 382/103 |
| 2009/0280600 A1 | 11/2009 | Hosono et al. |
| 2009/0295769 A1 | 12/2009 | Yamazaki et al. |
| 2010/0020209 A1 | 1/2010 | Kim |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117991 A1 | 5/2010 | Koyama et al. |
| 2010/0182282 A1 | 7/2010 | Kurokawa et al. |
| 2010/0328319 A1 | 12/2010 | Ikenoue |
| 2011/0109591 A1 | 5/2011 | Kurokawa et al. |
| 2011/0109592 A1 | 5/2011 | Kurokawa et al. |
| 2011/0309236 A1* | 12/2011 | Tian et al. .................. 250/208.1 |
| 2012/0032193 A1 | 2/2012 | Kurokawa et al. |
| 2012/0056861 A1 | 3/2012 | Kurokawa et al. |
| 2012/0085890 A1 | 4/2012 | Kurokawa |
| 2013/0044917 A1 | 2/2013 | Kurokawa |

FOREIGN PATENT DOCUMENTS

| | | |
|---|---|---|
| EP | 2148514 A | 1/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-288875 A | 10/1995 |
| JP | 08-264794 A | 10/1996 |
| JP | 10-177449 A | 6/1998 |
| JP | 11-505377 | 5/1999 |
| JP | 2000-044236 A | 2/2000 |
| JP | 2000-150900 A | 5/2000 |
| JP | 2001-273503 A | 10/2001 |
| JP | 2001-337166 A | 12/2001 |
| JP | 2002-076356 A | 3/2002 |
| JP | 2002-289859 A | 10/2002 |

(56) References Cited

FOREIGN PATENT DOCUMENTS

| | | |
|---|---|---|
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-225985 A | 9/2008 |
| JP | 2010-035168 A | 2/2010 |
| JP | 2011-008601 A | 1/2011 |
| JP | 2011-128024 A | 6/2011 |
| JP | 2011-517357 | 6/2011 |
| KR | 2010-0011676 A | 2/2010 |
| WO | WO-2004/114391 | 12/2004 |
| WO | WO-2009/111329 | 9/2009 |

OTHER PUBLICATIONS

Written Opinion (Application No. PCT/JP2012/081434) Dated Jan. 22, 2013.

Fortunato.E et al., "Wide-Bandgap High-Mobility ZnO Thin-Film Transistors Produced at Room Temperature,", Appl. Phys. Lett. (Applied Physics Letters), Sep. 17 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The"Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

(56) References Cited

OTHER PUBLICATIONS

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 IN. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Brown.C et al., "31.3: A System LCD with Integrated 3-Dimensional Input Device," SID Digest '10 : SID International Symposium Digest of Technical Papers, 2010, pp. 453-456.

Tanaka.K et al., "45.5: A System LCD with Optical Input Function using Infra-Red Backlight Subtraction Scheme," SID Digest '10: SID International Symposium Digest of Technical Papers, 2010, pp. 680-683.

Jeon.S et al., "180nm Gate Length Amorphous InGaZnO Thin Film Transistor for High Density Image Sensor Applications," IEDM 10: Technical Digest of International Electron Devices Meeting, Dec. 6, 2010, pp. 504-507.

Kim.S et al., "A Three-Dimensional Time-of-Flight CMOS Image Sensor With Pinned-Photodiode Pixel Structure," IEEE Electron Device Letters, Nov. 1, 2010, vol. 31, No. 11, pp. 1272-1274.

Kim.S et al., "A 640×480 Image Sensor with Unified Pixel Architecture for 2D/3D Imaging in 0.11µm CMOS," 2011 Symposium on VLSI Circuits Digest of Technical Papers, Jun. 15, 2011, pp. 92-93.

\* cited by examiner

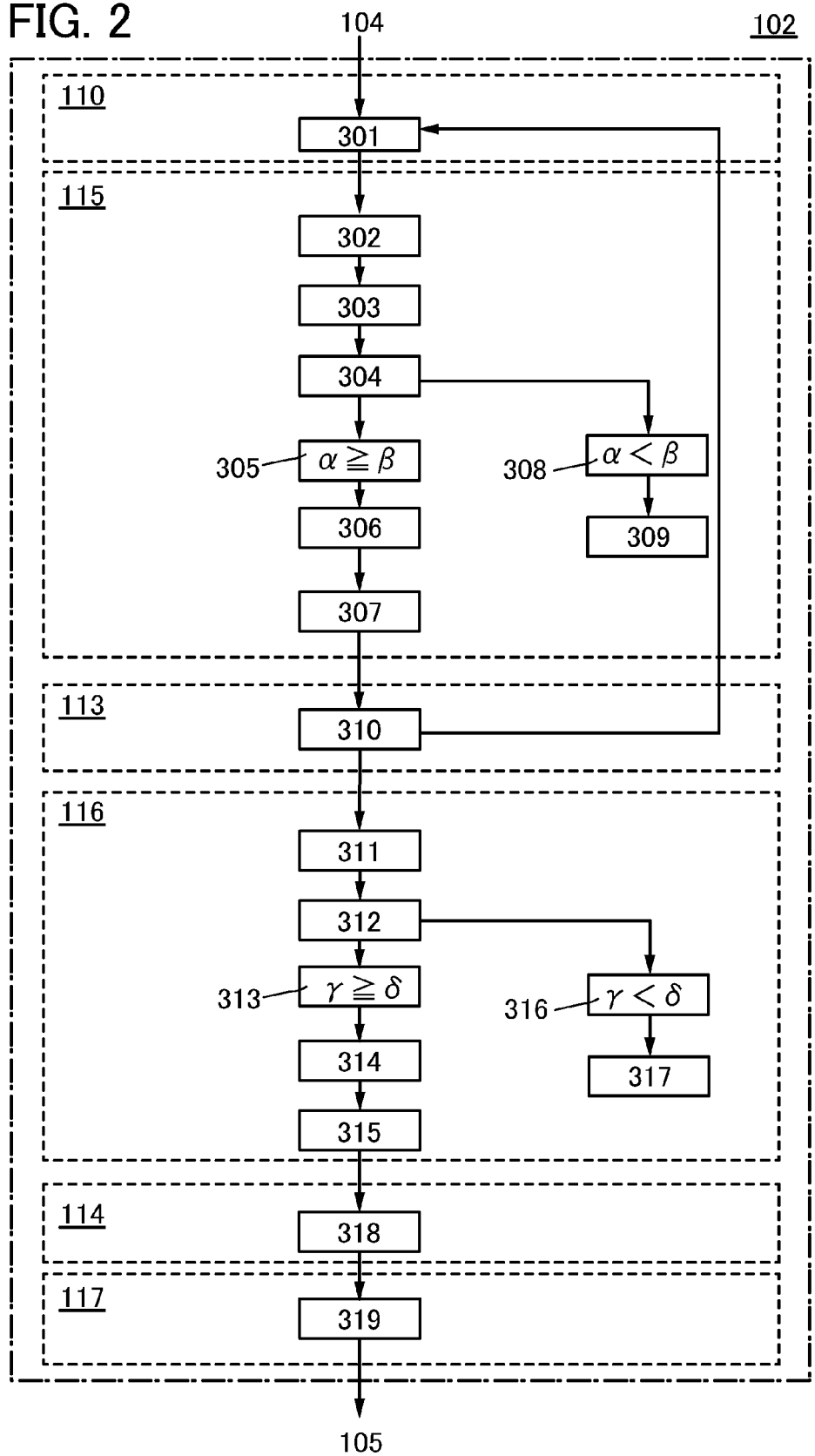

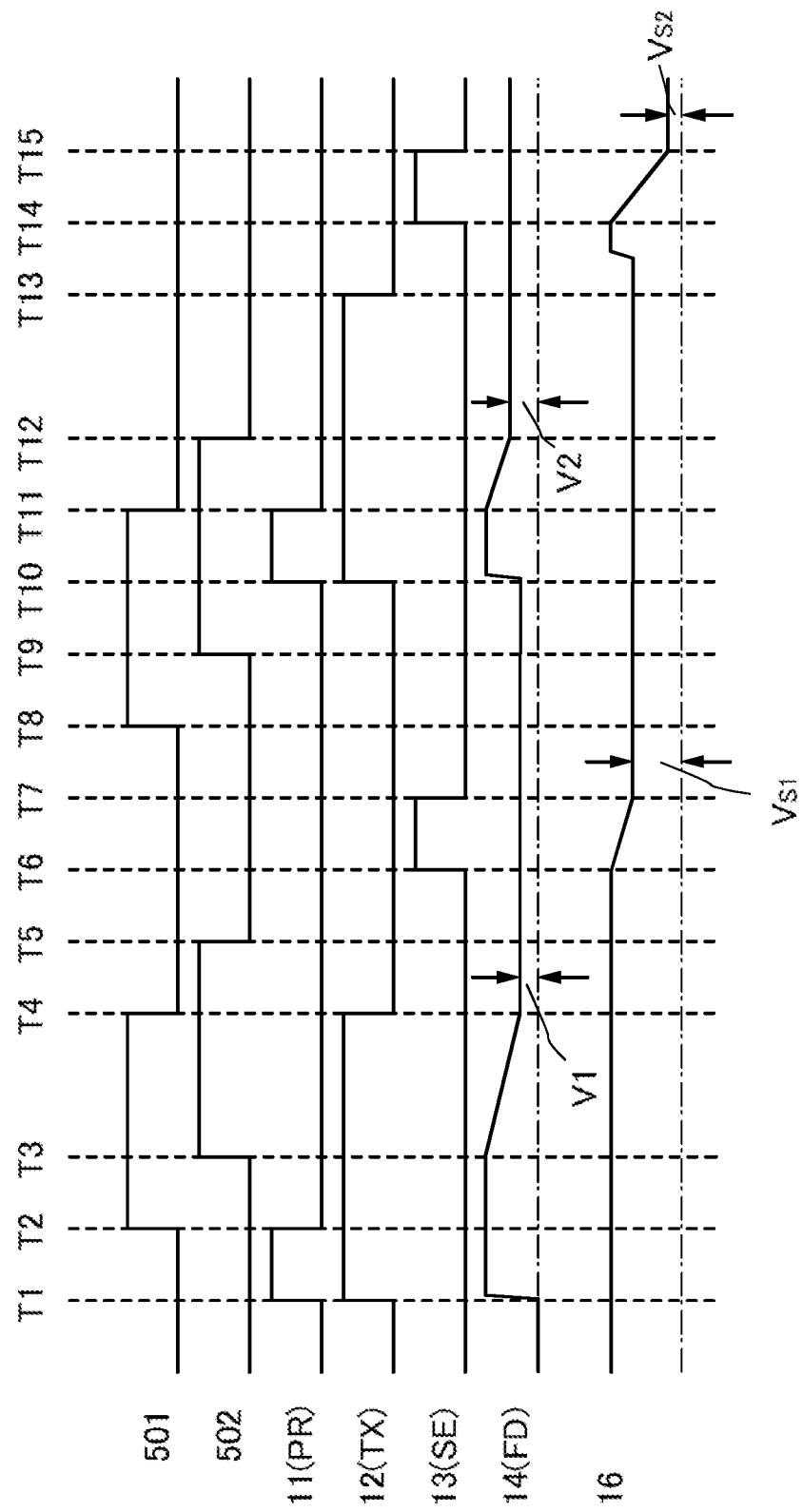

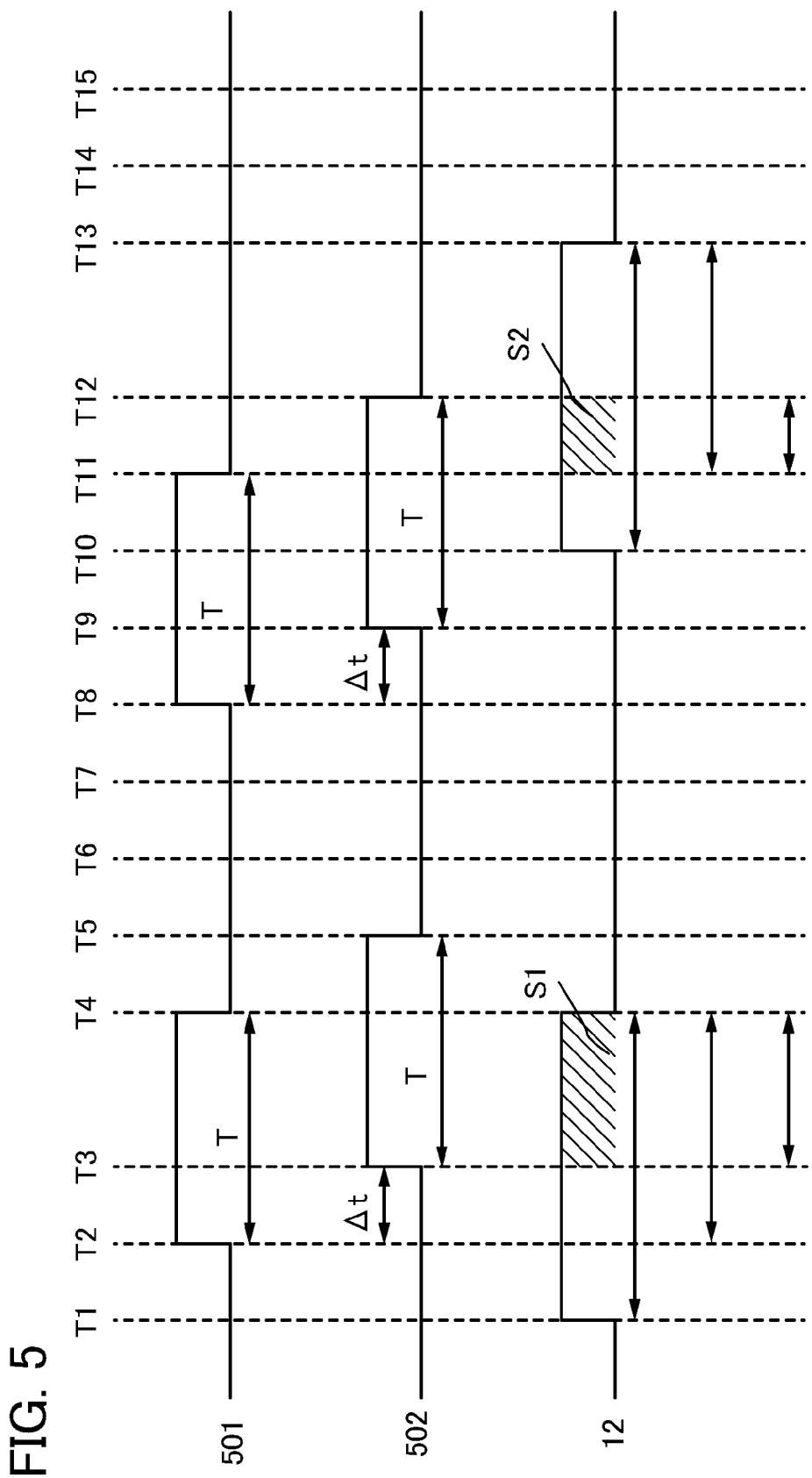

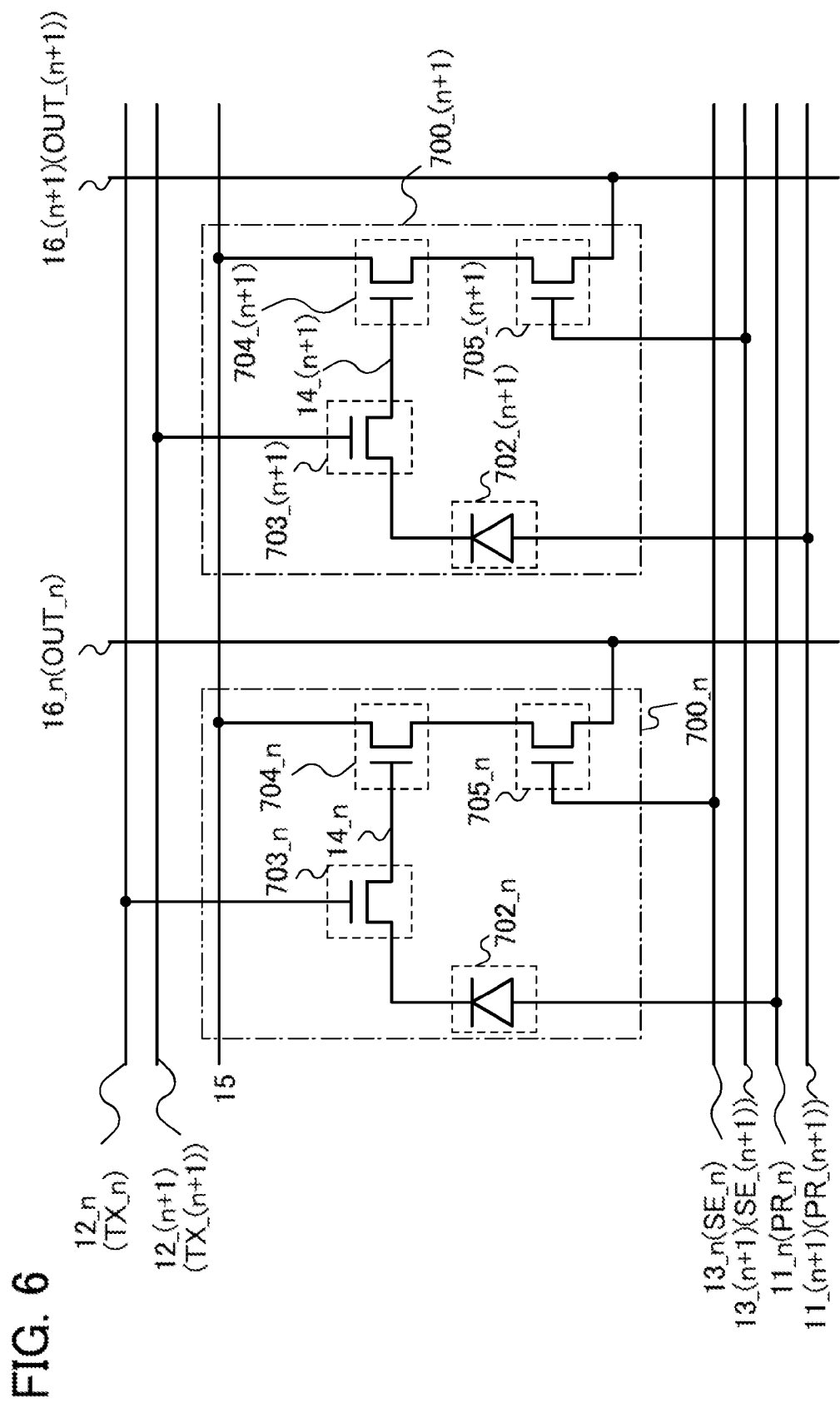

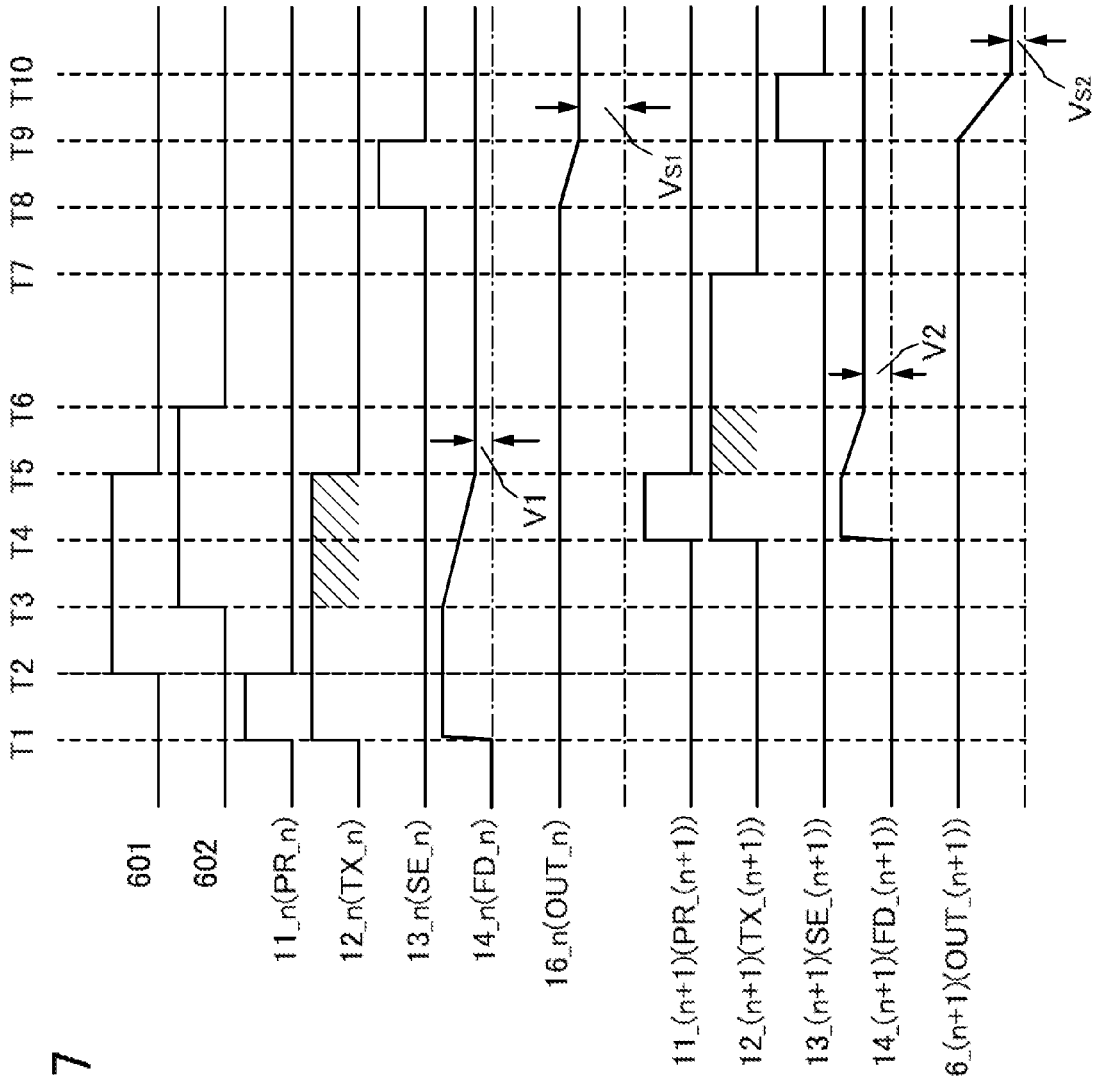

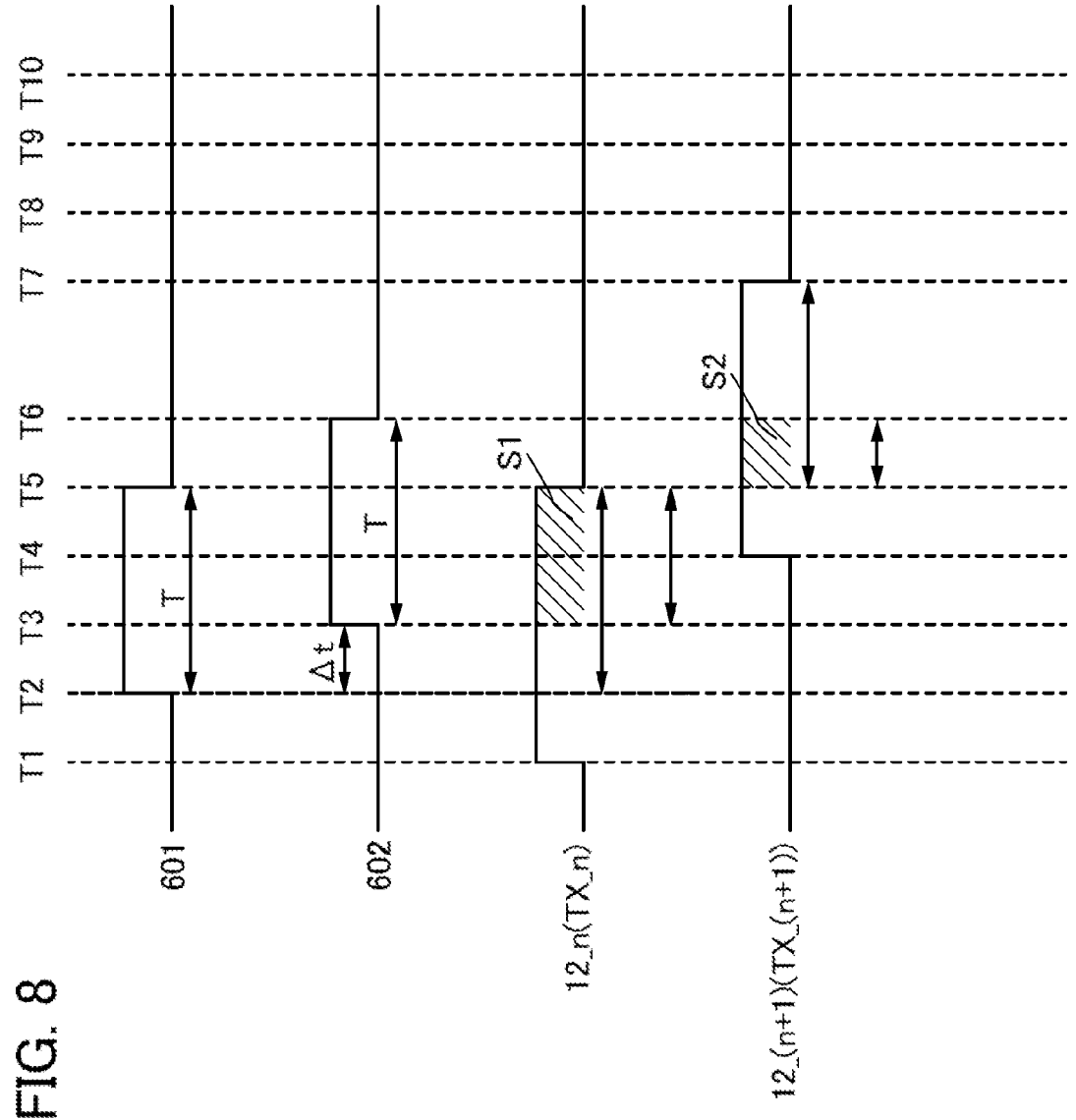

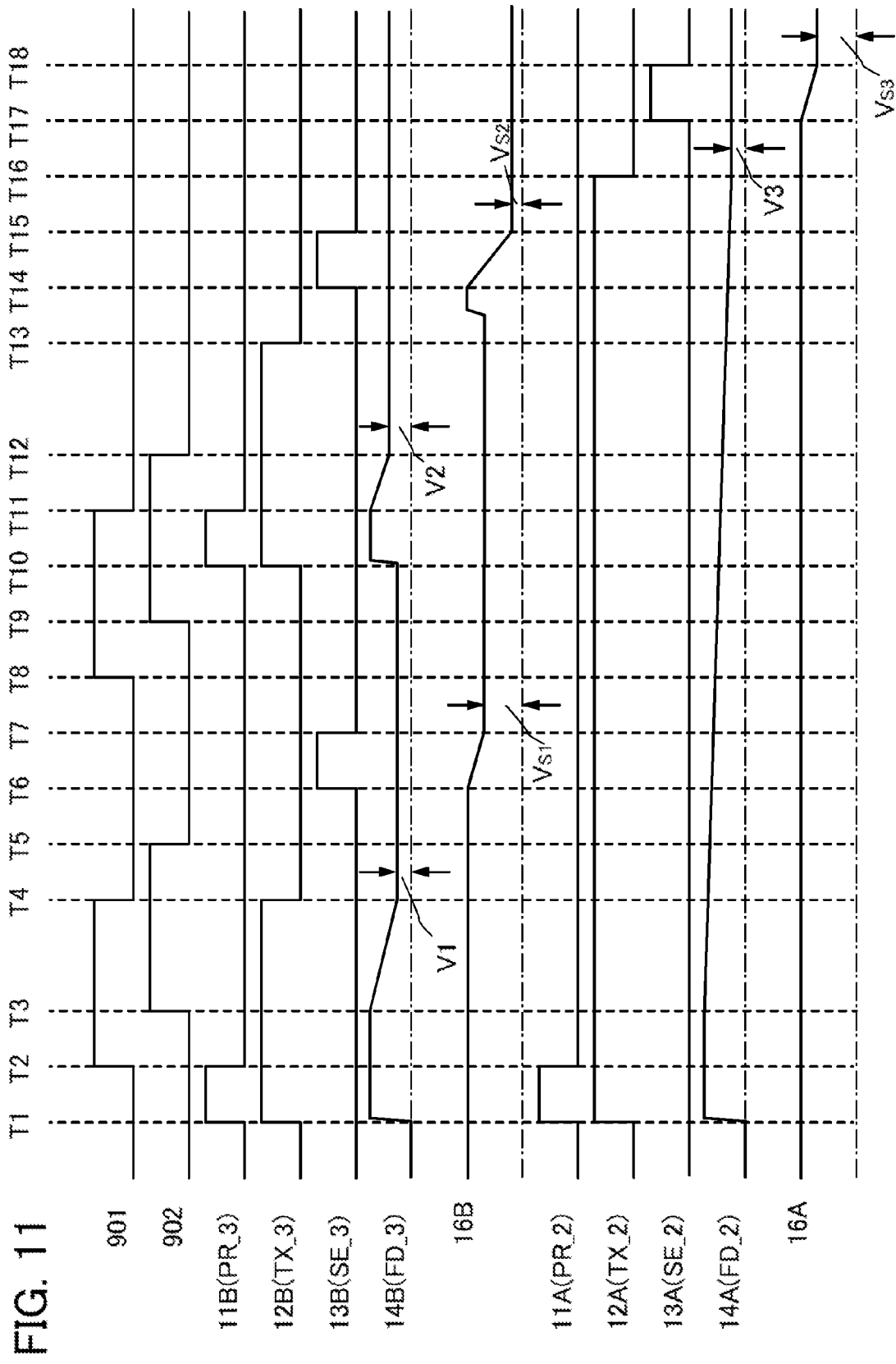

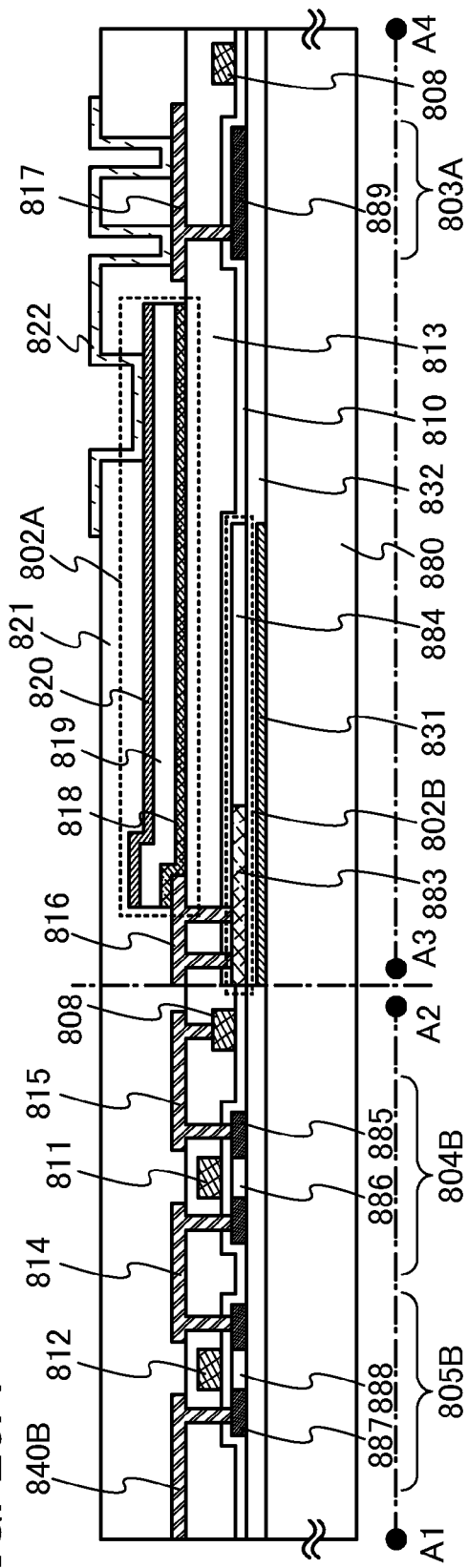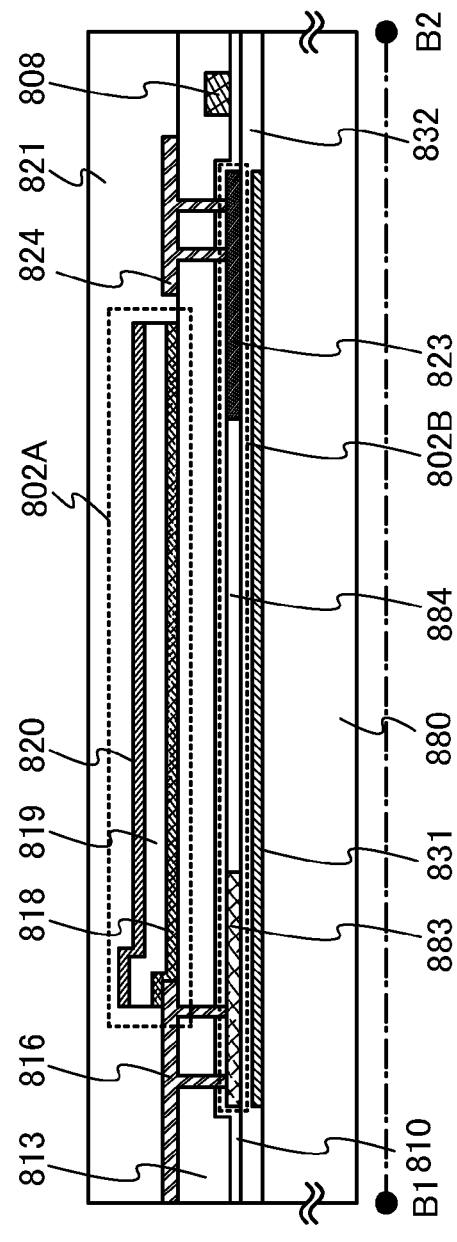

MOTION RECOGNITION DEVICE

TECHNICAL FIELD

The present invention relates to motion recognition devices including three-dimensional (3D) time-of-flight (TOF) range image sensors.

Note that in this specification, a semiconductor device generally means a device that can function by utilizing semiconductor characteristics, and an electrooptic device, a semiconductor circuit, and an electronic device are all semiconductor devices.

BACKGROUND ART

In recent years, images and displays have become three-dimensional and 3D information acquisition techniques have been actively developed. There are many expected applications of a 3D range image sensor capable of acquiring 3D spatial information in real time. For example, the 3D range image sensor is applied to a gesture recognition system, a computer vision system, or the like. Non-Patent Document 1 discloses a 3D TOF range image sensor that acquires range image information by irradiation of an object with light from a light source. The use of the sensor enables a small low-cost system as compared to the use of a 3D stereo range image sensor, a 3D laser scan range image sensor, or the like.

In addition, a motion recognition technique by which position change information, shape change information, and the like of an object are detected and motion information is recorded digitally has been widely used in areas such as sports medicine, movies, and computer animation. Patent Document 1 discloses an information processor including a user interface for detecting user's complicated motion easily.

Patent Document 2 discloses a system that calculates 3D range image information from a plurality of two-dimensional (2D) images acquired by imaging with a plurality of cameras and recognizes the motion of an object. Further, Patent Document 3 discloses a human body motion recognition sensor that recognizes the motion of a human body by detecting an infrared ray emitted from the human body.

REFERENCE

Patent Documents

Patent Document 1: Japanese Published Patent Application No. 2011-008601
Patent Document 2: Japanese Published Patent Application No. 2001-273503
Patent Document 3: Japanese Published Patent Application No. 7-288875

Non-Patent Document

Non-Patent Document 1: S. J. Kim et al, "A Three-Dimensional Time-of-Flight CMOS Image Sensor With Pinned-Photodiode Pixel Structure", IEEE Electron Device Letter, Vol. 31, No. 11, November 2010.

DISCLOSURE OF INVENTION

In Patent Document 1, a user is provided with a marker formed using a sensor or the like in each body part. By measuring a time change of the marker (e.g., a time change in position or shape), user's complicated motion is recorded properly. However, there are problems in that user's motion is restricted by the sensor and that it takes a long time to remove the marker.

In Patent Document 2, an object is always in the field of view of many cameras. There are problems in that the object needs to move in a predetermined comparatively small area so as not to be out of the field of view of the cameras and that the entire system is expensive because many cameras and sensors are needed.

Further, on the basis of a difference between a plurality of 2D images (color images) of an object that are taken by many cameras, 3D range image information on the object in an imaging area is estimated and calculated using the principle of triangulation. Thus, there are problems in that it takes an unnecessarily long time to perform arithmetic processing and that background processing or the like is needed to extract the position of the object from an image including a thing other than the object. Furthermore, there is a big problem in simplifying the structures of cameras because many cameras need to be aligned accurately and need to have auto-focusing systems.

In a method disclosed in Non-Patent Document 1, infrared light is emitted twice to acquire different detection signals; however, it is difficult to detect reflected infrared light continuously. In other words, there is a time difference from the end of first imaging to the start of the next imaging. For this reason, the method is not suitable for detection of the position of a moving object. In particular, when an object moves fast, the accuracy of position detection is greatly decreased.

In the case where an infrared ray emitted from a human body is used as disclosed in Patent Document 3, noise caused by a change in body temperature or the like cannot be ignored.

In view of the above problems, it is an object to provide a motion recognition device capable of recognizing the motion of an object without contact with the object.

It is another object to provide a motion recognition device that has a simple structure and can recognize the motion of an object regardless of the state of the object.

It is another object to take an image of a fast-moving object without distortion and to acquire information on changes in position and shape of the object easily.

By using a 3D TOF range image sensor in a motion recognition device, information on changes in position and shape is detected easily.

Further, by using a 3D TOF range image sensor in a motion recognition device, information on changes in position and shape including color image information is detected easily.

One embodiment of the present invention disclosed in this specification is a motion recognition device that includes an imaging device, an image processor, and an information processor. The imaging device acquires range image information on an object, generates imaging data from the range image information, and outputs the imaging data. The image processor includes a first storage, a second storage, an image storage, an object data detector, a third storage, a motion data detector, a fourth storage, and an output controller. The first storage stores a specific object pattern. The second storage stores a specific motion pattern. The image storage stores the imaging data that changes over time. The object data detector extracts the imaging data in a period from a motion start time to a motion end time of the object from the imaging data stored in the image storage, compares the extracted imaging data to the specific object pattern, and selects the best match object data at each time. The third storage stores the object data at each time. The motion data detector compares the object data stored in the third storage in the period from the motion start time to the motion end time of the object to the specific motion pattern and estimates motion data. The fourth storage stores the motion data. The output controller generates output data from the motion data and outputs the output data. The information processor recognizes the motion of the object on the basis of the output data and performs operation defined by the output data.

In the motion recognition device, the imaging device can acquire the range image information on the object by detecting a time from when light is emitted from a light source to the object to when the light arrives at the imaging device after reflected off the object from a relationship between the time and light speed.

In the motion recognition device, the imaging device can acquire the range image information on the object by performing first irradiation and second irradiation whose length of irradiation time is the same as that of the first irradiation and whose timing is different from that of the first irradiation on the object from the light source, detecting first reflected light from the object due to the first irradiation and second reflected light from the object due to the second irradiation with a photodiode, acquiring a first detection signal S1 by setting the potential of a gate electrode of a first transistor for changing the amount of electric charge accumulated in a floating diffusion node using photocurrent output from the photodiode to a high potential at least in a high potential period which starts before the start of irradiation of the photodiode with the first reflected light from the object due to the first irradiation and ends after the end of the first irradiation in order to perform first imaging and detecting the first reflected light in the high potential period, acquiring a second detection signal S2 by setting the potential of the gate electrode of the first transistor for changing the amount of electric charge accumulated in the floating diffusion node using photocurrent output from the photodiode to a high potential at least in a high potential period which starts before the end of the second irradiation and ends after the end of irradiation of the photodiode with the second reflected light from the object due to the second irradiation in order to perform second imaging and detecting the second reflected light in the high potential period, and calculating a distance x from the light source to the object with Formula (1), where T, c, S1, and S2 represent a first irradiation period, light speed, the first detection signal, and the second detection signal, respectively.

$$x = \frac{c \times T \times S2}{2 \times (S1 + S2)} \quad (1)$$

In the motion recognition device, comparison to the specific object pattern may be performed by calculation of a correlation coefficient.

In the motion recognition device, comparison to the specific motion pattern may be performed by calculation of a correlation coefficient.

In the motion recognition device, the imaging device may include a plurality of photosensors each including the photodiode, the first transistor, a second transistor, and a third transistor.

In the motion recognition device, a semiconductor layer of the first transistor may include an oxide semiconductor material.

In the motion recognition device, a semiconductor layer of the first transistor may include a silicon material.

One embodiment of the present invention disclosed in this specification is a motion recognition device that includes an imaging device, an image processor, and an information processor. The imaging device acquires range image information on an object by performing first imaging and second imaging with one irradiation light without a time difference, generates imaging data from the range image information, and outputs the imaging data. The image processor includes a first storage, a second storage, an image storage, an object data detector, a third storage, a motion data detector, a fourth storage, and an output controller. The first storage stores a specific object pattern. The second storage stores a specific motion pattern. The image storage stores the imaging data that changes over time. The object data detector extracts the imaging data in a period from a motion start time to a motion end time of the object from the imaging data stored in the image storage, compares the extracted imaging data to the specific object pattern, and selects the best match object data at each time. The third storage stores the object data at each time. The motion data detector compares the object data stored in the third storage in the period from the motion start time to the motion end time of the object to the specific motion pattern and estimates motion data. The fourth storage stores the motion data. The output controller generates output data from the motion data and outputs the output data. The information processor recognizes the motion of the object on the basis of the output data and performs operation defined by the output data.

In the motion recognition device, the imaging device can acquire the range image information on the object by detecting a time from when light is emitted from a light source to the object to when the light arrives at the imaging device after reflected off the object and detecting the reflected light continuously before and after the end of light irradiation from a relationship between the time and light speed.

In the motion recognition device, the imaging device can acquire the range image information on the object by performing light irradiation on the object from the light source, absorbing reflected light from one point of the object with first and second adjacent photodiodes, acquiring a first detection signal S1 by setting the potential of a gate electrode of a first transistor for changing the amount of electric charge accumulated in a first node using photocurrent output from the first photodiode to a high potential in a high potential period which starts before the start of absorption of the reflected light and ends when the light irradiation is ended and detecting the reflected light with which the first photodiode is irradiated in the high potential period, acquiring a second detection signal S2 by setting the potential of a gate electrode of a second transistor for changing the amount of electric charge accumulated in a second node using photocurrent output from the second photodiode to a high potential in a high potential period which starts when the light irradiation is ended and ends after the end of the absorption of the reflected light and detecting the reflected light with which the second photodiode is irradiated in the high potential period, and calculating a distance x from the light source to the object with Formula (1), where S1, S2, T, and c represent the first detection signal, the second detection signal, a light irradiation period, and light speed, respectively.

$$x = \frac{c \times T \times S2}{2 \times (S1 + S2)} \quad (1)$$

In the motion recognition device, comparison to the specific object pattern may be performed by calculation of a correlation coefficient.

In the motion recognition device, comparison to the specific motion pattern may be performed by calculation of a correlation coefficient.

In the motion recognition device, the imaging device can include a plurality of photosensors each including a photodiode, the first transistor, the second transistor, and a third transistor, and the first and second adjacent photodiodes can absorb the reflected light from one point of the object.

In the motion recognition device, a semiconductor layer of the first transistor may include a silicon material. By using a semiconductor layer having high mobility in the first transistor whose gate electrode is electrically connected to a floating diffusion node, the amplification degree of electric charge accumulated in the floating diffusion node can be increased. Thus, an amplifier transistor having higher sensitivity can be constituted.

In the motion recognition device, a semiconductor layer of the second transistor may include a silicon material. By using a silicon material for the semiconductor layer of the second transistor whose one of a source electrode and a drain electrode is electrically connected to one of a source electrode and a drain electrode of the first transistor, the on-state current of the second transistor can be increased. Thus, data read time is shortened, so that output from the photosensor can be controlled at high speed. By using a semiconductor layer having high mobility, the switching speed of an output control line can be controlled in a wider range.

In the motion recognition device, a semiconductor layer of the third transistor may include an oxide semiconductor material. By using an oxide semiconductor material for the semiconductor layer of the third transistor whose one of a source electrode and a drain electrode is electrically connected to the floating diffusion node and the other of the source electrode and the drain electrode is electrically connected to the photodiode, the off-state current of the transistor can be extremely low. The floating diffusion node can hold accumulated electric charge for a long time. Thus, the imaging device included in the motion recognition device can detect a time from when light is emitted from the light source to the object to when the light arrives at the imaging device after reflected off the object, and can acquire highly reliable imaging data.

In the motion recognition device, by using a silicon material for the semiconductor layers of the first transistor and the second transistor and using an oxide semiconductor material for the semiconductor layer of the third transistor, pixels can be miniaturized and a motion recognition device including a high-performance imaging device capable of operating at high speed can be obtained.

In the motion recognition device, a silicon material may be used for the semiconductor layers of the first transistor, the second transistor, and the third transistor. In the case where the object moves fast, by using a silicon material for semiconductor layers of all the transistors that are included in the photosensor, the photosensor can operate at higher speed.

One embodiment of the present invention disclosed in this specification is a motion recognition device that includes an imaging device, an image processor, and an information processor. The imaging device acquires 2D image information and 3D range image information on an object, generates imaging data from the image information, and outputs the imaging data. The image processor includes a first storage, a second storage, an image storage, an object data detector, a third storage, a motion data detector, a fourth storage, and an output controller. The first storage stores a specific object pattern. The second storage stores a specific motion pattern. The image storage stores the imaging data that changes over time. The object data detector extracts the imaging data in a period from a motion start time to a motion end time of the object from the imaging data stored in the image storage, compares the extracted imaging data to the specific object pattern, and selects the best match object data at each time. The third storage stores the object data at each time. The motion data detector compares the object data stored in the third storage in the period from the motion start time to the motion end time of the object to the specific motion pattern and estimates motion data. The fourth storage stores the motion data. The output controller generates output data from the motion data and outputs the output data. The information processor recognizes the motion of the object on the basis of the output data and performs operation defined by the output data.

In the motion recognition device, the imaging device can acquire the 3D range image information on the object by detecting a time from when infrared light is emitted from a light source to the object to when the infrared light arrives at the imaging device after reflected off the object from a relationship between the time and light speed.

In the motion recognition device, the imaging device can acquire the 3D range image information on the object by performing first infrared light irradiation and second infrared light irradiation whose length of irradiation time is the same as that of the first infrared light irradiation and whose timing is different from that of the first infrared light irradiation on the object from the light source, absorbing visible light with a first photodiode, acquiring the 2D image information on the object by setting the potential of a gate electrode of a first transistor for changing the amount of electric charge accumulated in a first floating diffusion node using photocurrent output from the first photodiode to a high potential at least in a high potential period which starts before irradiation of the first photodiode with reflected light from the object due to the first infrared light irradiation and ends after irradiation of the first photodiode with reflected light from the object due to the second infrared light irradiation and detecting visible light in the high potential period, absorbing the first infrared light and the second infrared light with a second photodiode, acquiring a first detection signal S1 by setting the potential of a gate electrode of a second transistor for changing the amount of electric charge accumulated in a second floating diffusion node using photocurrent output from the second photodiode to a high potential in a period during which a first infrared light irradiation period and a first infrared light reflection period overlap with each other and detecting the first infrared light in the high potential period, acquiring a second detection signal S2 by setting the potential of the gate electrode of the second transistor for changing the amount of electric charge accumulated in the second floating diffusion node using photocurrent output from the second photodiode to a high potential after the second infrared light irradiation and in a period during which a second infrared light irradiation period and a second infrared light reflection period do not overlap with each other and detecting the second infrared light in the high potential period, and calculating a distance x from the light source to the object with Formula (1), where S1, S2, T, and c represent the first detection signal, the second detection signal, the first infrared light irradiation period, and light speed, respectively.

$$x = \frac{c \times T \times S2}{2 \times (S1 + S2)} \quad (1)$$

In the motion recognition device, comparison to the specific object pattern may be performed by calculation of a correlation coefficient.

In the motion recognition device, comparison to the specific motion pattern may be performed by calculation of a correlation coefficient.

In the motion recognition device, the imaging device preferably includes a plurality of first photodiodes each including a first semiconductor layer absorbing visible light and transmitting infrared light and a plurality of second photodiodes each including a second semiconductor layer absorbing infrared light. Further, the first photodiode and the second photodiode preferably overlap with each other.

In the motion recognition device, the first semiconductor layer may include amorphous silicon or polycrystalline silicon.

In the motion recognition device, the second semiconductor layer may include polycrystalline silicon, microcrystalline silicon, or single crystal silicon.

In the motion recognition device, a semiconductor layer of the first transistor may include a silicon material.

In the motion recognition device, a semiconductor layer of the second transistor may include a silicon material.

In the motion recognition device, a semiconductor layer of the first transistor may include an oxide semiconductor material.

In the motion recognition device, a semiconductor layer of the second transistor may include an oxide semiconductor material.

The above structure achieves at least one of the objects.

Note that in this specification, "object data" means information on shape, position, direction, form, kind, portion, and the like (including information on color and brightness) of an object. In other words, "object data" means information including 2D image information and 3D range image information. Thus, "a portion of an object" means, for example, "a hand and the color of the hand (e.g., a flesh color)" or "a leg and the color of the leg (e.g., a flesh color)".

In this specification, "motion data" represents a time change in "object data". For example, "motion data" means information on a time change in shape, position, direction, or form of an object.

In this specification, "imaging data" means information acquired from a 3D range image of an object taken by an imaging device. Further, a "3D range image" means pieces of information on a measured distance between each pixel included in an imaging device and an object at a given time.

According to one embodiment of the present invention, by using a 3D TOF range image sensor in a motion recognition device, the motion recognition device can have a simple structure and can detect information on a change in position, shape, or the like of an object (including color image information) easily. Further, regardless of the state of the object, motion recognition can be performed accurately without restricting the motion of the object. Furthermore, even when the object moves fast, regardless of the state of the object, motion recognition can be performed accurately without restricting the motion of the object.

BRIEF DESCRIPTION OF DRAWINGS

In the accompanying drawings:

FIG. 2 illustrates the motion recognition device;
FIG. 4 is a timing chart of the photosensor in Embodiment 2;
FIG. 5 is a timing chart of the photosensor in Embodiment 2;
FIG. 6 illustrates a photosensor in Embodiment 3;
FIG. 7 is a timing chart of the photosensor in Embodiment 3;
FIG. 8 is a timing chart of the photosensor in Embodiment 3;
FIG. 11 is a timing chart of the photosensor in Embodiment 4;
FIGS. 25A and 25B are cross-sectional views of a photosensor.

BEST MODE FOR CARRYING OUT THE INVENTION

Figure 1A:
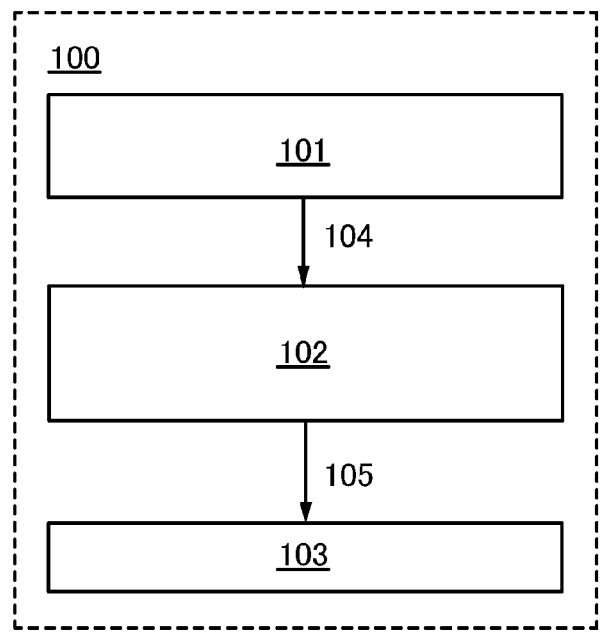
FIGS. 1A and 1B illustrate a motion recognition device.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiment. Note that in structures of the present invention described below, the same portions or portions having similar functions are denoted by the same reference numerals in different drawings, and a description thereof is not repeated.

(Embodiment 1)

In this embodiment, a motion recognition device including a TOF imaging device is described with reference to FIGS. 1A and 1B and FIG. 2.

Note that in one embodiment of the disclosed invention, motion recognition is performed on the basis of pattern matching. Imaging data used for pattern matching is acquired from an imaging device. The following method is employed: imaging data on an object that changes over time is compared to a variety of specific object patterns in a database; the best match object data is selected (pattern matching); a period from a motion start time to a motion end time is divided with a specific time interval; object data selected at each time is compared to a variety of specific motion patterns in the database; and motion data (a time change in object data) is estimated. The motion recognition device can operate using output data generated from the motion data. The imaging data includes 3D range image information and color image information; thus, by performing pattern matching using the imaging data, the detection accuracy of the motion recognition device can be improved.

The motion recognition device acquires imaging data from the TOF imaging device. A TOF method is a method in which a time from when light (irradiation light) is emitted from a light source to an object to when the light (reflected light) arrives at an imaging device after reflected off the object is detected, and a distance from the imaging device to the object is acquired by calculation. A distance x from the light source to the object can be expressed by the following formula: $x=(c \times \Delta t)/2$, where c and $\Delta t$ represent light speed ($3 \times 10^8$ m/s) and delay time, respectively.

The imaging device acquires a plurality of pieces of range information by measuring a distance between each pixel included in a display portion and an object. By collecting the range information, range image information can be acquired as imaging data.

The imaging device can perform 2D imaging and 3D TOF imaging concurrently. In that case, the imaging device includes a first photosensor absorbing visible light and a second photosensor absorbing infrared light. These photosensors preferably overlap with each other. By performing 2D imaging using the first photosensor and performing 3D imaging using the second photosensor, 3D range image information and color image information are acquired concurrently. The 3D range image information and the color image information can be acquired as imaging data.

Since the TOF method is employed, the motion recognition device can acquire 3D range image information on an object at a given time without contact with the object.

The motion recognition device can acquire color image information on an object at a given time without contact with the object.

The imaging device has a simple structure, so that the imaging device can be provided in the display portion of the motion recognition device.

Further, since the TOF method is employed, the motion recognition device is hardly influenced by the state (e.g., heat or temperature) of an object and can perform motion recognition regardless of the state of the object.

Note that the light source is preferably provided in the imaging device.

Figure 1B:
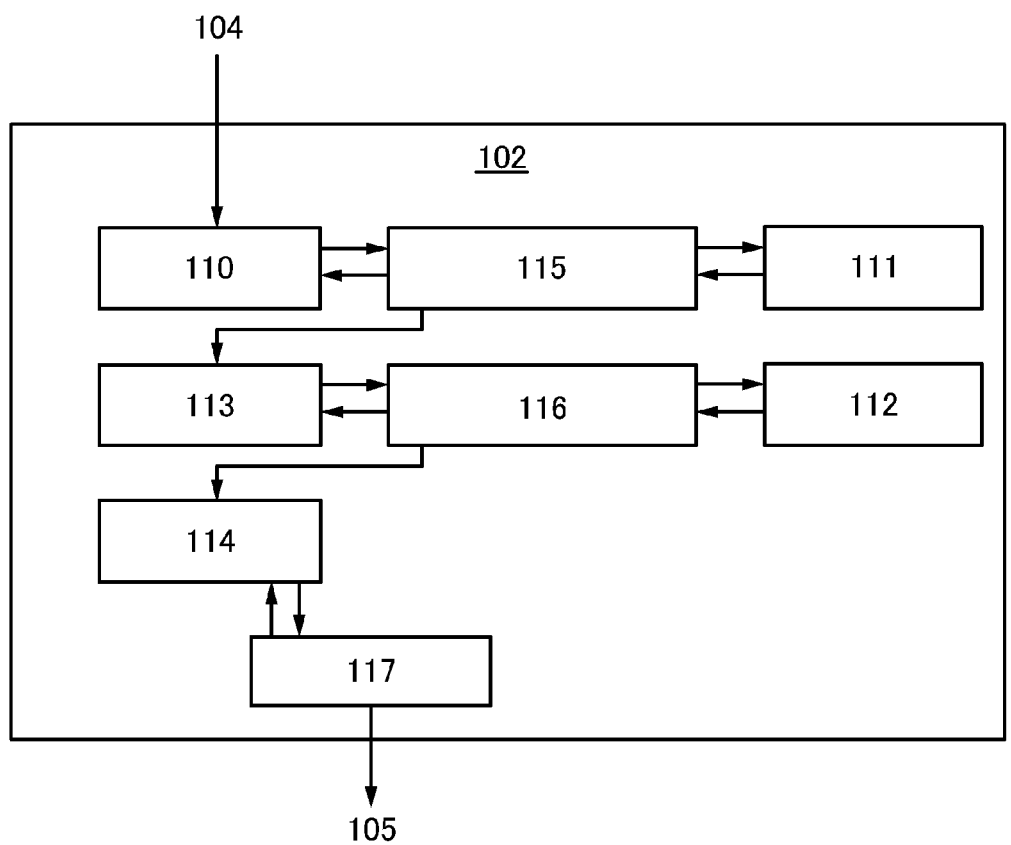

FIG. 1A is a block diagram illustrating the entire structure of a motion recognition device in one embodiment of the disclosed invention. A motion recognition device 100 includes an imaging device 101, an image processor 102, and an information processor 103. Imaging data 104 is output from the imaging device 101 and is input to the image processor 102. Output data 105 is output from the image processor 102 and is input to the information processor 103.

The image processor 102 includes an image storage 110, a first storage 111, a second storage 112, a third storage 113, a fourth storage 114, an object data detector 115, a motion data detector 116, and an output controller 117. A specific object pattern is stored in the first storage 111, and a specific motion pattern is stored in the second storage 112. A specific object pattern and a specific motion pattern of reference are stored in a database in advance.

The image storage 110 acquires and stores the imaging data 104 from the imaging device 101. The image storage 110 includes a 3D range image information storage and can further include a color image information storage. For example, 2D information (e.g., brightness or color of an object) obtained by 2D imaging of the imaging device 101 is stored in the color image information storage, and 3D range image information (a distance from the light source to the object) obtained by 3D imaging is stored in the 3D range image information storage.

A variety of specific object patterns are stored in the first storage 111 in advance. A specific object pattern corresponds to, for example, a shape pattern of a finger tip in the case where the motion of a human finger is detected as an object. Further, the specific object pattern corresponds to a shape pattern of each finger tip or a palm in the case where the motion of a human hand is detected as an object.

Note that as the specific object pattern, color image information can be included in addition to 3D range image information. In the case where color image information is included, for example, in the case where the motion of the human finger is detected as the object, information on the color of the finger (e.g., a flesh color) or the color of a nail (e.g., a transparent color) is added in addition to the shape pattern of the finger tip. Further, in the case where the motion of the human hand is detected as the object, information on the color of the palm (e.g., a flesh color) is added in addition to the shape pattern of each finger tip or the palm.

A variety of specific motion patterns are stored in the second storage 112 in advance. A specific motion pattern means movement of a region showing a specific state, motion involving change, motion repeated at a constant frequency, stroke, or the like. For example, the specific motion pattern corresponds to, for example, downstroke of a finger tip or a series of actions: rock, paper, scissors.

Note that as the specific motion pattern, color image information may be included. In the case where the color image information is included, information on the color of the finger (e.g., a flesh color) or the color of a nail (e.g., a transparent color) is added in addition to information on a change in position or shape, such as the downstroke of the finger tip or rock, paper, scissors.

The imaging device 101 takes images of an object and acquires a 3D range image of the object. Further, the imaging device 101 can acquire a color image. A range measuring method based on a TOF method is used for acquisition of a 3D range image. The imaging device 101 having a simple structure can acquire a 3D range image without the use of many cameras or the like. The 3D range image and the color image are output from the imaging device 101 to the image processor 102 as the imaging data 104. Note that the imaging device 101 needs to be provided in a position where it can take an image of a user who operates the motion recognition device 100. The imaging device 101 may be provided in the display portion of the motion recognition device 100 or may be provided outside the motion recognition device 100.

Note that the imaging data 104 changes over time; however, the imaging device 101 can acquire the imaging data 104 at each time with a specific time interval. In this specification, the imaging data 104 at a time to is referred to as imaging data 104_n.

The image processor 102 receives the imaging data 104 and generates the output data 105 needed for the information processor 103 to perform appropriate processing. The output data 105 is generated from motion data. Appropriate processing means operation corresponding to the output data 105 that is performed by the motion recognition device 100 while an object is not directly in contact with the motion recognition device 100 or an operating unit of the motion recognition device 100.

Note that correspondence between the operation of the motion recognition device 100 (e.g., input of a calling number "1" to a cellular phone) and motion data needed for the motion recognition device 100 to perform the operation (e.g., raising an index finger of a hand) is determined in advance. In the case where the output data 105 needed for desired operation is output from the image processor 102, the information processor 103 can perform appropriate processing.

Note that in motion recognition in this specification, a prepared database is used. For example, motion data needed for the motion recognition device 100 to perform certain operation, i.e., data on which motion data is used for certain operation is posted into the database in addition to the specific object pattern and the specific motion pattern of the object. Further, data generated using a variety of patterns acquired by the motion recognition device 100 can be additionally posted into the database.

The information processor 103 receives the output data 105 and performs processing on the motion recognition device 100 so that operation corresponding to the output data 105 is performed. The operation corresponding to the output data 105 means operation of the motion recognition device 100 based on the motion of an object. The motion recognition device 100 can be applied to a variety of applications; thus, the information processor 103 needs to perform processing corresponding to the applications with the use of the output data 105. Processing corresponding to an application means, for example, processing for performing operation such as turning on a stove by downstroke of a finger tip or turning off a stove by upstroke of a finger tip in the case where the motion recognition device 100 is applied to a stove burner.

Next, motion recognition performed in the image processor 102 is described in detail. FIG. 2 is a flow chart illustrating motion recognition in one embodiment of the disclosed invention.

The image storage 110 operates in Step 301. In Step 301, the image storage 110 stores imaging data 104_n at a time tn (n is a natural number).

The object data detector 115 operates in Steps 302 to 309. First, in Step 302, the object data detector 115 extracts a specific object pattern from the imaging data 104_n.

Next, in Step 303, the object data detector 115 compares the specific object pattern extracted from the imaging data 104_n to a specific object pattern stored in the first storage 111.

Next, in Step 304, the object data detector 115 calculates a correlation coefficient, and selects the best match specific object pattern from a variety of specific object patterns in the database on the correlation coefficient basis. In the case where a correlation coefficient α is equal to or larger than a certain value β as in Step 305, the object data detector 115 goes to Step 306. In Step 306, the object data detector 115 determines that a specific object pattern that matches with the object pattern extracted from the imaging data 104_n exists in a variety of specific object patterns stored in the first storage 111. In the case where the correlation coefficient α is smaller than the certain value β as in Step 308, the object data detector 115 goes to Step 309. In Step 309, the object data detector 115 determines that a specific object pattern that matches with the object pattern extracted from the imaging data 104_n does not exist in the variety of specific object patterns stored in the first storage 111.

In the case where the object data detector 115 goes to Step 306, the object data detector 115 acquires object data (also referred to as n-th object data) at the time tn in Step 307.

The third storage 113 operates in Step 310. In Step 310, the third storage 113 stores the object data at the time tn. Note that although object data changes over time, the object data can be acquired in each case. For example, first object data can be acquired at a time $t_1$, and third object data can be acquired at a time $t_3$.

In order to acquire the object data successively, the image processor 102 may return from Step 310 to Step 301. For example, in the case where the first object data to tenth object data are sequentially acquired from the time $t_1$ to a time $t_{10}$, the image processor 102 may repeat Steps 301 to 306 ten times.

The motion data detector 116 operates in Steps 311 to 317. First, in Step 311, a time change in the object data is compared to a specific motion pattern stored in the second storage 112.

Next, in Step 312, the motion data detector 116 calculates a correlation coefficient, and selects the best match specific motion pattern from a variety of specific motion patterns in the database on the correlation coefficient basis. In the case where a correlation coefficient γ is equal to or larger than a certain value δ as in Step 313, the motion data detector 116 goes to Step 314. In Step 314, the motion data detector 116 determines that a variety of specific motion patterns stored in the second storage 112 are equal to time changes in the object data. In the case where the correlation coefficient γ is smaller than the certain value δ as in Step 316, the motion data detector 116 goes to Step 317. In Step 317, the motion data detector 116 determines that the variety of specific motion patterns stored in the second storage 112 are different from the time changes in the object data. In other words, the motion data detector 116 checks the specific motion pattern against the time change in the object data and determines whether the specific motion pattern is performed.

Note that the reference value δ of the correlation coefficient may vary depending on processing performed later by the information processor 103. The information processor 103 that specifies the processing preferably has a table in which the time change in the object data 106 is associated with the reference value δ of the correlation coefficient as additional data, and reads the data as appropriate when the information processor 103 starts.

In Step 315, in the case where the variety of specific motion patterns stored in the second storage 112 match with the time changes in the object data, the motion data detector 116 acquires motion data.

The fourth storage 114 operates in Step 318. In Step 318, the fourth storage 114 stores the motion data.

The output controller 117 operates in Step 319. In Step 319, the output controller 117 generates the output data 105 from the motion data stored in the fourth storage 114, and outputs the output data 105 to the information processor 103. Note that in addition to generating the output data 105, the output controller 117 may supply appropriate data to the information processor 103 depending on applications.

The motion recognition device 100 with the above structure can recognize the motion of a moving object without contact with the object. Further, the motion recognition device 100 has a simple structure and can perform motion recognition accurately regardless of the state of the object.

The motion recognition device 100 with the above structure can detect color image information in addition to information on a change in position, shape, or the like of an object. In that case, detection accuracy can be further improved.

Note that this embodiment can be combined with any of the other embodiments in this specification as appropriate.

(Embodiment 2)

In this embodiment, an example of a method for driving a TOF imaging device is described with reference to FIG. 3, FIG. 4, FIG. 5, and FIG. 13. Specifically, a method for driving an imaging device, in which a distance from a light source to an object is measured in the following manner, is described. First imaging and second imaging are performed with respect to a first irradiation period and a second irradiation period (which have the same length of irradiation time and are performed at different timings), respectively. A first detection signal that is dependent on a light delay time is acquired through first reflected light detection based on first reflection, and a second detection signal that is dependent on a light delay time is acquired through second reflected light detection based on second reflection.

Figure 3:
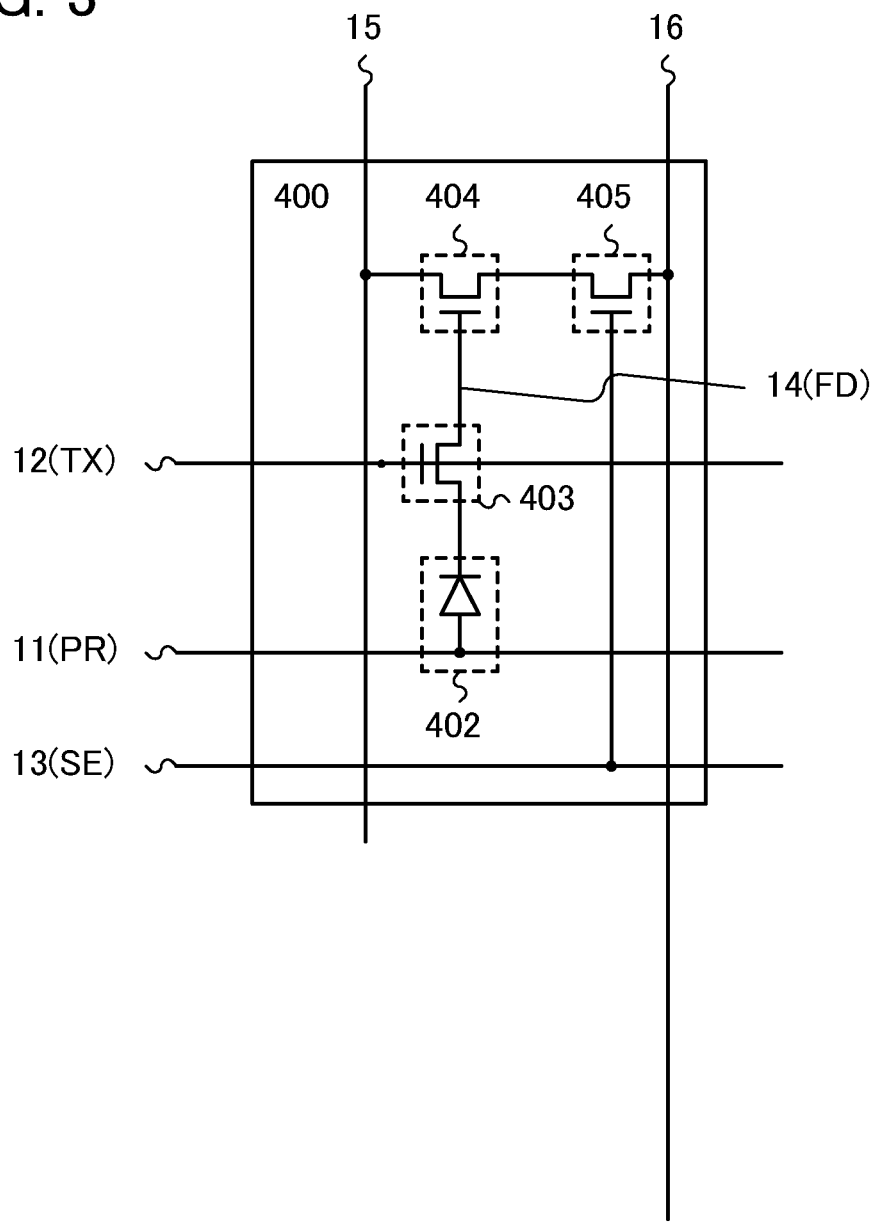
FIG. 3 illustrates a photosensor in Embodiment 2.

A photosensor included in an imaging device in this embodiment includes three transistors and one photodiode. FIG. 3 is an example of a circuit diagram illustrating the structure of a photosensor 400 included in an imaging device. The photosensor 400 includes a photodiode 402, a transistor 403, a transistor 404, and a transistor 405.

A signal line 11 is a reset signal line (PR). A signal line 12 is an electric charge accumulation signal line (TX). A signal line 13 is a selection signal line (SE). A node 14 is a floating diffusion (FD) node. A signal line 15 is a photosensor reference signal line. A signal line 16 is a photosensor output signal line.

In the photosensor 400, an anode of the photodiode 402 is electrically connected to the signal line 11. A cathode of the photodiode 402 is electrically connected to one of a source electrode and a drain electrode of the transistor 403. The other of the source electrode and the drain electrode of the transistor 403 is electrically connected to a gate electrode of the transistor 404 and the node 14. One of a source electrode and a drain electrode of the transistor 404 is electrically connected to the signal line 15. One of a source electrode and a drain electrode of the transistor 405 is electrically connected to the signal line 16. The other of the source electrode and the drain electrode of the transistor 404 is electrically connected to the other of the source electrode and the drain electrode of the transistor 405. A gate electrode of the transistor 403 is electrically connected to the signal line 12. A gate electrode of the transistor 405 is electrically connected to the signal line 13.

Note that FIG. 3 illustrates a structure where the anode of the photodiode 402 is electrically connected to the signal line 11 and the cathode of the photodiode 402 is electrically connected to one of the source electrode and the drain electrode of the transistor 403; however, the present invention is not limited thereto. The cathode of the photodiode 402 may be electrically connected to the signal line 11, and the anode of the photodiode 402 may be electrically connected to one of the source electrode and the drain electrode of the transistor 403.

The photodiode 402 is a photoelectric conversion element that generates current when the photoelectric conversion element is irradiated with light. Thus, by detecting light reflected from an object, photocurrent flows through the photodiode 402.

The transistor 403 functions as a transistor that controls an imaging time. In one embodiment of the disclosed invention, positive electric charge is accumulated in the node 14 by setting the potential of the signal line 11 and the potential of the gate electrode of the transistor 403 (the potential of the signal line 12) from "L (low)" to "H (high)". Imaging is started by setting the potential of the signal line 11 from high to low while the potential of the gate electrode of the transistor 403 (the potential of the signal line 12) is kept high. Negative electric charge is accumulated in the node 14 in accordance with light entering the photodiode 402. The imaging ends when the potential of the gate electrode of the transistor 403 (the potential of the signal line 12) is set from high to low.

In this embodiment, in the first imaging, the potentials of the signal line 11 and the signal line 12 are controlled so that the first imaging starts when first irradiation starts and the first imaging ends when the first irradiation ends. In the second imaging, the potentials of the signal line 11 and the signal line 12 are controlled so that the second imaging starts when second irradiation ends and the second imaging ends after imaging for the same length of time as the first imaging.

In other words, the potentials of the signal line 11 and the signal line 12 may be controlled so that the potential of the gate electrode of the transistor 403 is high during a period in which the first irradiation period overlaps with a first reflection period, a period which starts after the start of the second irradiation and in which the second irradiation period does not overlap with a second reflection period, a first reflected light detection period, and a second reflected light detection period.

The transistor 404 functions as a transistor that amplifies electric charge accumulated in the node 14. The transistor 405 functions as a transistor that controls the output of the photosensor. A signal is read when a signal input to the gate electrode of the transistor 405 (the potential of the signal line 13) is set from low to high.

As described above, the photosensor 400 includes four elements: one photodiode and three transistors. Since the photosensor can include fewer elements, high integration of the photosensor and a reduction in pixel size can be facilitated.

Note that it is preferable that a semiconductor layer of the transistor 403 be an oxide semiconductor layer. In order to hold electric charge generated by irradiation of the photodiode 402 with light for a long time, the transistor 403 that is electrically connected to the photodiode needs to be a transistor with extremely low off-state current. A transistor including an oxide semiconductor material has extremely low off-state current. Thus, when the semiconductor layer is formed using an oxide semiconductor material, the performance of the photosensor 400 can be improved.

In addition, electric charge can be prevented from leaking from the node 14 into the photodiode 402. In particular, in the case where a time difference produced from the first imaging to the second imaging is large, that is, it takes a long time to accumulate electric charge in the node 14, the influence of leakage of electric charge is significant. Thus, it is particularly preferable to use an oxide semiconductor material. When an oxide semiconductor material is used for the semiconductor layer, a time from when light (irradiation light) is emitted from a light source to the object to when the light (reflected light) arrives at the imaging device after reflected off the object is detected with higher accuracy, and highly reliable imaging data is acquired, the performance of the entire photosensor 400 can be improved.

When a high priority is put to reducing the time needed for accumulating electric charge generated by irradiation of the photodiode 402 with light, the semiconductor layer of the transistor 403 can be formed using a material such as amorphous silicon, microcrystalline silicon, polycrystalline silicon, or single crystal silicon. By using such a material, a transistor having high mobility can be formed. Thus, electric charge can be accumulated in the node 14 in a short time.

A material such as polycrystalline silicon or single crystal silicon is preferably used for a semiconductor layer of the transistor 404. By using a semiconductor layer having high mobility, the amplification degree of electric charge accumulated in the node 14 can be increased. Thus, an amplifier transistor having higher sensitivity can be constituted.

A material such as polycrystalline silicon or single crystal silicon is preferably used for a semiconductor layer of the transistor 405. By using such a material, the on-state current of the transistor 405 can be increased. Thus, data read time is shortened, so that output from the photosensor can be controlled at high speed. By using a semiconductor layer having high mobility, the switching speed of the signal line 16 can be controlled in a wider range. When a speed difference is accurately extracted by increasing the freedom of speed of potential change, more accurate data can be acquired.

An example of a method for driving the imaging device including the photosensor 400 is described. With the driving method, 3D range images can be measured by 3D TOF imaging.

The driving method is specifically described with reference to timing charts of FIG. 4 and FIG. 5. First, FIG. 4 illustrates the operation of the photosensor 400. Next, FIG. 5 illustrates features of the driving method and a method for measuring 3D range images by 3D TOF imaging.

Note that in the timing charts of FIG. 4 and FIG. 5, the high levels of a pulse 501 and a pulse 502 represent "irradiation", while the low levels of the pulse 501 and the pulse 502 represent "non-irradiation". The high levels of the other pulses represent "high potentials", while the low levels of the other pulses represent "low potentials".

FIG. 4 is a timing chart of the photosensor 400. From the time T1 to a time T15, the object is irradiated with light from the light source twice (the first irradiation and the second irradiation). Note that the second irradiation and the first irradiation are performed for the same length of time at different timings. The distance from the light source to the object is unchanged in the first irradiation and the second irradiation. It is apparent that a period from the time T2 to the time T3 (a delay time) and a period from the time T8 to the time T9 (a delay time) have the same length of time.

At the time T1, the signal line 11 goes high. Further, the signal line 12 goes high (first reset). At this time, the photodiode 402 and the transistor 403 are brought into conduction, and the node 14 goes high.

At the time T2, the first light irradiation in which the object is irradiated with light from the light source starts. The pulse 501 goes from low (non-irradiation) to high (irradiation). The time T2 is a first irradiation start time. Further, the signal line 11 goes low, and the signal line 12 is kept high (the first imaging starts). Note that a first imaging start time coincides with the first irradiation start time.

At the time T3, first irradiation light emitted from the light source is reflected off the object, and first reflected light starts to enter the imaging device. The pulse 502 goes from low (non-irradiation) to high (irradiation). The time T3 is a first reflection start time.

The time T3 is also a first reflected light detection start time. Detection of reflected light can be started at the time T3.

From the time T3 to the time T4 (during the first reflected light detection, i.e., first net imaging), the potential of the node 14 changes depending on the intensity of the first reflected light. The potential of the node 14 starts to decrease from high because of the off-state current of the photodiode 402. The off-state current is proportional to irradiation time and the intensity of light entering the photodiode 402 (reflected light).

Here, a relation between a change in potential of the node 14, irradiation time, and the intensity of light entering the photodiode 402 (reflected light) is described. If the detection period is fixed, as the intensity of the reflected light increases, the amount of change in potential of the node 14 increases. If the light intensity is fixed, as the length of the reflected light detection period increases, the amount of change in potential of the node 14 increases. Thus, as the intensity of the reflected light increases and the length of the reflected light detection period increases, the off-state current of the photodiode 402 increases and the amount of change in potential of the node 14 increases.

At the time T4, the first light irradiation in which the object is irradiated with light from the light source ends. The pulse 501 goes from high (irradiation) to low (non-irradiation). The time T4 is a first irradiation end time. The signal line 12 goes low. At this time, the first imaging ends. Note that a first imaging end time coincides with the first irradiation end time. The time T4 is also a first reflected light detection end time.

In this manner, the potentials of the signal line 11 and the signal line 12 are controlled so that the first imaging starts when the first irradiation starts and the first imaging ends when the first irradiation ends.

Note that the potential of the node 14 becomes constant after the time T4. The potential V1 of the node 14 at the time T4 depends on photocurrent generated by the photodiode 402 during the first reflected light detection. This means that the potential of the node 14 is determined by the intensity of reflected light and the like.

The first detection signal is determined by the potential V1 of the node 14 at the time T4. As the length of the first reflected light detection period increases, the amount of change in potential of the node 14 increases; thus, the potential V1 of the node 14 at the time T4 decreases.

Note that all the light entering the photodiode 402 from the time T1 to the time T4 corresponds to the first reflected light, i.e., light reflected off an object irradiated with light from the light source.

At the time T5, entry of the first reflected light reflected off the object to the imaging device ends. The pulse 502 goes from high (irradiation) to low (non-irradiation). The time T5 is a first reflection end time.

When the signal line 12 goes low, parasitic capacitance between the signal line 12 and the node 14 causes a change in potential of the node 14. A significant change in potential inhibits accurate acquisition of photocurrent generated by the photodiode 402 through the first imaging. Thus, effective methods of reducing the influence of parasitic capacitance are, for example, to reduce gate-source capacitance of the transistor 403 or gate-drain capacitance of the transistor 403 and to connect a storage capacitor to the node 14. The photosensor 400 according to one embodiment of the present invention employs these methods, so that a change in potential of the node 14 due to parasitic capacitance can be negligible.

At the time T6, the signal line 13 goes high (first reading starts). At this time, the transistor 405 is turned on. Further, the signal line 15 and the signal line 16 are brought into conduction through the transistor 404 and the transistor 405. Then, the potential of the signal line 16 decreases. Note that the signal line 16 is precharged high before the time T6.

There is no limitation on the structure of a read circuit with which the signal line 16 is precharged. The read circuit can include one p-channel transistor 406 as in a read circuit 401 illustrated in FIG. 13. A signal line 17 is a precharge signal line. A node 18 is a high potential supply line. A gate electrode of the transistor 406 is electrically connected to the signal line 17. One of a source electrode and a drain electrode of the transistor 406 is electrically connected to the signal line 16. The other of the source electrode and the drain electrode of the transistor 406 is electrically connected to the node 18.

At the time T7, the signal line 13 goes low (the first reading ends). Then, the transistor 405 is turned off, and the potential of the signal line 16 becomes constant. The potential $V_{S1}$ of the signal line 16 at the time T7 depends on the speed at which the potential of the signal line 16 changes from the time T6 to the time T7.

Note that the speed at which the potential of the signal line 16 changes depends on the source-drain current of the transistor 404, i.e., irradiation time and the intensity of light entering the photodiode 402 (reflected light) in the first imaging. If the irradiation time is fixed, as the reflected light intensity increases, the speed at which the potential of the signal line 16 changes decreases. If the light intensity is fixed, as the length of the reflected light detection period increases, the speed at which the potential of the signal line 16 changes decreases. As the speed at which the potential of the signal line 16 changes decreases, the potential $V_{S1}$ of the signal line 16 at the time T7 increases.

For this reason, by acquiring the potential $V_{S1}$ of the signal line 16 at the time T7 by the first reflected light detection, the amount of light entering the photodiode 402 (reflected light) during the first imaging period (the product of time and the intensity of incident light) is detected; thus, the detection signal S1 can be obtained. Assuming that the light intensity in the first irradiation is fixed and only the first reflected light enters the photodiode, the potential $V_{S1}$ of the signal line 16 is substantially proportional to the length of the first reflected light detection period.

The relation between the potential of the node 14 and the potential of the signal line 16 is described. When the intensity of light entering the photodiode 402 (reflected light) is high, the amount of change in potential of the node 14 during a certain period is large (the potential of the node 14 at the time T4 is a low potential). At this time, the channel resistance of the transistor 404 increases, so that the speed at which the potential of the signal line 16 changes decreases. Consequently, the amount of change in potential of the signal line 16 during a certain period is small (the potential of the signal line 16 at the time T7 is a high potential).

At the time T8, second light irradiation in which the object is irradiated with light from the light source starts. The pulse 501 goes from low (non-irradiation) to high (irradiation). The time T8 is a second irradiation start time.

At the time T9, second irradiation light emitted from the light source is reflected off the object, and second reflected light starts to enter the imaging device. The pulse 502 goes from low (non-irradiation) to high (irradiation). The time T9 is a second reflection start time.

At the time T10, the signal line 11 goes high, and the signal line 12 goes high (second reset). At this time, the photodiode 402 and the transistor 403 are brought into conduction, and the node 14 goes high.

At the time T11, the second light irradiation in which the object is irradiated with light from the light source ends. The pulse 501 goes from high (irradiation) to low (non-irradiation). The time T11 is a second irradiation end time. The signal line 11 goes low, and the signal line 12 is kept high (the second imaging starts). Note that a second imaging start time coincides with the second irradiation end time. The time T11 is also a second reflected light detection start time.

From the time T11 to the time T12 (during the second reflected light detection, i.e., second net imaging), the potential of the node 14 changes depending on the intensity of the second reflected light. The potential of the node 14 starts to decrease from high because of the off-state current of the photodiode 402. The off-state current is proportional to irradiation time and the intensity of light entering the photodiode 402 (reflected light). Thus, the potential of the node 14 changes depending on the intensity of the reflected light and the length of the reflected light detection period.

Note that in this embodiment, for example, the second reflected light detection period (from the time T11 to the time T12) is shorter than the first reflected light detection period (from the time T3 to the time T4). Thus, the amount of change in potential of the node 14 during the second imaging is smaller than the amount of change in potential of the node 14 during the first imaging.

At the time T12, entry of the second reflected light reflected off the object to the imaging device ends. The pulse 502 goes from high (irradiation) to low (non-irradiation). The time T12 is a second reflection end time. The time T12 is also a second reflected light detection end time.

Note that the potential of the node 14 becomes constant after the time T12. The potential V2 of the node 14 at the time T12 depends on photocurrent generated by the photodiode 402 during the second reflected light detection. This means that the potential of the node 14 is determined by the intensity of reflected light and the like.

The second detection signal is determined by the potential V2 of the node 14 at the time T12. As the length of the second reflected light detection period decreases, the amount of change in potential of the node 14 decreases; thus, the potential V2 of the node 14 at the time T12 increases.

At the time T13, the signal line 12 goes low. At this time, the second imaging ends.

In this manner, the potentials of the signal line 11 and the signal line 12 are controlled so that the second imaging starts when second irradiation ends and the second imaging ends after imaging for the same length of time as the first imaging.

Note that all the light entering the photodiode 402 from the time T10 to the time T13 corresponds to the second reflected light, i.e., light reflected off an object irradiated with light from the light source.

At the time T14, the signal line 13 goes high (second reading starts). At this time, the transistor 405 is turned on. Further, the signal line 15 and the signal line 16 are brought into conduction through the transistor 404 and the transistor 405. Then, the potential of the signal line 16 decreases. Note that the signal line 16 is precharged high before the time T14.

At the time T15, the signal line 13 goes low (the second reading ends). Then, the transistor 405 is turned off, and the potential of the signal line 16 becomes constant. The potential $V_{S2}$ of the signal line 16 at the time T15 depends on the speed at which the potential of the signal line 16 changes from the time T14 to the time T15.

If the light intensity is fixed, as the length of the reflected light detection period decreases, the speed at which the potential of the signal line 16 changes increases. As the speed at which the potential of the signal line 16 changes increases, the potential $V_{S2}$ of the signal line 16 at the time T15 decreases.

For this reason, by acquiring the potential $V_{S2}$ of the signal line 16 at the time T15 by the second reflected light detection, the amount of light entering the photodiode 402 (reflected light) during the second imaging period (the product of time and the intensity of incident light) is detected; thus, the detection signal S2 can be obtained. Assuming that the light intensity in the second irradiation is fixed and only the second reflected light enters the photodiode, the potential $V_{S2}$ of the signal line 16 is substantially proportional to the length of the second reflected light detection period.

Note that in this embodiment, the second reflected light detection period (from the time T11 to the time T12) is shorter than the first reflected light detection period (from the time T3 to the time T4), so that the potential $V_{S2}$ of the signal line 16 at the time T15 is lower than the potential $V_{S1}$ of the signal line 16 at the time T7.

FIG. 5 illustrates the pulse 501, the pulse 502, and the potential of the signal line 12 in the photosensor 400. First, the features of the driving method are described with reference to FIG. 5. The main feature of the driving method in one embodiment of the disclosed invention is to optimize the timing of the imaging time by controlling the potentials of the signal line 11 and the signal line 12 for the first reflected light detection and the second reflected light detection.

Comparison among the pulses in FIG. 5 is described dividing the time into the following periods: irradiation periods, reflection periods, imaging periods, accumulation periods, and reflected light detection periods.

As shown in the pulse 501, the time T2 is the first irradiation start time, the time T4 is the first irradiation end time, and a period from the time T2 to the time T4 is the first irradiation period. The time T8 is the second irradiation start time, the time T11 is the second irradiation end time, and a period from the time T8 to the time T11 is the second irradiation period. In one embodiment of the disclosed invention, the first irradiation period and the second irradiation period need to have the same length of time.

As shown in the pulse 502, the time T3 is the first reflection start time, the time T5 is the first reflection end time, and a period from the time T3 to the time T5 is the first reflection period. The time T9 is the second reflection start time, the time T12 is the second reflection end time, and a period from the time T9 to the time T12 is the second reflection period. The reflection period and the irradiation period have the same length of time.

In other words, the first irradiation period and the second irradiation period have the same length of time, and the first reflection period and the second reflection period have the same length of time.

As shown in the potential of the signal line 12, the time T1 is a first accumulation start time, the time T4 is a first accumulation end time, and a period from the time T1 to the time T4 is a first accumulation period. The time T2 is the first imaging start time, the time T4 is the first imaging end time, and a period from the time T2 to the time T4 is the first imaging period. Further, the time T3 is the first reflected light detection start time, the time T4 is the first reflected light detection end time, and a period from the time T3 to the time T4 is the first reflected light detection period.

The first accumulation period should be started at least before the first reflection period. Further, the first accumulation period (the first imaging) should be ended when the first irradiation period ends. The potentials of the signal line 11 and the signal line 12 are controlled so that the timing of the imaging period is determined as described above.

As shown in the potential of the signal line 12, the time T10 is a second accumulation start time, the time T13 is a second accumulation end time, and a period from the time T10 to the time T13 is a second accumulation period. The time T11 is the second imaging start time, the time T13 is a second imaging end time, and a period from the time T11 to the time T13 is the second imaging period. Further, the time T11 is the second reflected light detection start time, the time T12 is the second reflected light detection end time, and a period from the time T11 to the time T12 is the second reflected light detection period.

The second accumulation period (the second imaging) should be started when the second irradiation period ends. Further, the second accumulation period should be ended at least after the second reflection period. The potentials of the signal line 11 and the signal line 12 are controlled so that the timing of the imaging period is determined as described above.

In other words, the timing of the first imaging period is determined in accordance with the timing of the first reflection period and the timing of the second imaging period is determined in accordance with the timing of the second reflection period; thus, the reflected light detection is divided into two periods.

Note that the first reflected light detection period corresponds to a period in which the first irradiation period overlaps with the first reflection period. The first reflected light detection period is the first net imaging period. The second reflected light detection period corresponds to a period in the second reflection period that starts after the second irradiation period. The second reflected light detection period is the second net imaging period. The first detection signal that is dependent on a light delay time is acquired through the first reflected light detection. The second detection signal that is dependent on a light delay time is acquired through the second reflected light detection. Thus, the distance from the imaging device to the object can be measured.

Next, a distance measuring method by 3D TOF imaging is described. A method for measuring the distance from the imaging device to the object is described with reference to formulas by using the first detection signal S1 that is acquired through the first reflected light detection and is dependent on the light delay time, and the second detection signal S2 that is acquired through the second reflected light detection and is dependent on the light delay time.

Here, assuming that the light intensity during the first irradiation and the second irradiation is fixed and the photodiode 402 is irradiated with only the first reflected light during the first imaging period and the second reflected light during the second imaging period, the potential $V_{S1}$ of the signal line 16 is substantially proportional to the length of the first reflected light detection period, and the potential $V_{S2}$ of the signal line 16 is substantially proportional to the length of the second reflected light detection period.

In other words, the first detection signal S1 obtained through the first imaging is substantially dependent on the first reflected light detection period, and the second detection signal S2 obtained through the second imaging is substantially dependent on the second reflected light detection period.

The first detection signal S1 and the second detection signal S2 can be expressed by Formulas (2) and (3), respectively, where α represents a proportional constant, T represents an irradiation period, and Δt represents a delay time.

$$S1 = \alpha \times (T - \Delta t) \qquad (2)$$

$$S2 = \alpha \times (\Delta t) \qquad (3)$$

Erasure of the proportional constant α using Formulas (2) and (3) gives the delay time Δt, as expressed by Formula (4).

$$\Delta t = \frac{(T \times S2)}{(S1 + S2)} \qquad (4)$$

The distance x from the imaging device to the object can be expressed by Formula (1) by using the formula (x=(c×Δt)/2) expressing the distance x from the light source to the object and Formula (4).

$$x = \frac{c \times T \times S2}{2 \times (S1 + S2)} \quad (1)$$

This shows that the distance x from the imaging device to the object can be obtained if the first detection signal S1 and the second detection signal S2 are obtained.

Third imaging may be performed with the photosensor 400 in a period during which the light source does not emit light. In that case, a third detection signal S3 is obtained through the third imaging. When a value obtained by subtracting the third detection signal S3 from the first detection signal S1 and a value obtained by subtracting the third detection signal S3 from the second detection signal S2 are applied to the detection signal S1 and the detection signal S2 in Formula (1), respectively, the influence of natural light can be eliminated.

This shows that the photosensor can include fewer elements, and an imaging device including the photosensor that operates with an improved driving method can achieve 3D TOF imaging and can function as a range image measuring device. Thus, a problem of an increased number of elements for the photosensor that occurs with the TOF method can be solved and an imaging device with a simple structure can be achieved.

Note that this embodiment can be combined with any of the other embodiments in this specification as appropriate.

(Embodiment 3)

In this embodiment, an example of a method for driving a TOF imaging device is described with reference to FIG. 6, FIG. 7, FIG. 8, and FIG. 13. The driving method enables accurate detection of the position of a fast-moving object. Specifically, adjacent photosensors detect light reflected off substantially the same point of an object. One photosensor performs first imaging to detect light reflected off an object at the time of irradiation of the object with light. The other photosensor performs second imaging to detect light reflected off the object after the end of irradiation of the object with light. By performing the first imaging and the second imaging sequentially, a time difference is not produced from the end of the first imaging to the start of the second imaging. With this method, detection accuracy can be improved even when the object moves fast.

A photosensor included in an imaging device in one embodiment of the invention disclosed in this specification includes three transistors and one photodiode. FIG. 6 is an example of a circuit diagram illustrating the structures of a photosensor 700_n and a photosensor 700_(n+1) included in an imaging device. Note that the photosensor 700_n and the photosensor 700_(n+1) have the same structure.

As illustrated in FIG. 6, the photosensor 700_n and the photosensor 700_(n+1) are arranged adjacent to each other. The photosensor 700_n includes three transistors and one photodiode. Similarly, the photosensor 700_(n+1) includes three transistors and one photodiode.

As illustrated in FIG. 6, the photosensor 700_n includes a photodiode 702_n, a transistor 703_n, a transistor 704_n, and a transistor 705_n. The photosensor 700_(n+1) includes a photodiode 702_(n+1), a transistor 703_(n+1), a transistor 704_(n+1), and a transistor 705_(n+1).

Note that in one embodiment of the disclosed invention, the object is irradiated with light from a light source only once. Thus, reflected light from the object entering the photosensor is reflected light produced by one irradiation.

Here, light reflected off substantially the same point of the object enters the photosensor 700_n and the photosensor 700_(n+1) adjacent to each other.

In other words, reflected light entering the photodiode 702_n and reflected light entering the photodiode 702_(n+1) are light from the light source that enter the object and are reflected off substantially the same point of the object.

In FIG. 6, a signal line 11_n is a reset signal line (PR_n). A signal line 12_n is an electric charge accumulation signal line (TX_n). A signal line 13_n is a selection signal line (SE_n). A node 14_n is a floating diffusion (FD) node. A signal line 16_n is a photosensor output signal line (OUT_n).

In FIG. 6, a signal line 11_(n+1) is a reset signal line (PR_(n+1)). A signal line 12_(n+1) is an electric charge accumulation signal line (TX_(n+1)). A signal line 13_(n+1) is a selection signal line (SE_(n+1)). A node 14_(n+1) is a floating diffusion (FD) node. A signal line 16_(n+1) is a photosensor output signal line (OUT_(n+1)). The signal line 15 is a photosensor reference signal line that can be shared by the photosensor 700_n and the photosensor 700_(n+1).

As illustrated in FIG. 6, in the photosensor 700_n, an anode of the photodiode 702_n is electrically connected to the signal line 11_n. A cathode of the photodiode 702_n is electrically connected to one of a source electrode and a drain electrode of the transistor 703_n. The other of the source electrode and the drain electrode of the transistor 703_n is electrically connected to a gate electrode of the transistor 704_n and the node 14_n. One of a source electrode and a drain electrode of the transistor 704_n is electrically connected to the signal line 15. One of a source electrode and a drain electrode of the transistor 705_n is electrically connected to the signal line 16_n. The other of the source electrode and the drain electrode of the transistor 704_n is electrically connected to the other of the source electrode and the drain electrode of the transistor 705_n. A gate electrode of the transistor 703_n is electrically connected to the signal line 12_n. A gate electrode of the transistor 705_n is electrically connected to the signal line 13_n.

As illustrated in FIG. 6, similarly, in the photosensor 700_(n+1), an anode of the photodiode 702_(n+1) is electrically connected to the signal line 11_(n+1). A cathode of the photodiode 702_(n+1) is electrically connected to one of a source electrode or a drain electrode of the transistor 703_(n+1). The other of the source electrode and the drain electrode of the transistor 703_(n+1) is electrically connected to a gate electrode of the transistor 704_(n+1) and the node 14_(n+1). One of a source electrode and a drain electrode of the transistor 704_(n+1) is electrically connected to the signal line 15. One of a source electrode and a drain electrode of the transistor 705_(n+1) is electrically connected to the signal line 16_(n+1). The other of the source electrode and the drain electrode of the transistor 704_(n+1) is electrically connected to the other of the source electrode and the drain electrode of the transistor 705_(n+1). A gate electrode of the transistor 703_(n+1) is electrically connected to the signal line 12_(n+1). A gate electrode of the transistor 705_(n+1) is electrically connected to the signal line 13_(n+1).

Note that FIG. 6 illustrates a structure where the anode of the photodiode 702_n is electrically connected to the signal line 11_n and the cathode of the photodiode 702_n is electrically connected to one of the source electrode and the drain electrode of the transistor 703_n; however, the present invention is not limited thereto. The cathode of the photodiode 702_n may be electrically connected to the signal line 11_n, and the anode of the photodiode 702_n may be electrically connected to one of the source electrode and the drain electrode of the transistor 703_n.

Similarly, FIG. 6 illustrates a structure where the anode of the photodiode 702_(n+1) is electrically connected to the signal line 11_(n+1) and the cathode of the photodiode 702_(n+1) is electrically connected to one of the source electrode and the drain electrode of the transistor 703_(n+1); however, the present invention is not limited thereto. The cathode of the photodiode 702_(n+1) may be electrically connected to the signal line 11_(n+1), and the anode of the photodiode 702_(n+1) may be electrically connected to one of the source electrode and the drain electrode of the transistor 703_(n+1).

A photodiode 702 is a photoelectric conversion element that generates current when the photoelectric conversion element is irradiated with light. Thus, by detecting light reflected from the object, photocurrent flows through the photodiode 702.

A transistor 703 functions as a transistor that controls an imaging time. In one embodiment of the disclosed invention, positive electric charge is accumulated in the node 14 by setting the potential of the signal line 11 and the potential of the gate electrode of the transistor 703 (the potential of the signal line 12) from low to high. Imaging is started by setting the potential of the signal line 11 from high to low while the potential of the gate electrode of the transistor 703 (the potential of the signal line 12) is kept high. Negative electric charge is accumulated in the node 14 in accordance with light entering the photodiode 702. In this manner, the transistor 703 can change the amount of electric charge accumulated in the node 14 by setting the potential of the gate electrode of the transistor 703 to high or low. The imaging ends when the potential of the gate electrode of the transistor 703 (the potential of the signal line 12) is set from high to low.

In 3D imaging, the potentials of a signal line 11_n(PR_n) and a signal line 12_n(TX_n) are controlled. Further, the potentials of a signal line 11_(n+1)(PR_(n+1)) and a signal line 12_(n+1)(TX_(n+1)) are controlled.

Specifically, in the first imaging, the potentials of the signal line 11_n(PR_n) and the signal line 12_n(TX_n) are controlled so that the first imaging starts when irradiation starts and the first imaging ends when the irradiation ends. In the second imaging, the potentials of the signal line 11_(n+1)(PR_(n+1)) and the signal line 12_(n+1)(TX_(n+1)) are controlled so that the second imaging starts when the irradiation ends and the second imaging ends after imaging for the same length of time as the first imaging.

A transistor 704 functions as a transistor that amplifies electric charge accumulated in the node 14. A transistor 705 functions as a transistor that controls the output of the photosensor. A signal is read when a signal input to a gate electrode of the transistor 705 (the potential of the signal line 13) is set from low to high.

As described above, the photosensor 700_n and the photosensor 700_(n+1) each include four elements: one photodiode and three transistors. Since the photosensor can include fewer elements, high integration of the photosensor and a reduction in pixel size can be facilitated.

The transistor 703, the transistor 704, and the transistor 705 have functions that are similar to those of the transistor 403, the transistor 404, and the transistor 405 described in the above embodiment, respectively. Thus, the above embodiment can be referred to for preferred semiconductor layers of the transistor 703, the transistor 704, and the transistor 705.

As described above, the photosensor includes four elements: one photodiode and three transistors. Since the photosensor can include fewer elements, high integration of the photosensor and a reduction in pixel size can be facilitated.

When the emphasis is put on the operation speed of a medium or small photosensor, all the transistor 703, the transistor 704, and the transistor 705 can be formed using a material such as polycrystalline silicon or single crystal silicon.

When the emphasis is put on cost, all the transistor 703, the transistor 704, and the transistor 705 can be formed using an oxide semiconductor material.

When the emphasis is put on cost and size, all the transistor 703, the transistor 704, and the transistor 705 can be formed using amorphous silicon or microcrystalline silicon.

Photosensors (e.g., the photosensor 700_n and the photosensor 700_(n+1)) are arranged adjacent to each other, so that light reflected off substantially the same point of the object can be detected by two adjacent photosensors. One of the adjacent photosensors detects light reflected before the end of light irradiation, and the other of the adjacent photosensors detects light reflected after the end of light irradiation. Thus, the accuracy of position detection can be improved even when the object moves fast.

Detection accuracy greatly differs between the case where imaging is performed every frame (e.g., every 120 hertz) and the case where first imaging and second imaging are performed by one light irradiation without a time difference. In the case where imaging is performed every frame (e.g., every 120 hertz), for example, when a hand moves from right to left by 10 cm, a deviation of about 8 mm (about half a finger) occurs. However, in the case where first imaging and second imaging are performed by one light irradiation without a time difference, such deviation does not occur; thus, imaging can be performed without distortion. Further, even when a hand moves at a speed of 0.1 to 10 m per second, a ball is thrown at high speed, or an animal or the like performs unintentional movement, imaging can be performed with high detection accuracy.

Next, a specific example of a method for driving the imaging device including the photosensor 700_n and the photosensor 700_(n+1) is described with reference to timing charts of FIG. 7 and FIG. 8. With the driving method, the distance from the imaging device to an object can be measured by 3D TOF imaging. Even when the object is a fast-moving object, the accuracy of position detection does not decrease significantly.

FIG. 7 illustrates an example of the operation of the photosensor 700_n and the photosensor 700_(n+1). FIG. 8 illustrates features of the driving method and a distance measuring method by 3D TOF imaging.

FIG. 7 is a timing chart of the signal line 11_n, the signal line 12_n, the signal line 13_n, the node 14_n, and the signal line 16_n in the photosensor 700_n, and the signal line 11_(n+1), the signal line 12_(n+1), the signal line 13_(n+1), the node 14_(n+1), and the signal line 16_(n+1) in the photosensor 700_(n+1). 3D imaging is performed from the time T1 to the time T10.

Note that in the timing charts of FIG. 7 and FIG. 8, the high levels of a pulse 601 and a pulse 602 represent "irradiation", while the low levels of the pulse 601 and the pulse 602 represent "non-irradiation". The high levels of the other pulses represent "high potentials", while the low levels of the other pulses represent "low potentials".

In 3D imaging in one embodiment of the disclosed invention, the object is irradiated with light from the light source once. In light irradiation, the distance between the light source and the object may change. In other words, the object may be a moving object. Further, the moving object may move fast.

The period from the time T2 to the time T3 is a time from when light (irradiation light) is emitted from the light source to the object to when the light (reflected light) arrives at the imaging device after reflected off the object.

At the time T1, the signal line 11_n goes high. Further, the signal line 12_n goes high (first reset). At this time, the photodiode 702_n and the transistor 703_n are brought into conduction, and the node 14_n goes high.

At the time T2, light irradiation in which the object is irradiated with light from the light source starts. The pulse 601 goes from low (non-irradiation) to high (irradiation). The time T2 is an irradiation start time. Further, the signal line 11_n goes low, and the signal line 12_n is kept high (the first imaging starts). Note that a first imaging start time coincides with the irradiation start time.

At the time T3, irradiation light emitted from the light source is reflected off the object, and reflected light starts to enter the imaging device. The pulse 602 goes from low (non-irradiation) to high (irradiation). The time T3 is a reflection start time. The time T3 is also a first reflected light detection start time. Detection of reflected light can be started at the time T3. The potential of the node 14_n starts to decrease from high.

At the time T4, the signal line 12_n is kept high. The potential of the node 14_n keeps decreasing. Further, at the time T4, the signal line 11_(n+1) and the signal line 12_(n+1) go high (second reset). At this time, the photodiode 702_(n+1) and the transistor 703_(n+1) are brought into conduction, and the node 14_(n+1) goes high.

At the time T5, the light irradiation in which the object is irradiated with light from the light source ends. The pulse 601 goes from high (irradiation) to low (non-irradiation). The time T5 is an irradiation end time. The signal line 12_n goes low. At this time, the first imaging ends. Note that a first imaging end time coincides with the irradiation end time. The time T5 is also a first reflected light detection end time.

When the signal line 12_n goes low, parasitic capacitance between the signal line 12_n and the node 14_n causes a change in potential of the node 14_n. A significant change in potential inhibits accurate acquisition of photocurrent generated by the photodiode 702_n through the first and second imaging. Thus, effective methods of reducing the influence of parasitic capacitance are, for example, to reduce gate-source capacitance of the transistor 703_n or gate-drain capacitance of the transistor 703_n and to connect a storage capacitor to the node 14_n. The photosensor 700_n according to one embodiment of the present invention employs these methods, so that a change in potential of the node 14_n due to parasitic capacitance can be negligible.

Note that the same method is employed in the case of the photosensor 700_(n+1) according to one embodiment of the present invention.

In this manner, the potentials of the signal line 11_n and the signal line 12_n are controlled so that the first imaging starts when the irradiation starts and the first imaging ends when the irradiation ends.

From the time T3 to the time T5 (during a first reflected light detection period), the potential of the node 14_n changes depending on the intensity of reflected light entering the photodiode 702_n. The potential of the node 14_n starts to decrease from high because of the off-state current of the photodiode 702_n. The off-state current is proportional to irradiation time and the intensity of reflected light entering the photodiode 702_n.

Here, a relation between a change in potential of the node 14, irradiation time, and the intensity of light entering the photodiode 702 (reflected light) is described. If the detection period is fixed, as the intensity of the reflected light increases, the amount of change in potential of the node 14 increases. If the light intensity is fixed, as the length of the reflected light detection period increases, the amount of change in potential of the node 14 increases. Thus, as the intensity of the reflected light increases and the length of the reflected light detection period increases, the off-state current of the photodiode 702 increases and the amount of change in potential of the node 14 increases.

Note that the potential of the node 14_n becomes constant after the time T5. The potential V1 of the node 14_n at the time T5 is dependent on photocurrent generated by the photodiode 702_n during the first reflected light detection. This means that the potential of the node 14_n is determined by the intensity of reflected light and the like.

A first detection signal is determined by the potential V1 of the node 14_n at the time T5. As the length of the first reflected light detection period increases, the amount of change in potential of the node 14_n increases; thus, the potential V1 of the node 14_n at the time T5 decreases.

Note that all the light entering the photodiode 702_n from the time T1 to the time T5 corresponds to reflected light, i.e., light reflected off an object irradiated with light from the light source.

Further, all the light entering the photodiode 702_(n+1) from the time T4 to the time T7 corresponds to reflected light, i.e., light reflected off an object irradiated with light from the light source.

At the time T5, the signal line 11_(n+1) goes low, and the signal line 12_(n+1) is kept high (the second imaging starts). Note that a second imaging start time coincides with the irradiation end time. The time T5 is also a second reflected light detection start time. Detection of reflected light can be started at the time T5.

From the time T5 to the time T6 (during a second reflected light detection period), the potential of the node 14_(n+1) changes depending on the intensity of reflected light entering the photodiode 702_(n+1) during the second reflected light detection period. The potential of the node 14_(n+1) starts to decrease from high because of the off-state current of the photodiode 702_(n+1). The off-state current is proportional to irradiation time and the intensity of reflected light entering the photodiode 702_(n+1). Thus, the potential of the node 14_(n+1) changes depending on the intensity of the reflected light and the length of the reflected light detection period.

Note that in this embodiment, for example, the second reflected light detection period (from the time T3 to the time T5) is shorter than the second reflected light detection period (from the time T5 to the time T6). Thus, the amount of change in potential of the node 14 during the second imaging is smaller than the amount of change in potential of the node 14 during the first imaging.

At the time T6, entry of the reflected light reflected off the object to the imaging device ends. The pulse 602 goes from high (irradiation) to low (non-irradiation). The time T6 is a reflection end time. The time T6 is also a second reflected light detection end time. On the other hand, the signal line 12_(n+1) is kept high.

Note that the potential of the node 14_(n+1) becomes constant after the time T6. The potential V2 of the node 14_(n+1) at the time T6 depends on photocurrent generated by the photodiode 702_(n+1) during the second reflected light detection. This means that the potential of the node 14_(n+1) is determined by the intensity of reflected light and the like.

A second detection signal is determined by the potential V2 of the node 14_(n+1) at the time T6. As the length of the second reflected light detection period decreases, the amount of change in potential of the node 14_(n+1) decreases; thus, the potential V2 of the node 14_(n+1) at the time T6 increases.

At the time T7, the signal line 12_(n+1) goes low. At this time, the second imaging ends.

In this manner, the potentials of the signal line 11_(n+1) and the signal line 12_(n+1) are controlled so that the second imaging starts when irradiation ends and the second imaging ends after imaging for the same length of time as the first imaging.

At the time T8, the signal line 13_n goes high (first reading starts). At this time, the transistor 705_n is turned on. Further, the signal line 15 and the signal line 16_n are brought into conduction through the transistor 704_n and the transistor 705_n. Then, the potential of the signal line 16_n decreases. Note that the signal line 16_n is precharged high before the time T8.

There is no limitation on the structure of a read circuit with which the signal line 16_n is precharged. The read circuit can include one p-channel transistor 406 as in the read circuit 401 illustrated in FIG. 13.

At the time T9, the signal line 13_n goes low (the first reading ends). Then, the transistor 705_n is turned off, and the potential of the signal line 16_n becomes constant. The potential $V_{S1}$ of the signal line 16_n at the time T9 depends on the speed at which the potential of the signal line 16_n changes from the time T8 to the time T9.

Note that the speed at which the potential of the signal line 16_n changes depends on the source-drain current of the transistor 704_n, i.e., irradiation time and the intensity of light entering the photodiode 702_n (reflected light) in the first imaging. If the irradiation time is fixed, as the reflected light intensity increases, the speed at which the potential of the signal line 16_n changes decreases. If the light intensity is fixed, as the length of the reflected light detection period increases, the speed at which the potential of the signal line 16_n changes decreases. As the speed at which the potential of the signal line 16_n changes decreases, the potential $V_{S1}$ of the signal line 16_n at the time T9 increases.

For this reason, by acquiring the potential $V_{S1}$ of the signal line 16_n at the time T9 by the first reflected light detection, the amount of light entering the photodiode 702_n (reflected light) during the first imaging period (the product of time and the intensity of incident light) is detected; thus, the detection signal S1 can be obtained. Assuming that the intensity of irradiation light is fixed and only the first reflected light enters the photodiode 702_n, the potential $V_{S1}$ of the signal line 16_n is substantially proportional to the length of the first reflected light detection period.

The relation between the potential of the node 14 and the potential of the signal line 16 is described. When the intensity of light entering the photodiode 702 (reflected light) is high, the amount of change in potential of the node 14 during a certain period is large. At this time, the channel resistance of the transistor 704 increases, so that the speed at which the potential of the signal line 16 changes decreases. Consequently, the amount of change in potential of the signal line 16 during a certain period is small.

At the time T9, the signal line 13_(n+1) goes high (second reading starts). At this time, the transistor 705_(n+1) is turned on. Further, the signal line 15 and the signal line 16_(n+1) are brought into conduction through the transistor 704_(n+1) and the transistor 705_(n+1). Then, the potential of the signal line 16_(n+1) decreases. Note that the signal line 16_(n+1) is precharged high before the time T9.

At the time T10, the signal line 13_(n+1) goes low (the second reading ends). Then, the transistor 705_(n+1) is turned off, and the potential of the signal line 16_(n+1) becomes constant. The potential $V_{S2}$ of the signal line 16_(n+1) at the time T10 depends on the speed at which the potential of the signal line 16_(n+1) changes from the time T9 to the time T10.

If the light intensity is fixed, as the length of the reflected light detection period decreases, the speed at which the potential of the signal line 16_(n+1) changes increases. As the speed at which the potential of the signal line 16_(n+1) changes increases, the potential $V_{S2}$ of the signal line 16_(n+1) at the time T10 decreases.

For this reason, by acquiring the potential $V_{S2}$ of the signal line 16_(n+1) at the time T10 by the second reflected light detection, the amount of light entering the photodiode 702_(n+1) (reflected light) during the second imaging period (the product of time and the intensity of incident light) is detected; thus, the detection signal S2 can be obtained. Assuming that the intensity of irradiation light is fixed and only the second reflected light enters the photodiode 702_(n+1), the potential $V_{S2}$ of the signal line 16_(n+1) is substantially proportional to the length of the second reflected light detection period.

Note that in this embodiment, the second reflected light detection period (from the time T5 to the time T6) is shorter than the first reflected light detection period (from the time T3 to the time T5), so that the potential $V_{S2}$ of the signal line 16_(n+1) at the time T10 is lower than the potential $V_{S1}$ of the signal line 16_(n+1) at the time T9.

At the time T10, the detection signal S1 and the detection signal S2 can be obtained by the first imaging and the second imaging, respectively, so that 3D TOF imaging can be performed.

As described above, the first reflected light detection period is a period during which light reflected off the object at the time of irradiation is detected, and the second reflected light detection period is a period during which light reflected off the object after the end of irradiation is detected. In other words, light reflected off substantially the same point of the object can be detected continuously by using adjacent photosensors.

FIG. 8 is a timing chart of the pulse 601, the pulse 602, the pulse of the signal line 12_n, and the pulse of the signal line 12_(n+1) in the photosensor 700_n and the photosensor 700_(n+1). First, the features of the driving method are described with reference to FIG. 8. Detection of reflected light is divided into two periods: the first reflected light detection period and the second reflected light detection period. The main feature of the driving method in one embodiment of the disclosed invention is to optimize, using the photosensor 700_n and the photosensor 700_(n+1) adjacent to each other, the timing of the imaging time by controlling the potentials of the signal line 11_n, the signal line 12_n, the signal line 11_(n+1), and the signal line 12_(n+1) so that the first imaging and the second imaging are sequentially performed.

Comparison among the pulses in FIG. 8 is described dividing the time into the following periods: an irradiation period, a reflection period, imaging periods, and reflected light detection periods.

As shown in the pulse 601, the time T2 is the irradiation start time, the time T5 is the irradiation end time, and a period from the time T2 to the time T5 is the irradiation period. As shown in the pulse 602, the time T3 is the reflection start time, the time T6 is the reflection end time, and a period from the time T3 to the time T6 is the reflection period. The reflection period and the irradiation period have the same length of time.

As shown in the pulse of the signal line 12_n(TX_n), the time T2 is the first imaging start time, the time T5 is the first imaging end time, and a period from the time T2 to the time T5 is the first imaging period. Further, the time T3 is the first reflected light detection start time, the time T5 is the first reflected light detection end time, and a period from the time T3 to the time T5 is the first reflected light detection period.

The first imaging should be started at least before the reflection period. Further, the first imaging should be ended when the irradiation period ends. The potentials of the signal line 11_n and the signal line 12_n are controlled so that the timing of the imaging period is determined as described above.

As shown in the pulse of the signal line 12_(n+1)(TX_(n+1)), the time T5 is the second imaging start time, the time T7 is a second imaging end time, and a period from the time T5 to the time T7 is the second imaging period. Further, the time T5 is the second reflected light detection start time, the time T6 is the second reflected light detection end time, and a period from the time T5 to the time T6 is the second reflected light detection period.

The second imaging should be started when the irradiation period ends. Further, the second imaging should be ended at least after the reflection period. The potentials of the signal line 11_(n+1) and the signal line 12_(n+1) are controlled so that the timing of the imaging period is determined as described above.

In other words, a period in which reflected light entering the photosensor 700_n and the photosensor 700_(n+1) during the reflection period is detected is divided into two periods. Further, the first reflected light during the first imaging period is detected with the photosensor 700_n, and the second reflected light during the second imaging period is detected with the photosensor 700_(n+1). Thus, the imaging can be performed continuously.

Note that the first reflected light detection period is within the first imaging period. The second reflected light detection period is within the second imaging period. The distance from the imaging device to the object can be measured by acquiring the first detection signal S1 that is acquired through the first reflected light detection and is dependent on a light delay time and the second detection signal S2 that is acquired through the second reflected light detection and is dependent on a light delay time.

Next, an example of a distance measuring method by 3D TOF imaging is described. An example of a method for measuring the distance from the imaging device to the object is described with reference to formulas by using the first detection signal S1 and the second detection signal S2.

Here, assuming that the intensity of irradiation light from the light source to the object is fixed and the photodiode 702_n and the photodiode 702_(n+1) are irradiated with only the first reflected light during the first imaging period and the second reflected light during the second imaging period, the potential $V_{S1}$ of the signal line 16_n is substantially proportional to the length of the first reflected light detection period, and the potential $V_{S2}$ of the signal line 16_(n+1) is substantially proportional to the length of the second reflected light detection period.

In other words, the first detection signal S1 obtained through the first imaging is substantially dependent on the first reflected light detection period, and the second detection signal S2 obtained through the second imaging is substantially dependent on the second reflected light detection period.

The first detection signal S1 and the second detection signal S2 can be expressed by Formulas (2) and (3), respectively, where α represents a proportional constant, T represents an irradiation period, and Δt represents a delay time.

$$S1 = \alpha \times (T - \Delta t) \quad (2)$$

$$S2 = \alpha \times (\Delta t) \quad (3)$$

Erasure of the proportional constant α using Formulas (2) and (3) gives the delay time Δt, as expressed by Formula (4).

$$\Delta t = \frac{(T \times S2)}{(S1 + S2)} \quad (4)$$

The distance x from the imaging device to the object can be expressed by Formula (1) by using the formula (x=(c×Δt)/2) expressing the distance x from the light source to the object and Formula (4).

$$x = \frac{c \times T \times S2}{2 \times (S1 + S2)} \quad (1)$$

This shows that the distance x from the imaging device to the object can be obtained if the first detection signal S1 and the second detection signal S2 are obtained.

Third imaging may be performed with the photosensor 700_n or the photosensor 700_(n+1) in a period during which the light source does not emit light. In that case, the third detection signal S3 is obtained through the third imaging. When a value obtained by subtracting the third detection signal S3 from the first detection signal S1 and a value obtained by subtracting the third detection signal S3 from the second detection signal S2 are applied to the detection signal S1 and the detection signal S2 in Formula (1), respectively, the influence of natural light can be eliminated.

This shows that the photosensor can include fewer elements, and an imaging device including the photosensor that operates with an improved driving method can achieve 3D TOF imaging and can function as a distance measuring device. Thus, a problem of an increased number of elements for the photosensor that occurs with the TOF method can be solved and an imaging device that is advantageous in reducing pixel size can be achieved.

In addition, one of the adjacent photosensors detects light reflected before the end of irradiation of the object with light from the light source, and the other of the adjacent photosensors detects light reflected after the end of the irradiation. Thus, even when the object moves fast, the distance from the light source to the object (a moving object) can be measured without decreasing the accuracy of position detection.

Note that this embodiment can be combined with any of the other embodiments in this specification as appropriate.

(Embodiment 4)

In this embodiment, an example of a method for driving an imaging device with which 2D imaging and 3D TOF imaging can be performed concurrently is described with reference to FIGS. 9A and 9B, FIGS. 10A and 10B, FIG. 11, FIG. 12, and FIG. 13. Note that the imaging device includes a first photosensor absorbing visible light and a second photosensor absorbing infrared light. These photosensors overlap with each other.

In 3D imaging, the distance from a light source to an object is measured in the following manner. First imaging and second imaging are performed with respect to the timings of first infrared light irradiation and second infrared light irradiation (which have the same length of time and are performed at different timings), respectively. A first detection signal that is dependent on a light delay time is acquired through first infrared reflected light detection in which first reflected light resulting from the first infrared light irradiation is detected. A second detection signal that is dependent on a light delay time is acquired through second infrared reflected light detection in which second reflected light resulting from the second infrared light irradiation is detected. In 2D imaging, third imaging is performed to acquire a third detection signal, so that the brightness or color of the object can be obtained, for example.

The structures of photosensors included in an imaging device in one embodiment of the invention disclosed in this specification are described with reference to FIGS. 9A and 9B and FIGS. 10A and 10B. A photosensor 800 includes a first photosensor 800A and a second photosensor 800B.

Figure 9A:
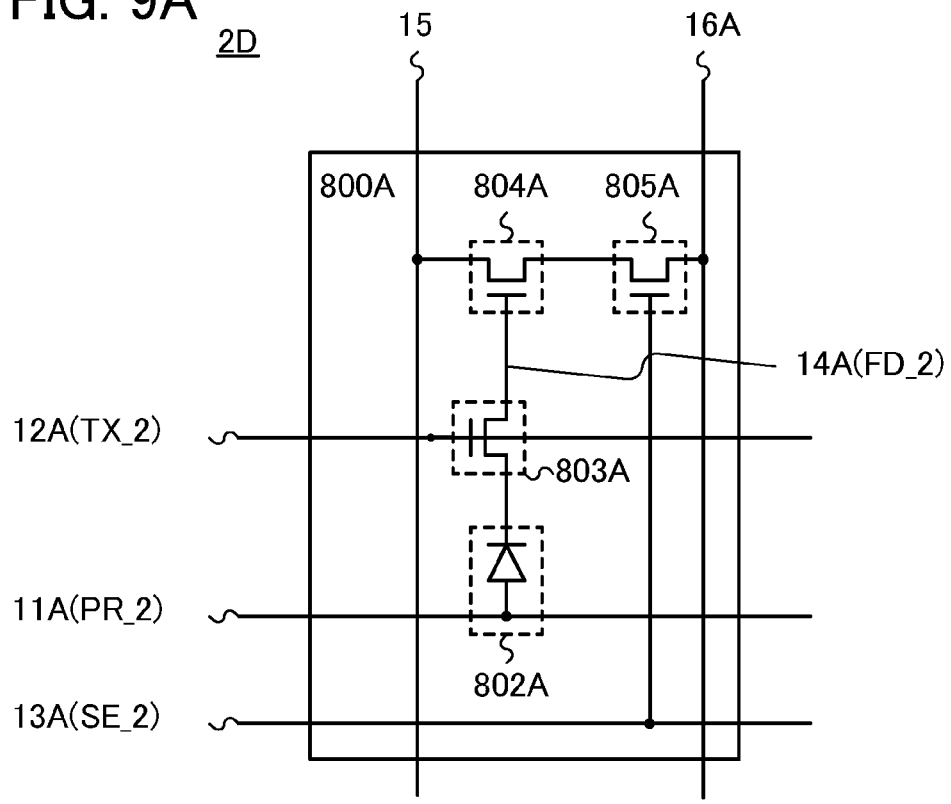
FIGS. 9A and 9B each illustrate a photosensor in Embodiment 4.
Figure 9B:
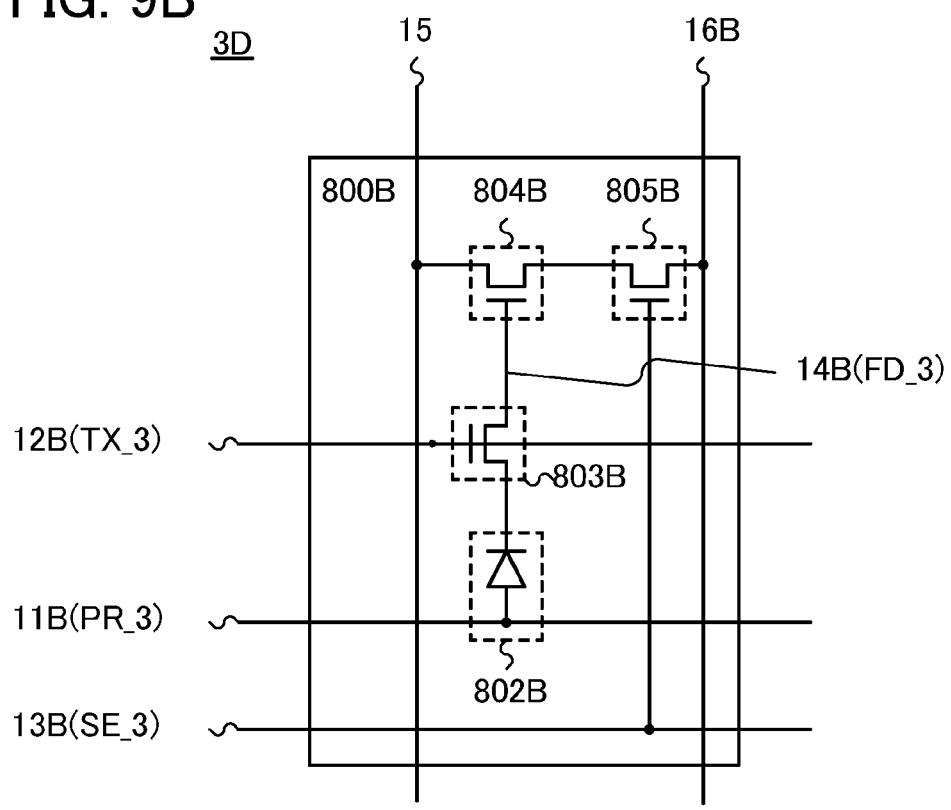

As illustrated in FIGS. 9A and 9B, the first photosensor 800A and the second photosensor 800B have the same structure. The first photosensor 800A includes three transistors and one photodiode. The second photosensor 800B includes three transistors and one photodiode. As illustrated in FIG. 9A, the first photosensor 800A includes a first photodiode 802A, a first transistor 804A, a second transistor 805A, and a third transistor 803A. Similarly, as illustrated in FIG. 9B, the second photosensor 800B includes a second photodiode 802B, a first transistor 804B, a second transistor 805B, and a third transistor 803B.

Figure 10A:
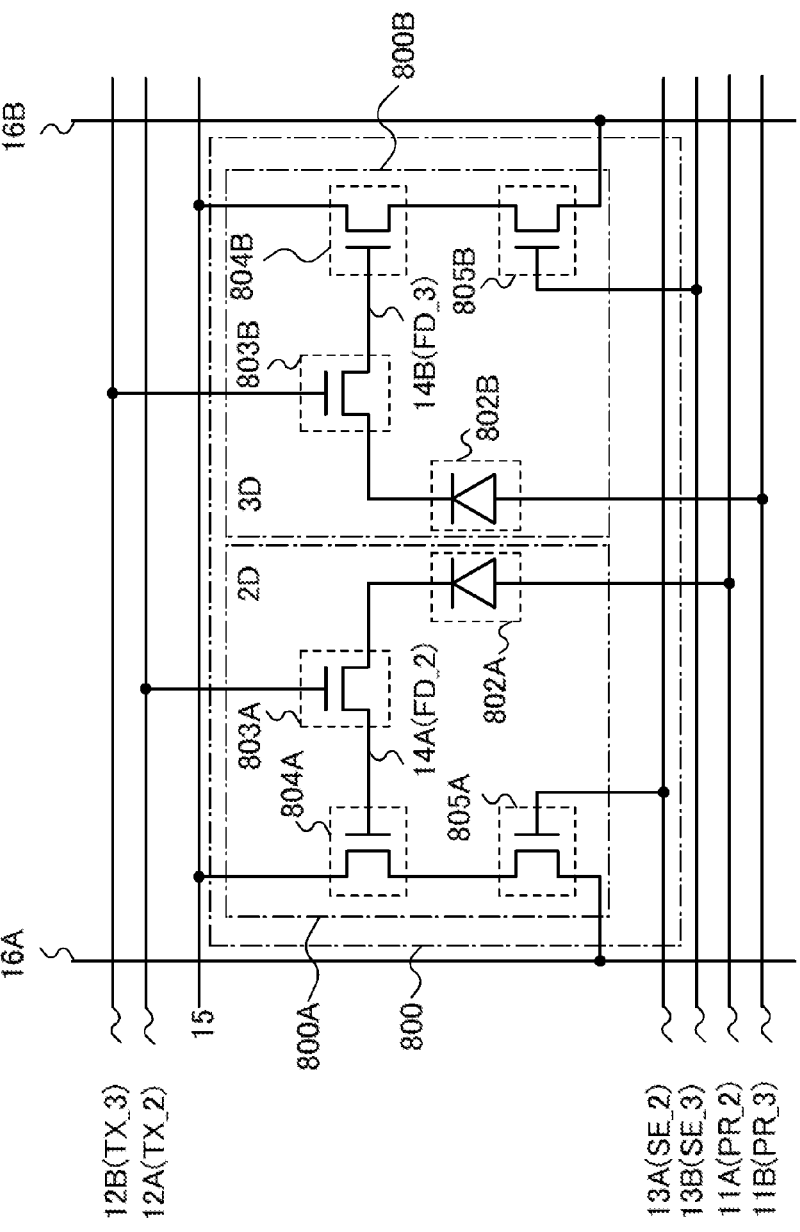
FIGS. 10A and 10B illustrate the photosensor in Embodiment 4.
Figure 10B:
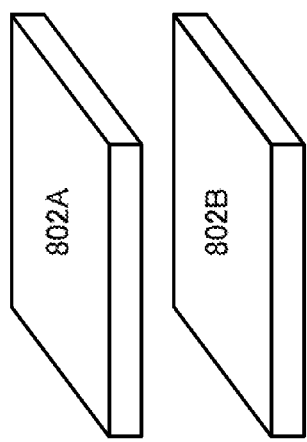

FIG. 10A is an example of a circuit diagram illustrating the structure of the photosensor 800 included in the imaging device. As illustrated in FIG. 10A, the first photosensor 800A and the second photosensor 800B are adjacent to each other. Specifically, as illustrated in FIG. 10B, the first photodiode 802A and the second photodiode 802B overlap with each other. Further, the first photodiode 802A is placed so that light (including visible light and infrared light) entering the photosensor 800 enters the first photodiode 802A before entering the second photodiode 802B.

Note that in this specification, light entering the photosensor 800 is reflected light. In this specification, light entering the first photodiode 802A is light reflected off an object irradiated with light from a light source or natural light, or both (visible light). Light entering the second photodiode 802B is light reflected off an object irradiated with light from the light source (infrared light).

When the first photosensor 800A and the second photosensor 800B overlap with each other, the sensors can share an area; thus, the area of the imaging device that is occupied by the photosensors can be reduced. Thus, pixel size can be reduced.

A semiconductor layer of the first photodiode 802A absorbs mainly visible light and transmits most of infrared light. For example, the semiconductor layer of the first photodiode 802A can be formed using amorphous silicon or the like.

A semiconductor layer of the second photodiode 802B absorbs infrared light. For example, the semiconductor layer of the second photodiode 802B can be formed using polycrystalline silicon, microcrystalline silicon, single crystal silicon, or the like.

Thus, the first photodiode 802A absorbs visible light earlier than the second photodiode 802B, so that the amount of visible light entering the second photodiode 802B can be reduced.

In other words, the first photosensor 800A utilizes visible light, and the second photosensor 800B utilizes infrared light.

In FIG. 9A and FIG. 10A, a signal line 11A is a reset signal line (PR_2). A signal line 12A is an electric charge accumulation signal line (TX_2). A signal line 13A is a selection signal line (SE_2). A node 14A is a floating diffusion node (FD_2). A signal line 16A is a photosensor output signal line. In FIG. 9B and FIG. 10B, a signal line 11B is a reset signal line (PR_3). A signal line 12B is an electric charge accumulation signal line (TX_3). A signal line 13B is a selection signal line (SE_3). A node 14B is a floating diffusion node (FD_3). A signal line 16B is a photosensor output signal line. The signal line 15 is a photosensor reference signal line that can be shared by the first photosensor 800A and the second photosensor 800B.

As illustrated in FIG. 10A, in the photosensor 800, an anode of the photodiode 802 is electrically connected to the signal line 11. A cathode of the photodiode 802 is electrically connected to one of a source electrode and a drain electrode of the third transistor 803. The other of the source electrode and the drain electrode of the third transistor 803 is electrically connected to a gate electrode of the first transistor 804 and the node 14. One of a source electrode and a drain electrode of the first transistor 804 is electrically connected to the signal line 15. One of a source electrode and a drain electrode of the second transistor 805 is electrically connected to the signal line 16. The other of the source electrode and the drain electrode of the first transistor 804 is electrically connected to the other of the source electrode and the drain electrode of the second transistor 805. A gate electrode of the third transistor 803 is electrically connected to the signal line 12. A gate electrode of the second transistor 805 is electrically connected to the signal line 13.

Note that FIGS. 9A and 9B and FIG. 10A illustrate a structure where the anode of the photodiode 802 is electrically connected to the signal line 11 and the cathode of the photodiode 802 is electrically connected to one of the source electrode and the drain electrode of the third transistor 803; however, the present invention is not limited thereto. The cathode of the photodiode 802 may be electrically connected to the signal line 11, and the anode of the photodiode 802 may be electrically connected to one of the source electrode and the drain electrode of the third transistor 803.

The photodiode 802 is a photoelectric conversion element that generates current when the photoelectric conversion element is irradiated with light. Thus, by detecting light reflected from an object, photocurrent flows through the photodiode 802.

The third transistor 803 functions as a transistor that controls an imaging time. In one embodiment of the disclosed invention, positive electric charge is accumulated in the node 14 by setting the potential of the signal line 11 and the potential of the gate electrode of the third transistor 803 (the potential of the signal line 12) from "L (low)" to "H (high)". Imaging is started by setting the potential of the signal line 11 from high to low while the potential of the gate electrode of the third transistor 803 (the potential of the signal line 12) is kept high. Negative electric charge is accumulated in the node 14 in accordance with light entering the photodiode 802. In this manner, the third transistor 803 can change the amount of electric charge accumulated in the node 14 by setting the potential of the gate electrode of the third transistor 803 to high or low. The imaging ends when the potential of the gate electrode of the third transistor 803 (the potential of the signal line 12) is set from high to low.

In 3D imaging, the potentials of the signal line 11B(PR_3) and the signal line 12B(TX_3) are controlled. Specifically, in the first imaging, the potentials of the signal line 11B and the signal line 12B are controlled so that the first imaging starts when first irradiation starts and the first imaging ends when the first irradiation ends. In the second imaging, the potentials of the signal line 11B and the signal line 12B are controlled so that the second imaging starts when second irradiation ends and the second imaging ends after imaging for the same length of time as the first imaging.

In 2D imaging, the potentials of the signal line 11A(PR_2) and the signal line 12A(TX_2) are controlled. Specifically, in the third imaging, the potentials of the signal line 11A and the signal line 12A are controlled so that the third imaging starts when the first imaging starts and the third imaging ends after the second imaging ends.

The first transistor 804 functions as a transistor that amplifies electric charge accumulated in the node 14. The second transistor 805 functions as a transistor that controls the output of the photosensor. A signal is read when a signal input to the gate electrode of the second transistor 805 (the potential of the signal line 13) is set from low to high.

The third transistor 803, the first transistor 804, and the second transistor 805 have functions that are similar to those of the transistor 403, the transistor 404, and the transistor 405 described in the above embodiment, respectively. Thus, the above embodiment can be referred to for preferred semiconductor layers of the third transistor 803, the first transistor 804, and the second transistor 805.

A method for driving an imaging device including the photosensor 800 is described. With this driving method, 2D imaging and 3D TOF imaging can be performed concurrently. Since the first photosensor 800A and the second photosensor 800B overlap with each other, it is possible to reduce pixel size and perform 2D imaging using the first photosensor 800A absorbing visible light, and 3D imaging using the second photosensor 800B absorbing infrared light.

Figure 12:
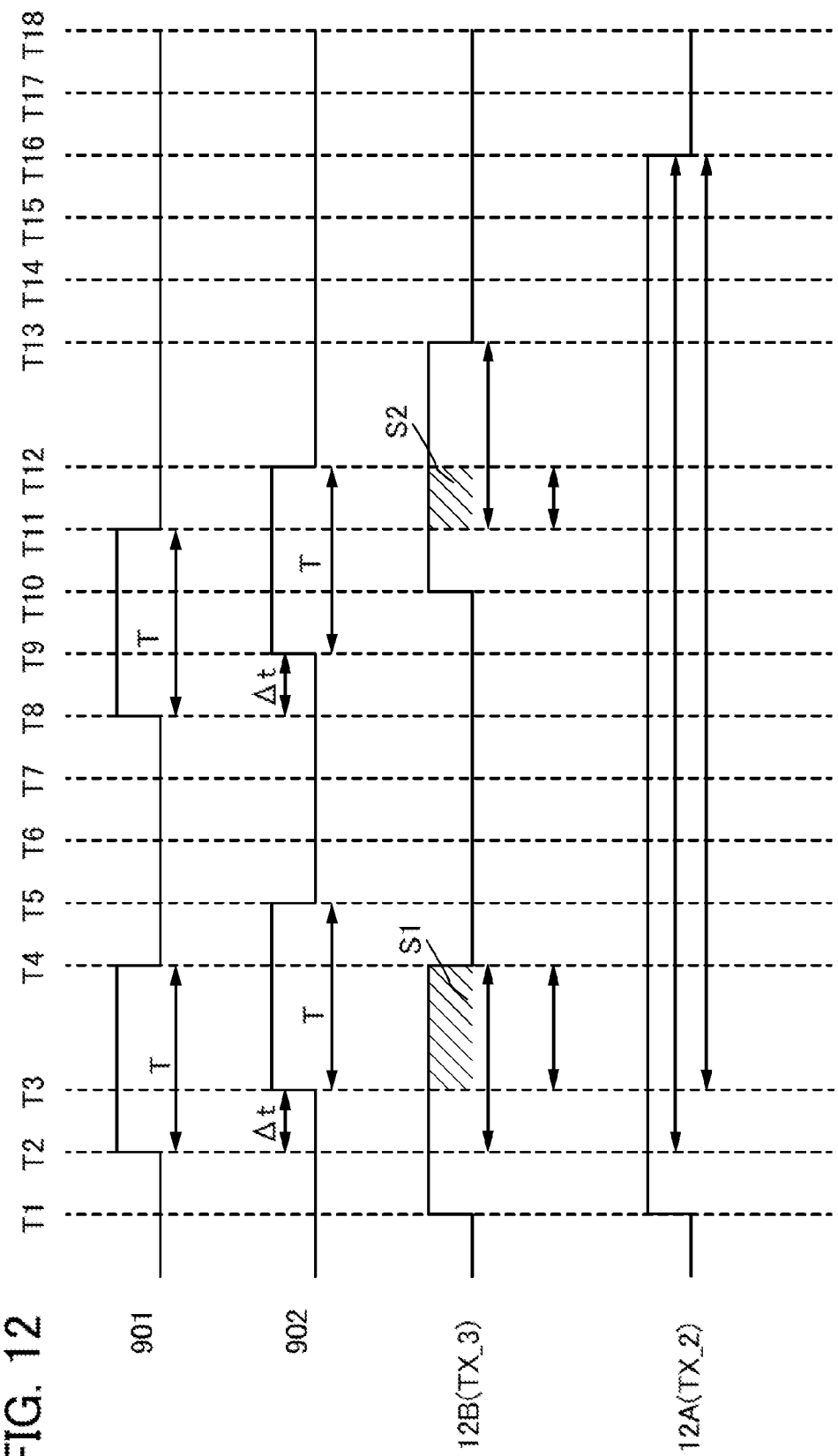
FIG. 12 is a timing chart of the photosensor in Embodiment 4.
Figure 13:
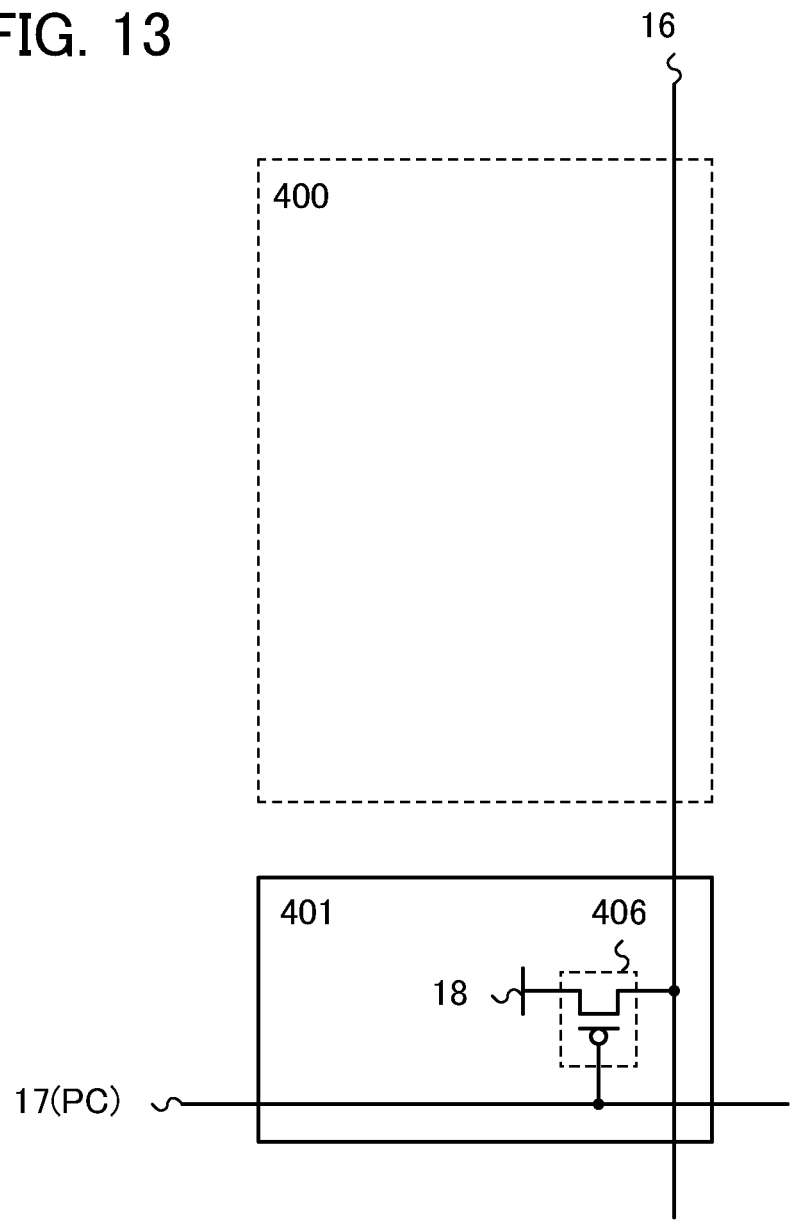
FIG. 13 illustrates a read circuit.

The driving method is specifically described with reference to timing charts of FIG. 11 and FIG. 12. First, FIG. 11 illustrates the operation of the photosensor 800. FIG. 12 illustrates features of the driving method and a method for performing 2D imaging and 3D TOF imaging concurrently.

FIG. 11 is a timing chart of the photosensor 800. 2D imaging and 3D imaging are performed from the time T1 to a time T18.

Note that in the timing charts of FIG. 11 and FIG. 12, the high levels of a pulse 901 and a pulse 902 represent "irradiation", while the low levels of the pulse 901 and the pulse 902 represent "non-irradiation". The high levels of the other pulses represent "high potentials", while the low levels of the other pulses represent "low potentials".

In the 3D imaging, the object is irradiated with light from the light source twice (the first irradiation and the second irradiation). Note that the second irradiation and the first irradiation are performed for the same length of time at different timings. The distance from the light source to the object is unchanged in the first irradiation and the second irradiation. It is apparent that a period from the time T2 to the time T3 (a delay time) and a period from the time T8 to the time T9 (a delay time) have the same length of time.

At the time T1, the signal line 11B goes high. Further, the signal line 12B goes high (first reset in the 3D imaging). At this time, the second photodiode 802B and the third transistor 803B are brought into conduction, and the node 14B goes high.

Similarly, the signal line 11A goes high. Further, the signal line 12A goes high (first reset in the 2D imaging). At this time, the first photodiode 802A and the third transistor 803A are brought into conduction, and the node 14A goes high.

At the time T2, first light irradiation in which the object is irradiated with light from the light source starts. The pulse 901 goes from low (non-irradiation) to high (irradiation). The time T2 is a first irradiation start time. Further, the signal line 11B goes low, and the signal line 12B is kept high (the first imaging starts). Note that a first imaging start time coincides with the first irradiation start time.

Similarly, the signal line 11A goes low, and the signal line 12A is kept high (the third imaging starts). In this structure, the first photodiode 802A absorbing visible light and the second photodiode 802B absorbing infrared light overlap with each other; thus, the first imaging and the third imaging can start at the same time.

At the time T3, first irradiation light emitted from the light source is reflected off the object, and first reflected light (infrared light) starts to enter the imaging device. The pulse 902 goes from low (non-irradiation) to high (irradiation). The time T3 is a first reflection start time. The time T3 is also a first reflected light detection start time. Detection of reflected light can be started at the time T3. Further, the signal line 12A is kept high.

From the time T3 to the time T4 (during a first reflected light detection period), the potential of the node 14B changes depending on the intensity of the first reflected light. The potential of the node 14B starts to decrease from high because of the off-state current of the second photodiode 802B. The off-state current is proportional to irradiation time and the intensity of reflected light entering the second photodiode 802B.

Similarly, the potential of the node 14A starts to decrease from high.

Here, a relation between a change in potential of the node 14, irradiation time, and the intensity of reflected light entering the photodiode 802 is described. If the detection period is fixed, as the intensity of the reflected light increases, the amount of change in potential of the node 14 increases. If the light intensity is fixed, as the length of the reflected light detection period increases, the amount of change in potential of the node 14 increases. Thus, as the intensity of the reflected light increases and the length of the reflected light detection period increases, the off-state current of the photodiode 802 increases and the amount of change in potential of the node 14 increases.

At the time T4, the first light irradiation in which the object is irradiated with light from the light source ends. The pulse 901 goes from high (irradiation) to low (non-irradiation). The time T4 is a first irradiation end time. The signal line 12B goes low. At this time, the first imaging ends. Note that a first imaging end time coincides with the first irradiation end time. The time T4 is also a first reflected light detection end time. On the other hand, the signal line 12A is kept high.

In this manner, the potentials of the signal line 11B and the signal line 12B are controlled so that the first imaging starts when the first irradiation starts and the first imaging ends when the first irradiation ends.

Note that the potential of the node 14B becomes constant after the time T4. The potential V1 of the node 14B at the time T4 depends on photocurrent generated by the photodiode 802 during the first reflected light detection. This means that the potential of the node 14B is determined by the intensity of reflected light and the like. On the other hand, the potential of the node 14A keeps decreasing.

A first detection signal is determined by the potential V1 of the node 14B at the time T4. As the length of the first reflected light detection period increases, the amount of change in potential of the node 14B increases; thus, the potential V1 of the node 14B at the time T4 decreases.

All the light entering the second photodiode 802B from the time T1 to the time T4 corresponds to reflected light obtained through the first reflection, i.e., light reflected off an object irradiated with light from the light source. The reflected light is infrared light.

Note that all the light entering the first photodiode 802A from the time T1 to the time T16 corresponds to reflected light, i.e., light reflected off an object irradiated with light from a light source or natural light, or both. The reflected light is visible light.

At the time T5, entry of the reflected light that is obtained through the first reflection and is reflected off the object to the imaging device ends. The pulse 902 goes from high (irradiation) to low (non-irradiation). The time T5 is a first reflection end time. On the other hand, the signal line 12A is kept high.

When the signal line 12B goes low, parasitic capacitance between the signal line 12B and the node 14B causes a change in potential of the node 14B. A significant change in potential inhibits accurate acquisition of photocurrent generated by the second photodiode 802B through the first and second imaging. Thus, effective methods of reducing the influence of parasitic capacitance are, for example, to reduce gate-source capacitance of the third transistor 803B or gate-drain capacitance of the third transistor 803B and to connect a storage capacitor to the node 14B. The second photosensor 800B according to one embodiment of the present invention employs these methods, so that a change in potential of the node 14B due to parasitic capacitance can be negligible.

Note that the same method is employed in the case of the first photosensor 800A according to one embodiment of the present invention.

At the time T6, the signal line 13B goes high (first reading starts). At this time, the third transistor 805B is turned on. Further, the signal line 15 and the signal line 16B are brought into conduction through the first transistor 804B and the second transistor 805B. Then, the potential of the signal line 16B decreases. Note that the signal line 16B is precharged high before the time T6.

There is no limitation on the structure of a read circuit with which the signal line 16 is precharged. The read circuit can include one p-channel transistor 406 as in the read circuit 401 illustrated in FIG. 13.

At the time T7, the signal line 13B goes low (the first reading ends). Then, the second transistor 805B is turned off, and the potential of the signal line 16B becomes constant. The potential $V_{S1}$ of the signal line 16B at the time T7 depends on the speed at which the potential of the signal line 16B changes from the time T6 to the time T7.

The speed at which the potential of the signal line 16 changes depends on the source-drain current of the first transistor 804, i.e., irradiation time and the intensity of reflected light (infrared light) entering the second photodiode 802B from the time T3 to the time T4 in the first imaging. The speed at which the potential of the signal line 16 changes depends on irradiation time and the intensity of reflected light (infrared light) entering the second photodiode 802B from the time T11 to the time T12 in the second imaging. The speed at which the potential of the signal line 16 changes depends on irradiation time and the intensity of reflected light (visible light) entering the first photodiode 802A from the time T3 to the time T16 in the third imaging.

If the irradiation time is fixed, as the reflected light intensity increases, the speed at which the potential of the signal line 16B changes decreases. If the light intensity is fixed, as the length of the reflected light detection period increases, the speed at which the potential of the signal line 16B changes decreases. As the speed at which the potential of the signal line 16B changes decreases, the potentials $V_{S1}$ and $V_{S2}$ of the signal line 16B increase.

If the irradiation time is fixed, as the reflected light intensity increases, the speed at which the potential of the signal line 16A changes decreases. If the light intensity is fixed, as the length of the reflected light detection period increases, the speed at which the potential of the signal line 16A changes decreases. As the speed at which the potential of the signal line 16A changes decreases, the potential $V_{S1}$ of the signal line 16A increases.

The relation between the potential of the node 14 and the potential of the signal line 16 is described. When the intensity of light entering the photodiode 802 is high, the amount of change in potential of the node 14 during a certain period is large; thus, the potential of the node 14 is a low potential. At this time, the channel resistance of the first transistor 804 increases, so that the speed at which the potential of the signal line 16 changes decreases. Consequently, the amount of change in potential of the signal line 16 during a certain period is small, so that the potential of the signal line 16 is a high potential.

By acquiring the potential $V_{S1}$ of the signal line 16B at the time T7 by the first reflected light detection, the amount of reflected light entering the second photodiode 802B during a first imaging period (the product of time and the intensity of incident light) is detected; thus, the detection signal S1 can be obtained. Assuming that the light intensity in the first irradiation is fixed and only the reflected light obtained through the first reflection enters the photodiode, the potential $V_{S1}$ of the signal line 16B is substantially proportional to the length of the first reflected light detection period.

At the time T8, second light irradiation in which the object is irradiated with light from the light source starts. The pulse 901 goes from low (non-irradiation) to high (irradiation). The time T8 is a second irradiation start time. Further, the signal line 12A is kept high.

At the time T9, second irradiation light emitted from the light source is reflected off the object, and second reflected light starts to enter the imaging device. The pulse 902 goes from low (non-irradiation) to high (irradiation). The time T9 is a second reflection start time.

At the time T10, the signal line 11B goes high, and the signal line 12B goes high (second reset in the 3D imaging). At this time, the second photodiode 802B and the third transistor 803B are brought into conduction, and the node 14B goes high.

At the time T11, the second light irradiation in which the object is irradiated with light from the light source ends. The pulse 901 goes from high (irradiation) to low (non-irradiation). The time T11 is a second irradiation end time. The signal line 11B goes low, and the signal line 12B is kept high (the second imaging starts). Note that a second imaging start time coincides with the second irradiation end time. The time T11 is also a second reflected light detection start time. Detection of reflected light can be started at the time T11. Further, the signal line 12A is kept high.

From the time T11 to the time T12 (during a second reflected light detection period), the potential of the node 14B changes depending on the intensity of the second reflected light. The potential of the node 14B starts to decrease from high because of the off-state current of the second photodiode 802B. The off-state current is proportional to irradiation time and the intensity of reflected light entering the second photodiode 802B. Thus, the potential of the node 14B changes depending on the intensity of the reflected light and the length of the reflected light detection period.

Note that in this embodiment, for example, the second reflected light detection period (from the time T11 to the time T12) is shorter than the first reflected light detection period (from the time T3 to the time T4). Thus, the amount of change in potential of the node 14 during the second imaging is smaller than the amount of change in potential of the node 14 during the first imaging.

At the time T12, entry of the reflected light that is obtained through the second reflection and is reflected off the object to the imaging device ends. The pulse 902 goes from high (irradiation) to low (non-irradiation). The time T12 is a second reflection end time. The time T12 is also a second reflected light detection end time. On the other hand, the signal line 12A is kept high.

Note that the potential of the node 14B becomes constant after the time T12. The potential V2 of the node 14B at the time T12 depends on photocurrent generated by the second photodiode 802B during the second reflected light detection. This means that the potential of the node 14B is determined by the intensity of reflected light and the like. On the other hand, the potential of the node 14A keeps decreasing.

The second detection signal is determined by the potential V2 of the node 14 at the time T12. As the length of the second reflected light detection period decreases, the amount of change in potential of the node 14 decreases; thus, the potential V2 of the node 14 at the time T12 increases.

At the time T13, the signal line 12B goes low. At this time, the second imaging ends.

In this manner, the potentials of the signal line 11B and the signal line 12B are controlled so that the second imaging starts when the second irradiation ends and the second imaging ends after imaging for the same length of time as the first imaging.

Note that all the light entering the second photodiode 802B from the time T10 to the time T13 corresponds to reflected light obtained through the second reflection, i.e., light reflected off an object irradiated with light from the light source. The reflected light is infrared light.

At the time T14, the signal line 13B goes high (second reading starts). At this time, the second transistor 805B is turned on. Further, the signal line 15 and the signal line 16B are brought into conduction through the first transistor 804B and the second transistor 805B. Then, the potential of the signal line 16B decreases. Note that the signal line 16B is precharged high before the time T14.

At the time T15, the signal line 13B goes low (the second reading ends). Then, the second transistor 805B is turned off, and the potential of the signal line 16B becomes constant. The potential $V_{S2}$ of the signal line 16B at the time T15 depends on the speed at which the potential of the signal line 16B changes from the time T14 to the time T15.

For this reason, by acquiring the potential $V_{S2}$ of the signal line 16B at the time T15 by the second reflected light detection, the amount of reflected light entering the second photodiode 802B during a second imaging period (the product of time and the intensity of incident light) is detected; thus, the detection signal S2 can be obtained. Assuming that the light intensity in the second irradiation is fixed and only the reflected light obtained through the second reflection enters the photodiode, the potential $V_{S2}$ of the signal line 16B is substantially proportional to the length of the second reflected light detection period.

Note that in this embodiment, the second reflected light detection period (from the time T11 to the time T12) is shorter than the first reflected light detection period (from the time T3 to the time T4), so that the potential $V_{S2}$ of the signal line 16B at the time T15 is lower than the potential $V_{S1}$ of the signal line 16B at the time T7.

At the time T15, the detection signal S1 and the detection signal S2 can be obtained by the first imaging and the second imaging, respectively so that 3D TOF imaging can be performed.

At the time T16, the signal line 12A goes low. At this time, the third imaging ends.

At the time T17, the signal line 13A goes high (third reading starts). At this time, the second transistor 805A is turned on. Further, the signal line 15 and the signal line 16A are brought into conduction through the first transistor 804A and the second transistor 805A. Then, the potential of the signal line 16A decreases. Note that the signal line 16A is precharged high before the time T17.

At the time T18, the signal line 13A goes low (the third reading ends). Then, the second transistor 805A is turned off, and the potential of the signal line 16A becomes constant. The potential $V_{S3}$ of the signal line 16A at the time T18 depends on the speed at which the potential of the signal line 16A changes from the time T3 to the time T16.

By acquiring the potential $V_{S3}$ of the signal line 16A at the time T18 by detection of reflected light (visible light) entering the first photodiode 802A (third reflected light detection), the amount of reflected light entering the first photodiode 802A during a third imaging period (the product of time and the intensity of incident light) is detected; thus, the detection signal S3 can be obtained. Assuming that the intensity of light from the light source or natural light, or both is fixed, the potential $V_{S3}$ of the signal line 16A is substantially proportional to the length of a third reflected light detection period.

At the time T18, the detection signal S3 can be obtained by the third imaging, so that 3D TOF imaging can be performed while 2D imaging is performed.

FIG. 12 is a timing chart of the pulse 901, the pulse 902, the pulse of the signal line 12A, and the pulse of the signal line 12B in the photosensor 800. The features of the driving method are described with reference to FIG. 12. Control is performed so that the potential of a gate electrode of the third transistor 803B is set to high during the first reflected light detection period within the first imaging period, the potential of the gate electrode of the third transistor 803B is set to high during the second reflected light detection period within the second imaging period, and the potential of a gate electrode of the third transistor 803A is set to high during a period including the first imaging period and the second imaging period. Thus, 3D imaging can be performed while 2D imaging is performed.

Comparison among the pulses in FIG. 12 is described dividing the time into the following periods: irradiation periods, reflection periods, imaging periods, and reflected light detection periods.

As shown in the pulse 901, the time T2 is the first irradiation start time, the time T4 is the first irradiation end time, and a period from the time T2 to the time T4 is the first irradiation period. The time T8 is the second irradiation start time, the time T11 is the second irradiation end time, and a period from the time T8 to the time T11 is the second irradiation period. In one embodiment of the disclosed invention, the first irradiation period and the second irradiation period need to have the same length of time.

As shown in the pulse 902, the time T3 is the first reflection start time, the time T5 is the first reflection end time, and a period from the time T3 to the time T5 is the first reflection period. The time T9 is the second reflection start time, the time T12 is the second reflection end time, and a period from the time T9 to the time T12 is the second reflection period. The reflection period and the irradiation period have the same length of time.

In other words, the first irradiation period and the second irradiation period have the same length of time, and the first reflection period and the second reflection period have the same length of time.

As shown in the pulse of the signal line 12B(TX_3), the time T2 is the first imaging start time, the time T4 is the first imaging end time, and a period from the time T2 to the time T4 is the first imaging period. Further, the time T3 is the first reflected light detection start time, the time T4 is the first reflected light detection end time, and a period from the time T3 to the time T4 is the first reflected light detection period.

The first imaging should be started at least before the first reflection period. Further, the first imaging should be ended when the first irradiation period ends. The potentials of the signal line 11B and the signal line 12B are controlled so that the timing of the imaging period is determined as described above.

As shown in the pulse of the signal line 12A(TX_2), the time T11 is the second imaging start time, the time T3 is a second imaging end time, and a period from the time T11 to the time T13 is the second imaging period. Further, the time T11 is the second reflected light detection start time, the time T12 is the second reflected light detection end time, and a period from the time T11 to the time T12 is the second reflected light detection period.

The second imaging should be started when the second irradiation period ends. Further, the second imaging should be ended at least after the second reflection period. The potentials of the signal line 11B and the signal line 12B are controlled so that the timing of the imaging period is determined as described above.

In other words, the timing of the first imaging period is determined in accordance with the timing of the first reflection period and the timing of the second imaging period is determined in accordance with the timing of the second reflection period; thus, the reflected light detection is divided into two periods.

As shown in the pulse of the signal line 12A(TX_2), the time T2 is a third imaging start time, the time T16 is a third imaging end time, and a period from the time T2 to the time T16 is the third imaging period. Further, the time T3 is a third reflected light detection start time, the time T16 is a third reflected light detection end time, and a period from the time T3 to the time T16 is the third reflected light detection period.

The third imaging should be started when the first imaging period starts or at least before the first imaging period. Further, the third imaging should be ended when the second imaging period ends or at least after the second imaging period. The potentials of the signal line 11A and the signal line 12A are controlled so that the timing of the imaging period is determined as described above.

In other words, the third imaging period is determined so that it includes the first imaging period and the second imaging period; thus, 3D imaging can be performed while 2D imaging is performed.

Note that in one embodiment of the disclosed invention, the first reflected light detection period corresponds to a period in which the first irradiation period overlaps with the first reflection period. The first reflected light detection period is the first net imaging period. The second reflected light detection period corresponds to a period in the second reflection period that starts after the second irradiation period. The second reflected light detection period is the second net imaging period. The first detection signal that is dependent on a light delay time is acquired through the first reflected light detection. The second detection signal that is dependent on a light delay time is acquired through the second reflected light detection. Thus, the distance from the imaging device to the object can be measured (3D imaging).

The third reflected light detection period includes the first imaging period and the second imaging period. By acquiring the third detection signal through the third reflected light detection, the brightness or color of the object can be obtained, for example (2D imaging).

Next, a distance measuring method by 3D TOF imaging is described. A method for measuring the distance from the imaging device to the object is described with reference to formulas by using the first detection signal S1 that is acquired through the first reflected light detection and is dependent on the light delay time, and the second detection signal S2 that is acquired through the second reflected light detection and is dependent on the light delay time.

Here, assuming that the light intensity during the first irradiation and the second irradiation is fixed and the second photodiode 802B is irradiated with only the first reflected light during the first imaging period and the second reflected light during the second imaging period, the potential $V_{S1}$ of the signal line 16B is substantially proportional to the length of the first reflected light detection period, and the potential $V_{S2}$ of the signal line 16B is substantially proportional to the length of the second reflected light detection period.

In other words, the first detection signal S1 obtained through the first imaging is substantially dependent on the first reflected light detection period, and the second detection signal S2 obtained through the second imaging is substantially dependent on the second reflected light detection period.

The first detection signal S1 and the second detection signal S2 can be expressed by Formulas (2) and (3), respectively, where α represents a proportional constant, T represents an irradiation period, and Δt represents a delay time.

$$S1 = \alpha \times (T - \Delta t) \quad (2)$$

$$S2 = \alpha \times (\Delta t) \quad (3)$$

Erasure of the proportional constant α using Formulas (2) and (3) gives the delay time Δt, as expressed by Formula (4).

$$\Delta t = \frac{(T \times S2)}{(S1 + S2)} \quad (4)$$

The distance x from the imaging device to the object can be expressed by Formula (1) by using the formula (x=(c×Δt)/2) expressing the distance x from the light source to the object and Formula (4).

$$x = \frac{c \times T \times S2}{2 \times (S1 + S2)} \quad (1)$$

This shows that the distance x from the imaging device to the object can be obtained if the first detection signal S1 and the second detection signal S2 are obtained.

Fourth imaging may be performed with the second photosensor 800B in a period during which the light source does not emit light. In that case, a fourth detection signal S4 is obtained through the fourth imaging. When a value obtained by subtracting the fourth detection signal S4 from the first detection signal S1 and a value obtained by subtracting the fourth detection signal S4 from the second detection signal S2 are applied to the detection signal S1 and the detection signal S2 in Formula (1), respectively, the influence of natural light can be eliminated.

This shows that the photosensor can include fewer elements, and an imaging device including the photosensor that operates with an improved driving method can perform 3D TOF imaging while performing 2D imaging and can function as an imaging device acquiring 2D information and 3D information concurrently. Thus, a problem of an increased number of elements for the photosensor that occurs with the TOF method can be solved and an imaging device that is advantageous in reducing pixel size can be achieved.

Note that this embodiment can be combined with any of the other embodiments in this specification as appropriate.

(Embodiment 5)

In this embodiment, an example in which a motion recognition device including a TOF imaging device is applied to a cellular phone is described with reference to FIGS. 14A to 14D.

FIGS. 14A to 14D schematically illustrate a cellular phone 5000 including an imaging device in a display portion. By using the imaging device in the display portion, the area of the display portion in the cellular phone 5000 is increased, so that more accurate 3D range images and color images can be acquired. Note that the imaging device can be used in a place other than the display portion of the cellular phone, and the imaging devices can be used in the display portion of the cellular phone and a place other than the display portion. In each case, according to one embodiment of the disclosed invention, 3D range images and color images can be acquired by irradiation of an object with light.

In FIGS. 14A to 14D, the display portion of the cellular phone 5000 has a function of acquiring 3D range images and color images of an object in addition to a function of displaying display information. Thus, it is not necessary to provide a camera outside the cellular phone 5000, so that the cellular phone 5000 can have a simple structure.

Figure 14A:
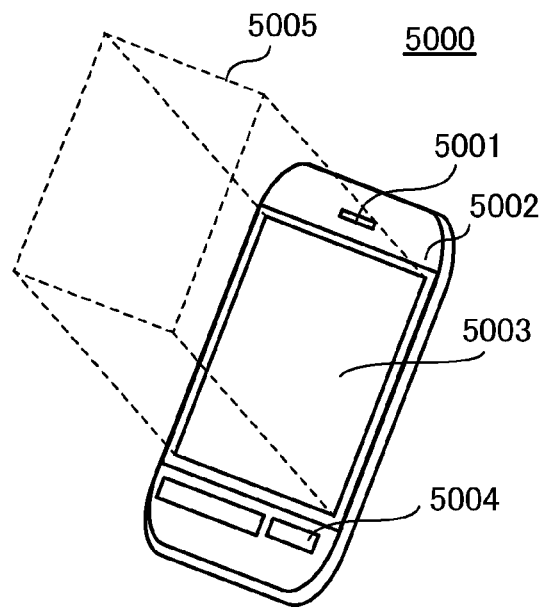
FIGS. 14A to 14D illustrate an example of a motion recognition device.

As illustrated in FIG. 14A, the cellular phone 5000 includes a speaker 5001, a housing 5002, a display portion 5003 incorporated in the housing 5002, operation buttons 5004, and the like.

FIGS. 14A to 14D illustrate the operation of the cellular phone 5000 by operator's gestures (e.g., hand gestures). When the operator uses a gesture in a recognition range 5005 without directly touching the cellular phone 5000, the operator can operate the cellular phone 5000. Note that the recognition range 5005 is directly above the display portion 5003.

Figure 14B:
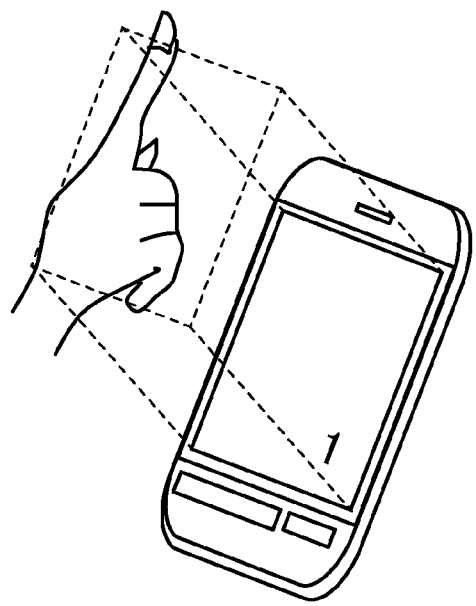

As illustrated in FIG. 14B, in the recognition range 5005 of the display portion 5003, in the case where the operator raises the index finger of the right hand, for example, a calling number "1" is input to the cellular phone.

Figure 14C:
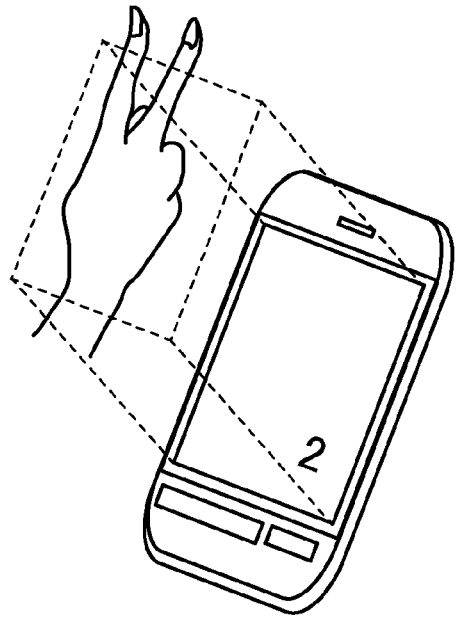

As illustrated in FIG. 14C, in the recognition range 5005 of the display portion 5003, in the case where the operator raises the index finger and the middle finger of the right hand, for example, a calling number "2" is input to the cellular phone.

Figure 14D:
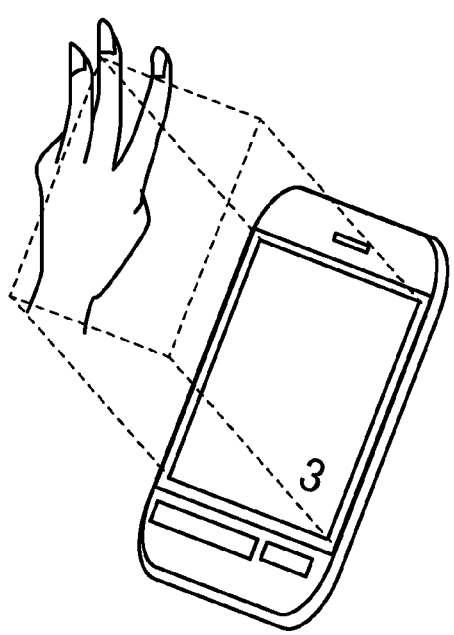

As illustrated in FIG. 14D, in the recognition range 5005 of the display portion 5003, in the case where the operator raises the index finger, the middle finger, and the ring finger of the right hand, for example, a calling number "3" is input to the cellular phone.

The operator can operate the cellular phone without directly touching the operation button 5004 or the display portion 5003 with a finger or the like. In other words, the operator can perform any operation (e.g., making a call or texting) only by using a gesture.

A specific object pattern is stored in a first storage in the cellular phone 5000, and a specific motion pattern is stored in a second storage. Specific examples of the specific object pattern include "raising the index finger of the right hand", "raising the index finger and the middle finger of the right hand", and "raising the index finger, the middle finger, and the ring finger of the right hand". Note that the specific object pattern stored in the first storage and the specific motion pattern stored in the second storage may be determined by the operator optionally. For example, by storing an operator's routinely used gesture (e.g., waving both hands in all direction or waving both hands right and left) as the specific motion pattern, the operator can operate the cellular phone 5000 very intuitively.

An information processor included in the cellular phone 5000 performs processing on the basis of the specific motion pattern so that the cellular phone operates correctly.

Note that the display portion 5003 may have a light-transmitting property.

The cellular phone 5000 can operate regardless of the operator's hand condition. Even when the hand of an operator who uses hand gestures is dirty or an operator who uses hand gestures wears a glove, the operator can operate the cellular phone 5000 without problems. When the operator uses a hand gesture in the recognition range 5005, the operator can operate the cellular phone 5000 without contact easily. Further, in a strict sense, the operator does not need to use the hand. Even when the operator uses a stick instead of the hand, the cellular phone 5000 can recognize a gesture without problems.

Note that the cellular phone 5000 can recognize color image information. Thus, operation can be changed depending on the color of a hand glove, for example.

Even when the operator's hand moves fast, the cellular phone 5000 can take a 3D range image without distortion and can acquire information on a change in position or shape easily.

Even when the operator have some problems, the operator can operate the cellular phone 5000 correctly. For example, the operator can operate the cellular phone 5000 with a prosthetic finger, a prosthetic limb (e.g., a prosthetic hand or a prosthetic leg), or the like.

When the operator is incapable of recognizing display information or the like displayed on the display portion 5003, for example, the operator cannot recognize a letter displayed or cannot see display information itself (i.e., the operator is a visually challenged person or the like), the operator can operate the cellular phone as intended in accordance with a gesture.

Thus, it is possible to provide a cellular phone that does not place a burden on an operator's body and does not restrict operator's motion. Further, it is possible to provide a cellular phone that can be easily operated by an operator without directly touching the cellular phone.

Note that this embodiment can be combined with any of the other embodiments in this specification as appropriate.

(Embodiment 6)

In this embodiment, an example in which a motion recognition device including a TOF imaging device is applied to an IH cooking heater is described with reference to FIGS. 15A and 15B, and an example in which a motion recognition device including a TOF imaging device is applied to a microwave oven is described with reference to FIGS. 16A and 16B.

Figure 15A:
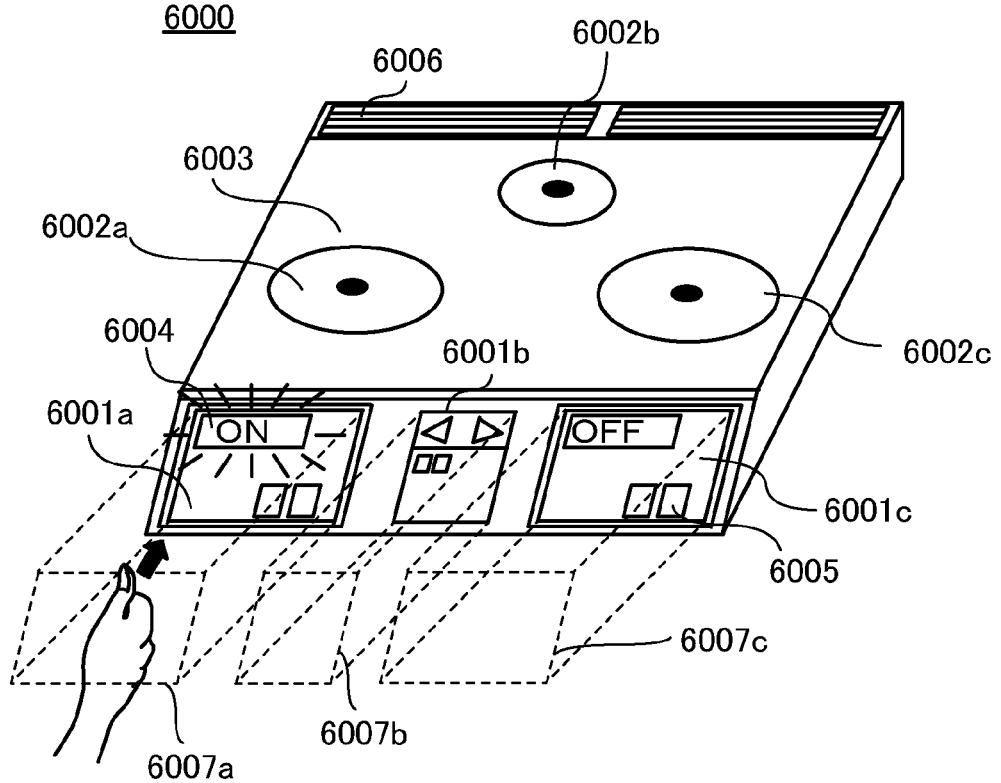
FIGS. 15A and 15B illustrate an example of a motion recognition device.
Figure 15B:
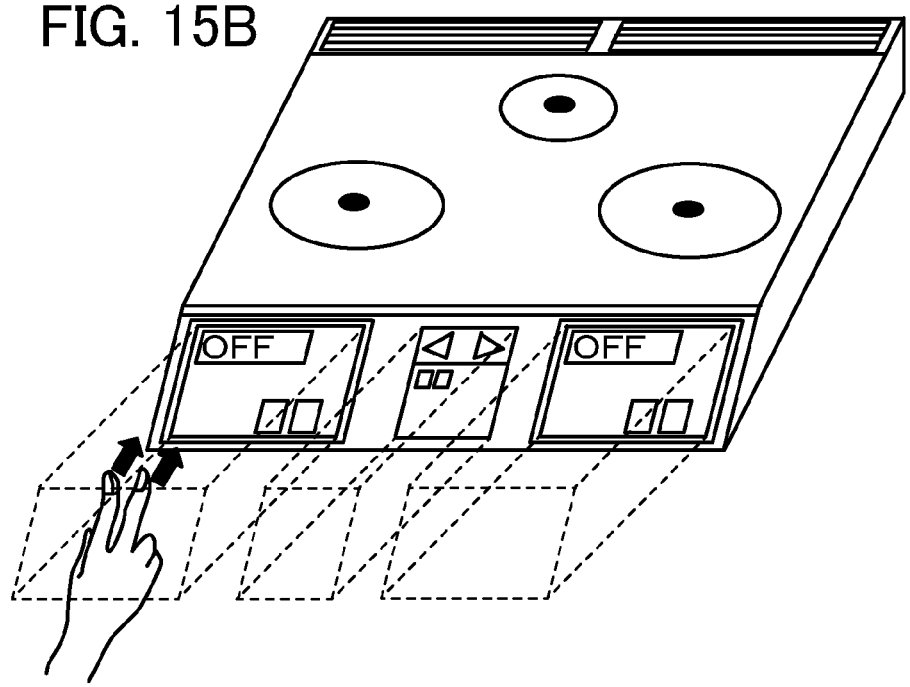

FIGS. 15A and 15B schematically illustrate an IH cooking heater 6000 including imaging devices in display portions. The imaging device can be used in a place other than the display portion of the IH cooking heater, and the imaging devices can be used in the display portion of the IH cooking heater and a place other than the display portion. In each case, according to one embodiment of the disclosed invention, 3D range images can be acquired by irradiation of an object with light (which may be infrared light).

In FIGS. 15A and 15B, the display portion of the IH cooking heater 6000 has, for example, a function of acquiring 3D range images and color information of an object in addition to a function of displaying display information. Thus, it is not necessary to provide a camera outside the IH cooking heater 6000, so that the IH cooking heater 6000 can have a simple structure.

As illustrated in FIGS. 15A and 15B, the IH cooking heater 6000 includes display portions 6001*a*, 6001*b*, and 6001*c*; three IH heaters 6002*a*, 6002*b*, and 6002*c*; a plate 6003; power lamps 6004; operation buttons 6005; exhaust ports 6006; and the like.

FIGS. 15A and 15B illustrate the operation of the IH cooking heater 6000 by operator's gestures (e.g., hand gestures). When the operator uses a gesture in a recognition range 6007*a*, 6007*b*, or 6007*c* without directly touching the IH cooking heater 6000, the operator can operate the IH cooking heater 6000.

Note that the recognition range 6007*a* is directly above the display portion 6001*a*, the recognition range 6007*b* is directly above the display portion 6001*b*, and the recognition range 6007*c* is directly above the display portion 6001*c*.

As illustrated in FIG. 15A, in the case where the operator raises the thumb of the right hand and pushes the thumb of the right hand forward in the recognition range 6007*a* of the display portion 6001*a*, for example, the IH heater 6002*a* of the IH cooking heater 6000 is powered on, and the power lamp 6004 displays "ON".

As illustrated in FIG. 15B, in the case where the operator raises the index finger and the middle finger of the right hand and pushes the index finger and the middle finger of the right hand forward in the recognition range 6007*a* of the display portion 6001*a*, for example, the IH heater 6002*a* of the IH cooking heater 6000 is powered off, and the power lamp 6004 displays "OFF".

The operator can operate the IH cooking heater without directly touching the operation button 6005 or the display portion 6001 with a finger or the like. In other words, the operator can perform any operation (e.g., powering on or off the IH heater, controlling the thermal power of the IH heater, or setting a timer for automatically powering off the IH heater) only by using a gesture.

A specific object pattern is stored in a first storage in the IH cooking heater 6000, and a specific motion pattern is stored in a second storage. Specific examples of the specific object pattern include "raising the thumb of the right hand" and "raising the index finger and the middle finger of the right hand". Note that as the specific object pattern, color image information may be included. In the case where the color image information is included, for example, information on the color of the finger (e.g., a flesh color) or the color of a nail (e.g., a transparent color) in addition to information on the shape pattern of the finger of the right hand is added. Specific examples of the specific motion pattern include "pushing the raised thumb of the right hand forward" and "pushing the raised index finger and middle finger of the right hand forward".

Note that the specific object pattern stored in the first storage and the specific motion pattern stored in the second storage may be determined by the operator optionally. For example, when the operator sets operation corresponding to a variety of patterns in advance, for example, the IH cooking heater 6000 is powered on in the case where the operator makes a circle clockwise with the middle finger of the right hand, the IH cooking heater 6000 is powered off in the case where the operator makes a circle counterclockwise with the middle finger of the right hand, a food is automatically burnt on both sides in a grill of the IH cooking heater 6000 in the case where the operator pushes both hands forward and then closes the hands, or the thermal power of the IH cooking heater 6000 increases step by step in the case where the operator makes a first with one hand and moves the hand from left to right, it is possible to achieve an application in which an interface or a media with a general-purpose control function is controlled and operated with a gesture.

Even when the operator's hand moves fast, the IH cooking heater 6000 can take a 3D range image without distortion and can acquire information on a change in position or shape easily.

Note that the kind of a gesture is not limited to a gesture performed by an operator (a human). A gesture that represents a wide variety of objects, such as a shape or sign of an object, a letter, or some kind of an object set by an operator in advance, may be used.

An information processor included in the IH cooking heater 6000 performs processing on the basis of the specific motion pattern so that the IH cooking heater operates correctly.

Figure 16A:
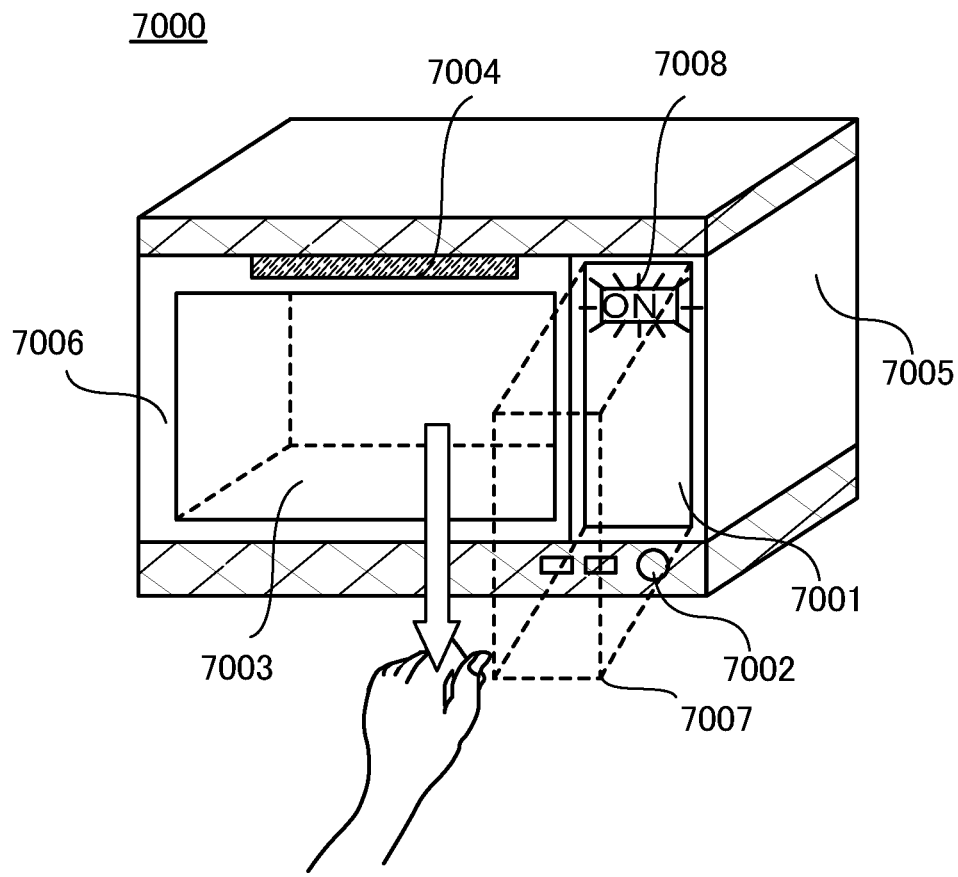
FIGS. 16A and 16B illustrate an example of a motion recognition device.
Figure 16B:
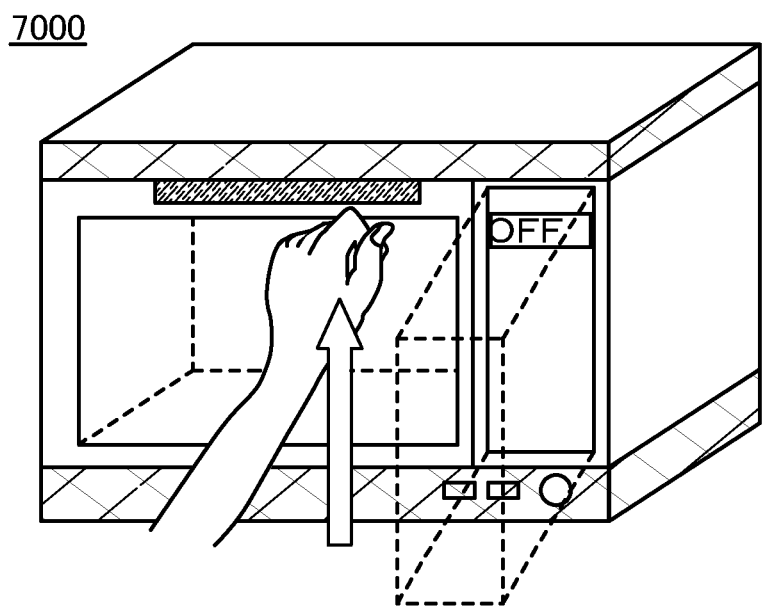

FIGS. 16A and 16B schematically illustrate a microwave oven 7000 including an imaging device in a display portion. The imaging device can be used in a place other than the display portion of the microwave oven, and the imaging devices can be used in the display portion of the microwave oven and a place other than the display portion. In each case, according to one embodiment of the disclosed invention, 3D range images can be acquired by irradiation of an object with light.

In FIGS. 16A and 16B, the display portion of the microwave oven 7000 has a function of acquiring 3D range images and color information of an object in addition to a function of displaying display information. Thus, it is not necessary to provide a camera outside the microwave oven 7000, so that the microwave oven 7000 can have a simple structure.

As illustrated in FIGS. 16A and 16B, the microwave oven 7000 includes a display portion 7001, an operation button 7002, a transparent observation window 7003, a door handle 7004, a housing 7005, a door 7006, a power lamp 7008, and the like.

FIGS. 16A and 16B illustrate the operation of the microwave oven 7000 by operator's gestures (e.g., hand gestures). When the operator uses a gesture in a recognition range 7007 without directly touching the microwave oven 7000, the operator can operate the microwave oven 7000. Note that the recognition range 7007 is directly above the display portion 7001.

As illustrated in FIG. 16A, in the case where the operator makes a first with the left hand and moves the left hand from the top to the bottom in the recognition range 7007 of the display portion 7001, for example, the microwave oven 7000 is powered on, and the power lamp 7008 displays "ON".

Even when the operator's hand moves fast, for example, the microwave oven 7000 can take a 3D range image without distortion and can acquire information on a change in position or shape easily.

As illustrated in FIG. 16B, in the case where the operator makes a first with the left hand and moves the left hand from the bottom to the top in the recognition range 7007 of the display portion 7001, for example, the microwave oven 7000 is powered off, and the power lamp 7008 displays "OFF".

The operator can operate the microwave oven without directly touching the operation button 7002 or the display portion 7001 with a finger or the like. In other words, the operator can perform any operation (e.g., powering on or off the microwave oven, making the microwave oven perform an oven function, or making the microwave oven perform a steam function) only by using a gesture.

Thus, it is possible to provide an electronic device (e.g., an IH cooking heater or a microwave oven) that is regardless of operator's condition, does not place a burden on an operator's body, and does not restrict operator's motion. Further, an operator can operate the electronic device easily without directly touching the electronic device.

Note that this embodiment can be combined with any of the other embodiments in this specification as appropriate.
(Embodiment 7)

In this embodiment, the structure of the photosensor 400 in Embodiment 2 is described in detail. An example of the structure of an imaging device including the photosensors 400 arranged in a matrix of m rows and n columns is described with reference to FIG. 17A. A structure example that is different from the structure example in FIG. 17A is described with reference to FIG. 17B.

Figure 17A:
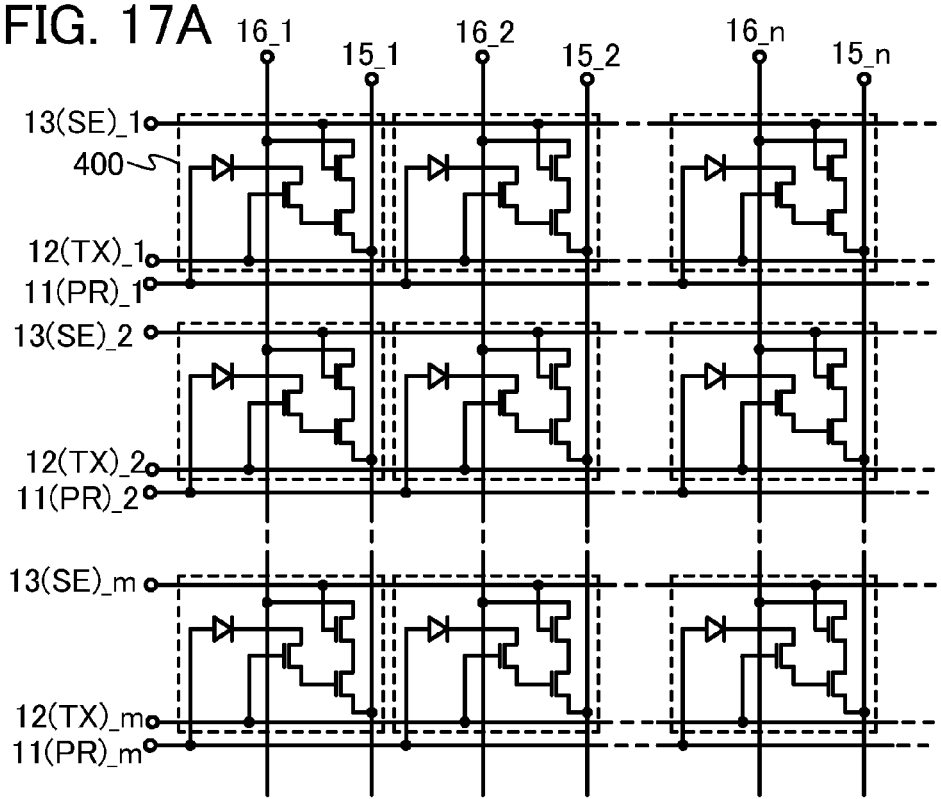
FIGS. 17A and 17B are circuit diagrams of a plurality of photosensors arranged in matrix.

In FIG. 17A, the plurality of photosensors 400 are arranged in a matrix of m rows (m is a natural number of 2 or more) and n columns (n is a natural number of 2 or more). The photosensors 400 in each row are electrically connected to any one of a plurality of signal lines 11(PR) (11(PR)_1 to 11(PR)_m), any one of a plurality of signal lines 12(TX) (12(TX)_1 to 12(TX)_m), and any one of a plurality of signal lines 13(SE) (13(SE)_1 to 13(SE)_m). The photosensors 400 in each column are electrically connected to any one of a plurality of photosensor output signal lines 16_1 to 16_n and any one of a plurality of photosensor reference signal lines 15_1 to 15_n.

In FIG. 17A, the photosensors in each row share the signal line 12(TX), the signal line 11(PR), and the signal line 13(SE). The photosensors in each column share the photosensor output signal line and the photosensor reference signal line. However, the present invention is not limited thereto. The plurality of signal lines 12(TX) may be provided in each row and electrically connected to the different photosensors 400. The plurality of signal lines 11(PR) may be provided in each row and electrically connected to the different photosensors 400. The plurality of signal lines 13(SE) may be provided in each row and electrically connected to the different photosensors 400. The plurality of photosensor output signal lines may be provided in each column and electrically connected to the different photosensors 400. The plurality of photosensor reference signal lines may be provided in each column and electrically connected to the different photosensors 400.

In FIG. 17A, the photosensors in each column share a photosensor reference signal line; however, the present invention is not limited thereto. A photosensor reference signal line may be shared by the photosensors in each row.

The signal line 12(TX) can be shared by the photosensors 400 that concurrently perform reset operation and accumulation operation among the photosensors 400 arranged in the matrix of m rows and n columns. The signal line 11(PR) can be shared by the photosensors that concurrently perform the reset operation and the accumulation operation among the photosensors 400 arranged in the matrix of m rows and n columns.

As described above, wirings are shared between photosensors to reduce the number of wirings, so that a driver circuit for driving the photosensors 400 arranged in the matrix of m rows and n columns can be simplified.

Next, a structure example of an imaging device including the photosensors 400 arranged in a matrix of m rows and n columns that is different from the structure example in FIG. 17A is described with reference to FIG. 17B.

Figure 17B:
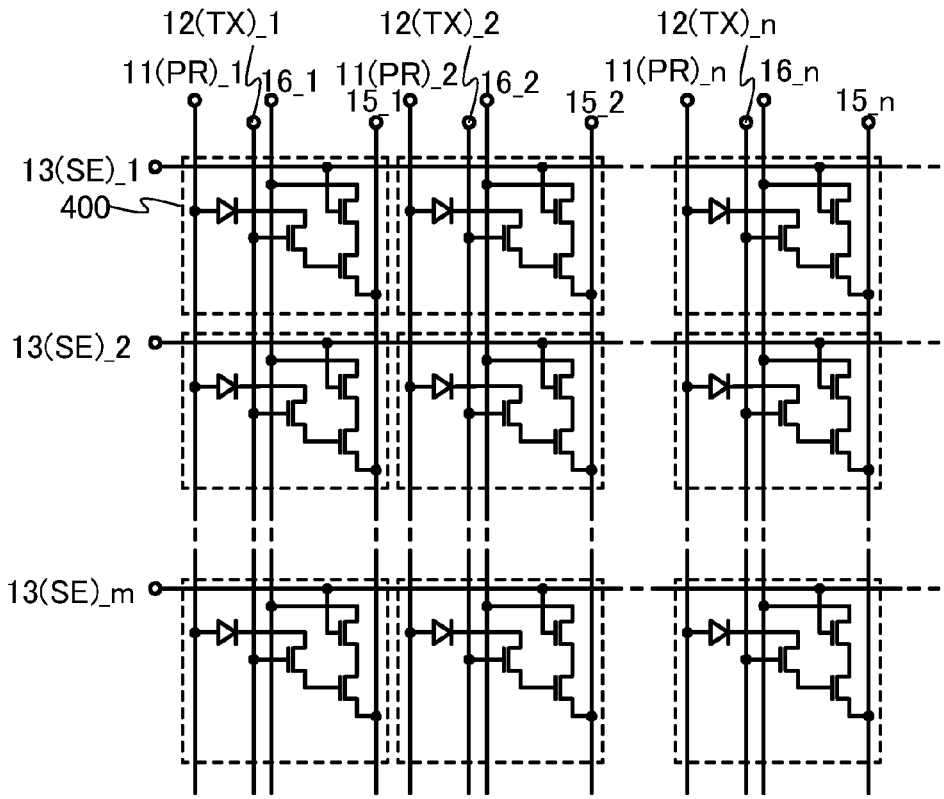

In FIG. 17B, the plurality of photosensors 400 are arranged in a matrix of m rows and n columns. The photosensors 400 in each row are electrically connected to any one of the plurality of signal lines 13(SE) (13(SE)_1 to 13(SE)_m). The photosensors 400 in each column are electrically connected to any one of the plurality of signal lines 11(PR) (11(PR)_1 to 11(PR)_n), any one of the plurality of signal lines 12(TX) (12(TX)_1 to 12(TX)_n), any one of the plurality of photosensor output signal lines 16_1 to 16_n, and any one of the plurality of photosensor reference signal lines 15_1 to 15_n.

In FIG. 17A, the photosensors in each row share the signal line 13(SE), and the photosensors in each column share the signal line 11(PR), the signal line 12(TX), the photosensor output signal line, and the photosensor reference signal line. However, the present invention is not limited thereto.

In FIG. 17B, the photosensors in each column share a photosensor reference signal line; however, the present invention is not limited thereto. A photosensor reference signal line may be shared by the photosensors in each row.

The signal line 12(TX) can be shared by the photosensors that concurrently perform reset operation and accumulation operation among the photosensors 400 arranged in the matrix of m rows and n columns. The signal line 11(PR) can be shared by the photosensors that concurrently perform the reset operation and the accumulation operation among the photosensors 400 arranged in the matrix of m rows and n columns.

As described above, wirings are shared between photosensors to reduce the number of wirings, so that a driver circuit for driving the photosensors 400 arranged in the matrix of m rows and n columns can be simplified.

Figure 18A:
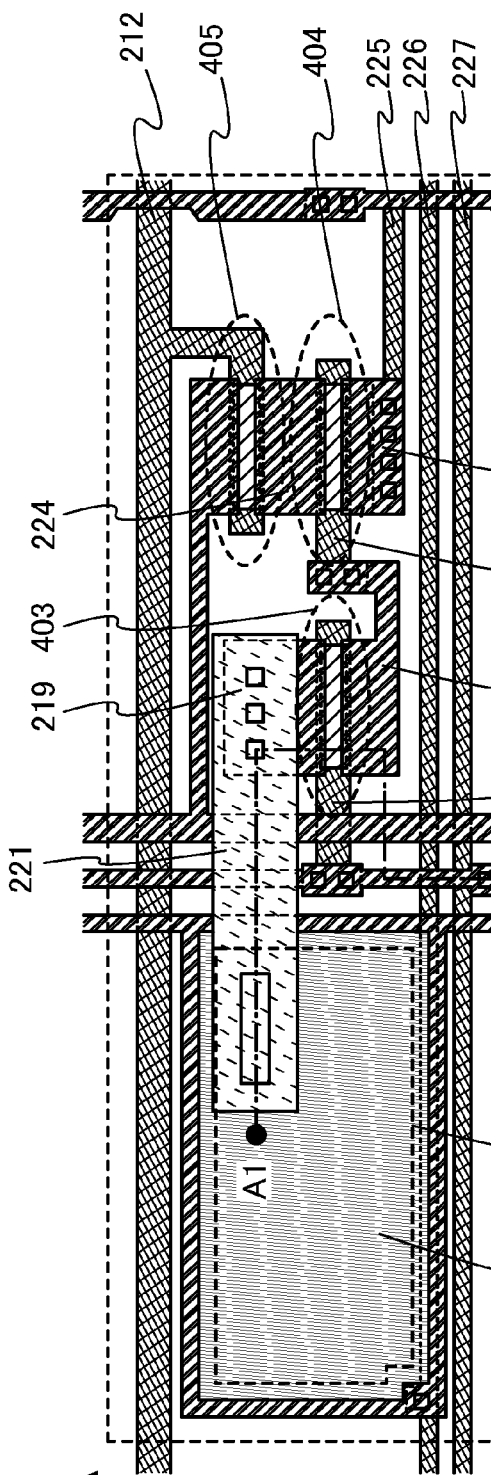
FIGS. 18A and 18B are a top view and a cross-sectional view of a photosensor.
Figure 18B:
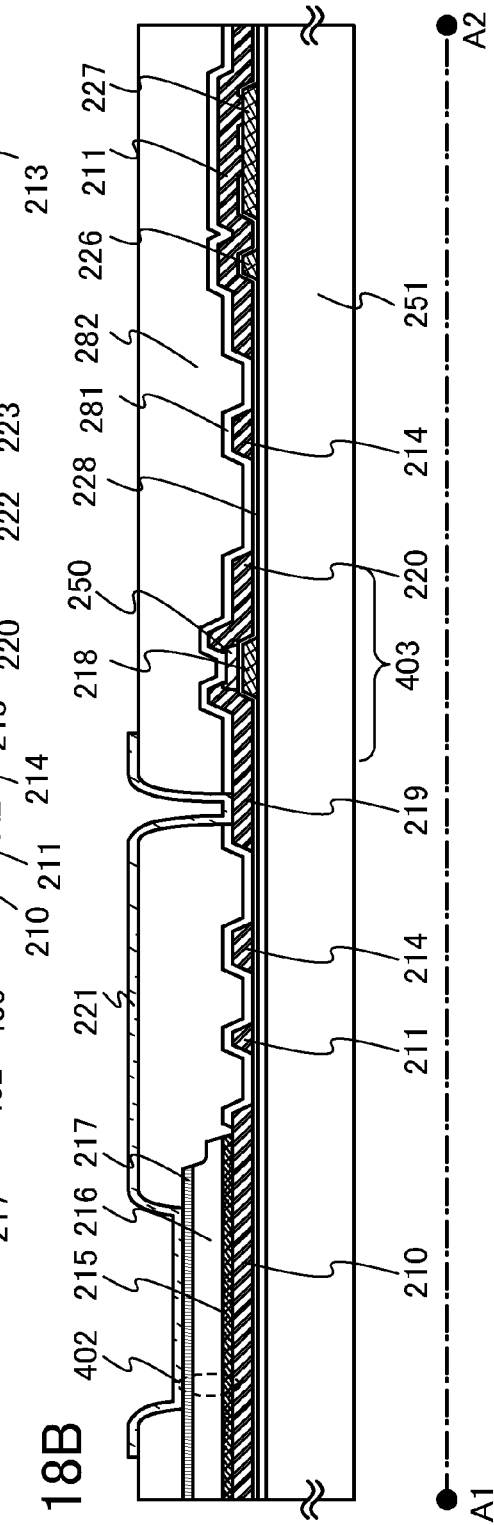

FIG. 18A is a top view of the photosensor 400. FIG. 18B is a cross-sectional view taken along line A1-A2 in FIG. 18A.

The photosensor 400 includes a conductive film 210 functioning as the signal line 11(PR), a conductive film 211 functioning as the signal line 12(TX), a conductive film 212 functioning as the signal line 13(SE), a conductive film 213 functioning as the signal line 15 (the photosensor reference signal line), and a conductive film 214 functioning as the signal line 16 (the photosensor output signal line).

The photodiode 402 in the photosensor 400 includes a p-type semiconductor film 215, an i-type semiconductor film 216, and an n-type semiconductor film 217 which are sequentially stacked. The conductive film 210 is electrically connected to the p-type semiconductor film 215 functioning as the anode of the photodiode 402.

A conductive film 218 of the photosensor 400 functions as the gate electrode of the transistor 403 and is electrically connected to the conductive film 211. A conductive film 219 of the photosensor 400 functions as one of the source electrode and the drain electrode of the transistor 403. A conductive film 220 of the photosensor 400 functions as the other of the source electrode and the drain electrode of the transistor 403. A conductive film 221 of the photosensor 400 is electrically connected to the n-type semiconductor film 217 and the conductive film 219. A conductive film 222 of the photosensor 400 functions as the gate electrode of the transistor 404 and is electrically connected to the conductive film 220.

A conductive film 223 of the photosensor 400 functions as one of the source electrode and the drain electrode of the transistor 404. A conductive film 224 of the photosensor 400 functions as the other of the source electrode and the drain electrode of the transistor 404 and one of the source electrode and the drain electrode of the transistor 405. The conductive film 214 functions as the other of the source electrode and the drain electrode of the transistor 405. The conductive film 212 also functions as the gate electrode of the transistor 405. A conductive film 225 of the photosensor 400 is electrically connected to the conductive film 223 and the conductive film 213.

Note that in FIGS. 18A and 18B, a conductive film 226 of the photosensor 400 is electrically connected to the conductive film 210 functioning as the signal line 11(PR). A conductive film 227 of the photosensor 400 is electrically connected to the conductive film 211 functioning as the signal line 12(TX).

The conductive film 212, the conductive film 218, the conductive film 222, the conductive film 225, the conductive film 226, and the conductive film 227 can be formed by processing one conductive film formed over an insulating surface into a desired shape. A gate insulating film 228 is formed over the conductive film 212, the conductive film 218, the conductive film 222, the conductive film 225, the conductive film 226, and the conductive film 227. The conductive film 210, the conductive film 211, the conductive film 213, the conductive film 214, the conductive film 219, the conductive film 220, the conductive film 223, and the conductive film 224 can be formed by processing one conductive film formed over the gate insulating film 228 into a desired shape.

An insulating film 281 and an insulating film 282 are formed over the conductive film 210, the conductive film 211, the conductive film 213, the conductive film 214, the conductive film 219, the conductive film 220, the conductive film 223, and the conductive film 224. The conductive film 221 is formed over the insulating film 281 and the insulating film 282.

An oxide semiconductor is preferably used for a semiconductor layer 250 of the transistor 403. In order to hold electric charge generated by irradiation with light from the substrate 251 side for a long time, the transistor 403 that is electrically connected to the photodiode 402 needs to be a transistor with extremely low off-state current. Thus, when an oxide semiconductor material is used for the semiconductor layer 250, the performance of the photosensor 400 can be improved. Note that an oxide semiconductor can be used for semiconductor layers of the transistor 404 and the transistor 405.

A material such as amorphous silicon, microcrystalline silicon, polycrystalline silicon, or single crystal silicon can be used for the semiconductor layers of the transistor 404 and the transistor 405. By using such a material, transistors having high mobility can be formed.

Note that in the case where the transistor 403 is a bottom-gate transistor, it is preferable that the semiconductor layer 250 be provided over the conductive film 218 functioning as a gate electrode, as illustrated in FIG. 18B. This structure can prevent the oxide semiconductor in the semiconductor layer 250 from deteriorating because of light entering from the substrate 251 side, and can thus prevent deterioration in characteristics, such as a shift in threshold voltage of the transistor 403. Note that by employing the above structure for the transistor 404 and the transistor 405, a similar effect can be obtained.

Here, in the structure where the signal line 12(TX) is extended in a row direction as illustrated in FIG. 17A, the signal line 13(SE) that is also extended in the row direction and is parallel to the signal line 12(TX) exists. When part of the signal line 13(SE) that is electrically connected to the gate electrode of the transistor 405 is used as the gate electrode of the transistor 405, the signal line 12(TX) that is parallel to the signal line 13(SE) is generally formed in the same layer and using the same material as the gate electrode of the transistor 405. In general, however, a material used for a gate electrode of a transistor has higher resistance than that a material used for a source electrode or a drain electrode of the transistor. Thus, the signal line 12(TX) tends to have high resistance.

In contrast, in the structure of FIG. 17B, the signal line 12(TX) is extended in a column direction. Thus, the signal line 12(TX) can be formed using a conductive film that is formed in a layer different from a layer where the signal line 13(SE) extended in the row direction is formed. For example, as illustrated in FIGS. 18A and 18B, the signal line 12(TX) can be formed using the conductive film 211 that is formed in a layer different from a layer where the conductive films (the conductive films 212, 218, and 222) serving as the gate electrodes of the transistors (the transistors 403, 404, and 405) in the photosensor 400. The conductive film 211 can be formed in a layer where the source and drain electrodes of the transistors (the transistors 403, 404, and 405) in the photosensor 400 are formed, that is, in a layer where the conductive films 214, 219, 220, and 224 are formed, using the same material as the source and drain electrodes. Thus, the resistance of the signal line 12(TX) in this structure is lower than that in the structure in FIG. 17A.

Note that this embodiment can be combined with any of the other embodiments in this specification as appropriate.

(Embodiment 8)

In this embodiment, a method for forming a photosensor including a transistor whose channel is formed in a semiconductor film of single crystal silicon or the like and a transistor whose channel is formed in an oxide semiconductor layer is described.

Figure 19A:
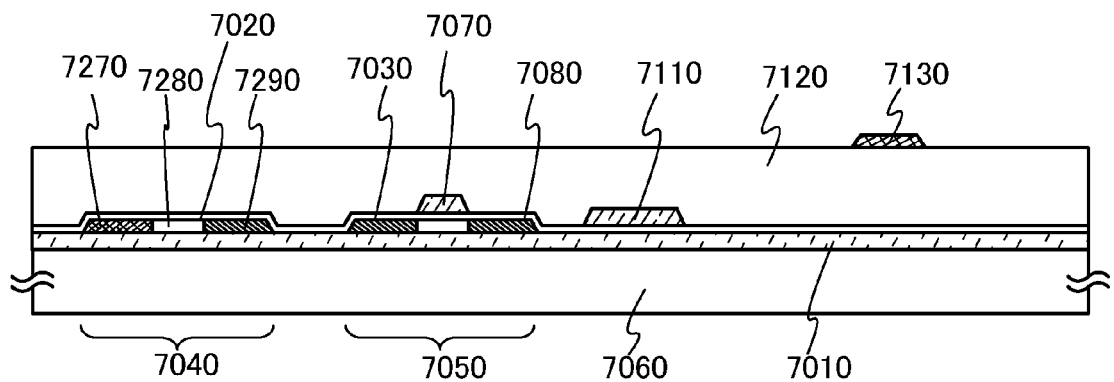
FIGS. 19A to 19C are cross-sectional views of a photosensor.

First, as illustrated in FIG. 19A, a photodiode 7040 and an n-channel transistor 7050 are formed over an insulating surface of a substrate 7600 by a known CMOS manufacturing method. In this embodiment, the photodiode 7040 and the n-channel transistor 7050 are formed using a single crystal semiconductor film that is separated from a single crystal semiconductor substrate. As the single crystal semiconductor substrate, a silicon substrate can be used, for example.

A specific example of a method for manufacturing the single crystal semiconductor film is briefly described. First, an ion beam including ions which are accelerated by an electric field enters the single crystal semiconductor substrate and a fragile layer which is weakened by local disorder of the crystal structure is formed in a region at a certain depth from a surface of the semiconductor substrate. The depth at which the fragile layer is formed can be adjusted by the acceleration energy of the ion beam and the angle at which the ion beam enters. Then, the semiconductor substrate and a substrate 7060 provided with an insulating film 7010 are attached to each other so that the insulating film 7010 is placed therebetween. After the semiconductor substrate and the substrate 7060 overlap with each other, a pressure of approximately 1 to 500 N/cm$^2$, preferably 11 to 20 N/cm$^2$ is applied to part of the semiconductor substrate and the substrate 7060 to attach the substrates. When the pressure is applied, bonding between the semiconductor substrate and the insulating film 7010 starts from the portion to which the pressure is applied, which results in bonding of the entire surface where the semiconductor substrate and the insulating film 7010 are in close contact with each other. After that, heat treatment is performed, so that microvoids that exist in the fragile layer are combined, so that the microvoids increase in volume. As a result, the single crystal semiconductor film which is part of the semiconductor substrate is separated from the semiconductor substrate along the fragile layer. The heat treatment is performed at a temperature not exceeding the strain point of the substrate 7060. Then, the single crystal semiconductor film is processed into a desired shape by etching or the like, so that an island-shaped semiconductor film 7020 and an island-shaped semiconductor film 7030 can be formed.

The photodiode 7040 is formed using the island-shaped semiconductor film 7020 over the insulating film 7010. The n-channel transistor 7050 is formed using the island-shaped semiconductor film 7030 over the insulating film 7010. The photodiode 7040 is a lateral junction photodiode in which a region 7270 having p-type conductivity, a region 7280 having i-type conductivity, and a region 7290 having n-type conductivity are formed in the island-shaped semiconductor film 7020. The n-channel transistor 7050 includes a gate electrode 7070. The n-channel transistor 7050 further includes a pair of regions in the island-shaped semiconductor film 7030 that has n-type conductivity and sandwiches a region overlapping with the gate electrode 7070. In addition, the n-channel transistor 7050 includes an insulating film 7080 between the island-shaped semiconductor film 7030 and the gate electrode 7070. In the n-channel transistor 7050, the insulating film 7080 functions as a gate insulating film.

Note that the region 7280 having i-type conductivity is a region of the semiconductor film that contains an impurity imparting p-type or n-type conductivity at a concentration of $1 \times 10^{20}$ cm$^{-3}$ or lower and has photoconductivity 400 or more times dark conductivity. The region 7280 having i-type conductivity includes, in its category, a region containing an impurity element that belongs to Group 13 or Group 15 of the periodic table. In other words, since the region 7280 having i-type conductivity has weak n-type electric conductivity when an impurity element for controlling valence electrons is not added intentionally, the region 7280 having i-type conductivity includes, in its category, a region to which an impurity element imparting p-type conductivity is added intentionally or unintentionally at the time of deposition or after the deposition.

Although there is no particular limitation on a material which can be used for the substrate 7060, when a transmissive or transflective liquid crystal element is used, a light-transmitting material is used for the substrate 7060. It is necessary that a material which can be used for the substrate 7060 have at least heat resistance high enough to withstand heat treatment performed later. For example, a glass substrate formed by a fusion method or a float method, a quartz substrate, or a ceramic substrate can be used as the substrate 7060. As the glass substrate, in the case where the temperature of the heat treatment performed later is high, a glass substrate having a strain point of 730° C. or higher is preferably used. Although a substrate formed using a flexible synthetic resin such as plastics generally has lower resistance temperature than the substrate, the substrate can be used as long as it can withstand processing temperature in manufacturing steps.

Note that although the photodiode 7040 and the n-channel transistor 7050 are formed using a single crystal semiconductor film in this embodiment, the present invention is not limited to this structure. For example, a polycrystalline or microcrystalline semiconductor film which is formed over the insulating film 7010 by vapor deposition may be used. Alternatively, the semiconductor film may be crystallized by a known technique. Examples of the known technique include a laser crystallization method using a laser beam and a crystallization method using a catalytic element. Alternatively, it is possible to use a combination of a crystallization method using a catalytic element and a laser crystallization method. In the case where a heat-resistant substrate such as a quartz substrate is used, it is possible to use a combination of any of the following crystallization methods: a thermal crystallization method using an electrically heated oven, a lamp annealing crystallization method using infrared light, a crystallization method using a catalytic element, and a high-temperature annealing method at approximately 950° C.

As illustrated in FIG. 19A, after a conductive film is formed over the insulating film 7080, the conductive film is processed into a desired shape by etching or the like, so that a wiring 7110 is formed together with the gate electrode 7070.

Next, as illustrated in FIG. 19A, an insulating film 7120 is formed to cover the photodiode 7040, the n-channel transistor 7050, the wiring 7110, and the gate electrode 7070. Note that although the insulating film 7120 is a single layer in this embodiment, the insulating film 7120 is not necessarily a single layer and insulating films of two or more layers may be stacked as the insulating film 7120.

The insulating film 7120 is formed using a material that can withstand the temperature of heat treatment in a later manufacturing step. Specifically, it is preferable to use a material such as silicon oxide, silicon nitride, silicon nitride oxide, silicon oxynitride, aluminum nitride, or aluminum oxide for the insulating film 7120.

Note that in this specification, an oxynitride is a substance which includes more oxygen than nitrogen, and a nitride oxide is a substance which includes more nitrogen than oxygen.

A surface of the insulating film 7120 may be flattened by CMP or the like.

Next, as illustrated in FIG. 19A, a gate electrode 7130 is formed over the insulating film 7120.

The gate electrode 7130 can have a single-layer structure or a layered structure using a metal material such as molybdenum, titanium, chromium, tantalum, tungsten, neodymium, or scandium, an alloy material that contains any of these metal materials a main component, or a nitride of any of these metal materials. Note that aluminum or copper can be used as the metal material if it can withstand the temperature of heat treatment performed in a later step. Aluminum or copper is preferably used in combination with a refractory metal material in order to avoid problems of heat resistance and corrosion. Molybdenum, titanium, chromium, tantalum, tungsten, neodymium, scandium, or the like can be used as the refractory metal material.

For example, as a two-layer structure of the gate electrode 7130, the following structures are preferable: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; and a two-layer structure in which a titanium nitride film and a molybdenum film are stacked. As a three-layer structure of the gate electrode 7130, the following structure is preferable: a stacked structure in which an aluminum film, an alloy film of aluminum and silicon, an alloy film of aluminum and titanium, or an alloy film of aluminum and neodymium is used as a middle layer and any of a tungsten film, a tungsten nitride film, a titanium nitride film, and a titanium film is used as a top layer and a bottom layer.

Further, a light-transmitting oxide conductive film of indium oxide, indium tin oxide, indium zinc oxide, zinc oxide, zinc aluminum oxide, zinc aluminum oxynitride, zinc gallium oxide, or the like can be used as the gate electrode 7130.

The thickness of the gate electrode 7130 is 10 to 400 nm, preferably 40 to 200 nm. In this embodiment, after a 150-nm-thick conductive film for the gate electrode is formed by sputtering using a tungsten target, the conductive film is processed (patterned) into a desired shape by etching, so that the gate electrode 7130 is formed. The gate electrode is preferably tapered because coverage of the gate electrode with a gate insulating film stacked thereover is improved. A resist mask may be formed by an inkjet method. When the resist mask is formed by an inkjet method, a photomask is not used; thus, manufacturing cost can be reduced.

Figure 19B:
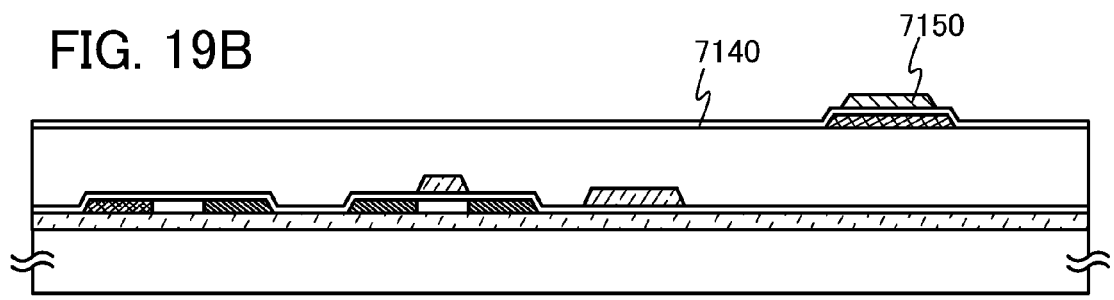

Next, as illustrated in FIG. 19B, a gate insulating film 7140 is formed over the gate electrode 7130, and then, an oxide semiconductor layer 7150 is formed over the gate insulating film 7140 to overlap with the gate electrode 7130.

The gate insulating film 7140 can be formed with a single-layer structure or a layered structure using one or more selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a tantalum oxide film formed by plasma-enhanced CVD, sputtering, or the like. It is preferable that the gate insulating film 7140 contains impurities such as moisture, hydrogen, or oxygen as little as possible. In the case where a silicon oxide film is formed by sputtering, a silicon target or a quartz target is used as a target, and oxygen or a mixed gas of oxygen and argon is used as a sputtering gas.

An oxide semiconductor layer that is made to be intrinsic (i-type) or substantially intrinsic by removal of impurities (a highly purified oxide semiconductor layer) is highly sensitive to an interface state and interface electric charge; thus, an interface between the oxide semiconductor layer 7150 and the gate insulating film 7140 is important. Consequently, the gate insulating film 7140 that is in contact with the highly purified oxide semiconductor layer 7150 needs to have high quality.

For example, high-density plasma-enhanced CVD using microwaves (e.g., a frequency of 2.45 GHz) is preferable because a dense high-quality insulating film having high withstand voltage can be formed. When the highly purified oxide semiconductor layer and the high-quality gate insulating film are in close contact with each other, the interface state can be reduced and favorable interface characteristics can be obtained.

Needless to say, a different deposition method such as sputtering or plasma-enhanced CVD can be used as long as a high-quality insulating film can be formed as the gate insulating film 7140. Alternatively, any gate insulating film can be used as long as film quality and properties of an interface with the oxide semiconductor layer 7150 are modified by heat treatment performed after deposition. In either case, any gate insulating film can be used as long as film quality as a gate insulating film is high, interface state density with the gate insulating film and the oxide semiconductor layer is decreased, and a favorable interface can be formed.

The gate insulating film 7140 may have a structure in which an insulating film formed using a material having a high barrier property and an insulating film having low proportion of nitrogen, such as a silicon oxide film or a silicon oxynitride film, are stacked. In that case, the insulating film such as a silicon oxide film or a silicon oxynitride film is formed between the insulating film having a high barrier property and the oxide semiconductor layer. As the insulating film having a high barrier property, a silicon nitride film, a silicon nitride oxide film, an aluminum nitride film, or an aluminum nitride oxide film can be used, for example. The formation of the insulating film using a material having a high barrier property can prevent impurities in an atmosphere, such as moisture or hydrogen, or impurities in the substrate, such as an alkali metal or a heavy metal, from entering the oxide semiconductor layer, the gate insulating film 7140, or the interface between the oxide semiconductor layer and another insulating film and the vicinity thereof. In addition, the insulating film having low proportion of nitrogen, such as a silicon oxide film or a silicon oxynitride film, is formed to be in contact with the oxide semiconductor layer, so that the insulating film having a high barrier property can be prevented from being in direct contact with the oxide semiconductor layer.

For example, the 400-nm-thick gate insulating film 7140 may be formed in such a manner that a silicon nitride film ($SiN_y$ (y>0)) with a thickness of 50 to 200 nm is formed as a first gate insulating film by sputtering and a silicon oxide film ($SiO_x$ (x>0)) with a thickness of 5 to 300 nm is stacked as a second gate insulating film over the first gate insulating film. The thickness of the gate insulating film 7140 may be set as appropriate depending on characteristics needed for the transistor and may be approximately 350 to 400 nm.

In this embodiment, the gate insulating film 7140 with a structure in which a 400-nm-thick silicon oxide film formed by sputtering is stacked over a 50-nm-thick silicon nitride film formed by sputtering is formed.

Note that the gate insulating film 7140 is in contact with the oxide semiconductor layer formed later. When hydrogen is contained in the oxide semiconductor layer, characteristics are adversely affected; thus, it is preferable that the gate insulating film 7140 do not contain hydrogen, a hydroxyl group, and moisture. In order that hydrogen, a hydroxyl group, and moisture be contained in the gate insulating film 7140 as little as possible, it is preferable that an impurity such as hydrogen or moisture that is adsorbed on the substrate 7060 be eliminated and exhausted by preheating of the substrate 7060 over which the gate electrode 7130 is formed in a preheating chamber of a sputtering apparatus, as pretreatment for deposition. The temperature of the preheating is 100 to 400° C., preferably 150 to 300° C. As an exhaustion means provided in the preheating chamber, a cryopump is preferable. Note that the preheating treatment can be omitted.

The oxide semiconductor layer 7150 can be formed by processing an oxide semiconductor film formed over the gate insulating film 7140 into a desired shape. The thickness of the oxide semiconductor film is 2 to 200 nm, preferably 3 to 50 nm, more preferably 3 to 20 nm. The oxide semiconductor film is deposited by sputtering using an oxide semiconductor as a target. Alternatively, the oxide semiconductor film can be formed by sputtering in a rare gas (e.g., argon) atmosphere, an oxygen atmosphere, or a mixed atmosphere of a rare gas (e.g., argon) and oxygen.

Note that before the oxide semiconductor film is deposited by sputtering, dust on a surface of the gate insulating film 7140 is preferably removed by reverse sputtering in which an argon gas is introduced and plasma is generated. The reverse sputtering is a method in which, without application of voltage to a target side, an RF power source is used for application of voltage to a substrate side in an argon atmosphere and plasma is generated in the vicinity of the substrate so that a substrate surface is modified. Note that the reverse sputtering may be performed in a nitrogen atmosphere, a helium atmosphere, or the like instead of the argon atmosphere. Alternatively, the reverse sputtering may be performed in an argon atmosphere to which oxygen, nitrous oxide, or the like is added. Alternatively, the reverse sputtering may be performed in an argon atmosphere to which chlorine, carbon tetrafluoride, or the like is added.

The oxide semiconductor film preferably contains at least indium (In) or zinc (Zn). In particular, the oxide semiconductor film preferably contains In and Zn. As a stabilizer for reducing variations in electrical characteristics of a transistor including the oxide semiconductor film, the oxide semiconductor film preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide; tin oxide; zinc oxide; a binary metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a ternary metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a quaternary metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as an oxide semiconductor.

Note that here, for example, an In—Ga—Zn-based oxide means an oxide containing In, Ga, and Zn as main components, and there is no limitation on the ratio of In, Ga, and Zn. In addition, the In—Ga—Zn—O-based oxide may contain a metal element other than In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above composition can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above composition can be used.

However, without limitation to the materials given above, a material with an appropriate composition may be used depending on needed semiconductor electrical characteristics (e.g., mobility, threshold voltage, and variations). In order to obtain needed semiconductor electrical characteristics, it is preferable that carrier concentration, impurity concentration, defect density, an atomic ratio between a metal element and oxygen, interatomic distance, density, and the like be set to appropriate values.

The oxide semiconductor may be either single crystal or non-single-crystal. In the latter case, the oxide semiconductor may be either amorphous or polycrystalline. Further, the oxide semiconductor may have either an amorphous structure including a crystalline portion or a non-amorphous structure.

In this embodiment, a 30-nm-thick In-Ga—Zn-based oxide semiconductor thin film which is formed by sputtering using a target including indium (In), gallium (Ga), and zinc (Zn) is used as the oxide semiconductor film. A target with a composition ratio of metals, In:Ga:Zn=1:1:0.5, 1:1:1, or 1:1:2 can be used as the target, for example. The filling factor of the target including In, Ga, and Zn is higher than or equal to 90% and lower than or equal to 100%, preferably higher than or equal to 95% and lower than 100%. With the use of a target with a high filling factor, a dense oxide semiconductor film is formed.

In this embodiment, the oxide semiconductor film is formed over the substrate 7060 in such a manner that the substrate is held in a treatment chamber kept at reduced pressure, moisture remaining in the treatment chamber is removed, a sputtering gas from which hydrogen and moisture are removed is introduced, and the target is used. The substrate temperature may be 100 to 600° C., preferably 200 to 400° C. during formation. By formation of the oxide semiconductor film while the substrate is heated, the concentration of impurities included in the oxide semiconductor film can be lowered. In addition, damage by sputtering can be reduced. In order to remove moisture remaining in the treatment chamber, an adsorption vacuum pump is preferably used. For example, a cryopump, an ion pump, or a titanium sublimation pump is preferably used. A turbo pump to which a cold trap is added may be used as an exhaustion means. For example, a hydrogen atom, a compound containing a hydrogen atom, such as water (preferably a compound containing a carbon atom), and the like are exhausted from the treatment chamber with the use of a cryopump. Thus, the concentration of impurities contained in the oxide semiconductor film formed in the treatment chamber can be lowered.

As an example of the formation condition, the following condition is employed: the distance between the substrate and the target is 400 mm, the pressure is 0.6 Pa, the direct current (DC) power is 0.5 kW, and the atmosphere is an oxygen atmosphere (the proportion of the oxygen flow rate is 100%). Note that it is preferable that pulsed direct-current (DC) power be used because dust generated during formation can be reduced and the film thickness can be uniform.

In order that hydrogen, a hydroxyl group, and moisture be contained in the oxide semiconductor film as little as possible, an impurity such as hydrogen or moisture that is adsorbed on the substrate 7060 is preferably eliminated and exhausted by preheating of the substrate 7060 over which the gate insulating film 7140 is formed in a preheating chamber of a sputtering apparatus, as pretreatment for deposition. The temperature of the preheating is 100 to 400° C., preferably 150 to 300° C. As an exhaustion means provided in the preheating chamber, a cryopump is preferable. Note that the preheating treatment can be omitted. This preheating may be similarly performed on the substrate 7060 over which conductive films 7200 and 7210 are formed, before the formation of an insulating film 7220 in a later step.

Note that etching for forming the oxide semiconductor layer 7150 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching, parallel plate reactive ion etching (RIE) or inductively coupled plasma (ICP) etching can be used. In order to etch the film to have a desired processing shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask for forming the oxide semiconductor layer 7150 may be formed by an inkjet method. When the resist mask is formed by an inkjet method, a photomask is not used; thus, manufacturing cost can be reduced.

Note that it is preferable that reverse sputtering be performed before the formation of a conductive film in a subsequent step so that resist residues and the like that attach onto surfaces of the oxide semiconductor layer 7150 and the gate insulating film 7140 are removed.

Note that the oxide semiconductor layer deposited by sputtering or the like contains a large amount of moisture or hydrogen (including a hydroxyl group) as an impurity in some cases. Moisture or hydrogen easily forms a donor level and thus serve as an impurity in the oxide semiconductor. Thus, in one embodiment of the present invention, in order to reduce impurities such as moisture or hydrogen in the oxide semiconductor layer (in order to perform dehydration or dehydrogenation), the oxide semiconductor layer 7150 is subjected to heat treatment in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring-down laser spectroscopy (CRDS) method).

By performing heat treatment on the oxide semiconductor layer 7150, moisture or hydrogen in the oxide semiconductor layer 7150 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA is used for the heat treatment, dehydration or dehydrogenation can be performed in a short time; thus, treatment can be performed even at a temperature higher than the strain point of a glass substrate.

In this embodiment, an electric furnace that is one of heat treatment apparatuses is used.

Note that the heat treatment apparatus is not limited to an electric furnace, and may be provided with a device for heating an object by thermal conduction or thermal radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. An inert gas which does not react with an object by heat treatment, such as nitrogen or a rare gas (e.g., argon), is used as the gas.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

Through the above steps, the concentration of hydrogen in the oxide semiconductor layer 7150 can be lowered and the oxide semiconductor layer 7150 can be highly purified. Accordingly, the oxide semiconductor layer 7150 can be stabilized. In addition, the heat treatment at a temperature of lower than or equal to the glass transition temperature makes it possible to form an oxide semiconductor layer 7150 with extremely low carrier density and a wide band gap. Thus, the transistor can be formed using a large substrate, so that mass productivity can be improved. Further, with the use of the highly purified oxide semiconductor layer 7150 in which the hydrogen concentration is lowered, it is possible to form a transistor with high withstand voltage and extremely low off-state current. The heat treatment can be performed at any time after the oxide semiconductor layer is deposited.

Note that in the case where the oxide semiconductor film is heated, depending on the material of the oxide semiconductor film or heating conditions, plate-like crystals are formed at the surface of the oxide semiconductor film in some cases. The plate-like crystal is preferably a single crystal which is c-axis-aligned in a direction substantially perpendicular to a surface of the oxide semiconductor film. Even if the plate-like crystals are not single crystal bodies, they are preferably polycrystals where a-b planes of the crystals are aligned or the a-axes or b-axes of the crystals are aligned in a channel formation region and the crystals are c-axis-aligned in a direction substantially perpendicular to the surface of the oxide semiconductor film. Note that when a base surface of the oxide semiconductor film is uneven, the plate-like crystal is a polycrystal. Thus, the base surface is preferably as even as possible.

An oxide semiconductor film can be single crystal, polycrystalline (also referred to as polycrystal), or amorphous, for example.

The oxide semiconductor film is preferably a c-axis aligned crystalline oxide semiconductor (CAAC-OS) film. The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits into a cube whose one side is less than 100 nm. From an observation image obtained with a transmission electron microscope (TEM), a boundary between the amorphous part and a crystal part in the CAAC-oxide semiconductor film is not clear. Further, with the TEM, a grain boundary in the CAAC-oxide semiconductor film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic order which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85 to 95°. In addition, a simple term "parallel" includes a range from −5 to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the CAAC-OS film is higher than that in the vicinity of the surface where the CAAC-OS film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to the normal vector of the surface where the CAAC-OS film is formed or the normal vector of the surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to the normal vector of the surface where the CAAC-OS film is formed or the normal vector of the surface of the CAAC-OS film. The crystal part is formed by deposition or by performing treatment for crystallization such as heat treatment after deposition.

In a transistor including a CAAC-OS film, a change in electrical characteristics due to irradiation with visible light or ultraviolet light is small. Thus, the transistor has high reliability.

Note that part of oxygen included in the oxide semiconductor film may be substituted with nitrogen.

Next, the insulating film 7080, the insulating film 7120, and the gate insulating film 7140 are partly etched, so that contact holes reaching the island-shaped semiconductor film 7020, the island-shaped semiconductor film 7030, and the wiring 7110 are formed.

Figure 19C:
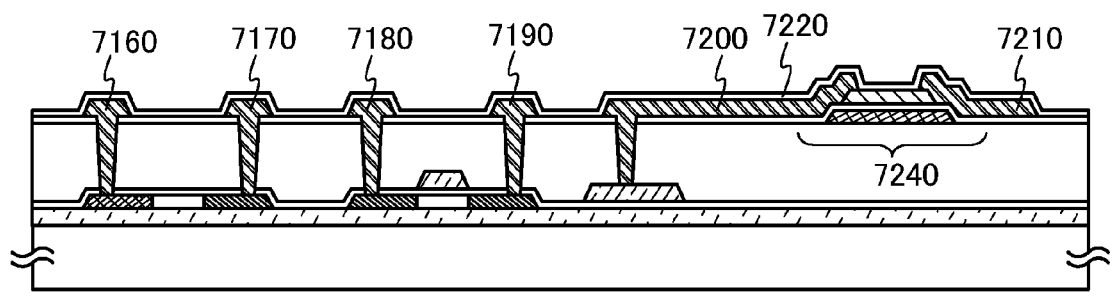

Then, a conductive film is formed to cover the oxide semiconductor layer 7150 by sputtering or vacuum evaporation. After that, the conductive film is patterned by etching or the like, so that conductive films 7160, 7170, 7180, and 7190 and the conductive films 7200 and 7210 each functioning as a source electrode, a drain electrode, or a wiring are formed, as illustrated in FIG. 19C.

Note that the conductive films 7160 and 7170 are in contact with the island-shaped semiconductor film 7020. The conductive films 7180 and 7190 are in contact with the island-shaped semiconductor film 7030. The conductive film 7200 is in contact with the wiring 7110 and the oxide semiconductor layer 7150. The conductive film 7210 is in contact with the oxide semiconductor layer 7150.

As the material of the conductive film serving as the conductive films 7160, 7170, 7180, 7190, 7200, and 7210, any of the following materials can be used, for example: an element selected from aluminum, chromium, copper, tantalum, titanium, molybdenum, or tungsten; an alloy containing any of these elements; and an alloy film containing the above elements in combination. Alternatively, the conductive film may have a structure in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems of heat resistance and corrosion. Molybdenum, titanium, chromium, tantalum, tungsten, neodymium, scandium, yttrium, or the like can be used as the refractory metal material.

The conductive films 7160, 7170, 7180, 7190, 7200, and 7210 may have a single-layer structure or a layered structure of two or more layers. For example, the conductive films 7160, 7170, 7180, 7190, 7200, and 7210 can have a single-layer structure of an aluminum film containing silicon, a two-layer structure in which a titanium film is stacked over an aluminum film, or a three-layer structure in which a titanium film, an aluminum film, and a titanium film are stacked in that order.

The conductive film serving as the conductive films 7160, 7170, 7180, 7190, 7200, and 7210 may be formed using a conductive metal oxide. Indium oxide, tin oxide, zinc oxide, indium tin oxide, indium zinc oxide, or the conductive metal oxide material containing silicon or silicon oxide can be used as the conductive metal oxide.

In the case where heat treatment is performed after the formation of the conductive film, the conductive film preferably has heat resistance high enough to withstand the heat treatment.

Note that each material and etching conditions are adjusted as appropriate so that the oxide semiconductor layer 7150 is removed as little as possible during etching of the conductive film. Depending on the etching conditions, an exposed portion of the island-shaped oxide semiconductor layer 7150 is partly etched, so that a groove (a depression portion) is formed in some cases.

In this embodiment, a titanium film is used as the conductive film. Thus, the conductive film can be selectively etched by wet etching using a solution (an ammonia hydrogen peroxide mixture) containing ammonia and hydrogen peroxide water; in this case, the oxide semiconductor layer 7150 is partly etched. Specifically, a solution in which oxygenated water of 31 wt %, ammonia water of 28 wt %, and water are mixed at a volume ratio of 5:2:2 is used as the ammonia hydrogen peroxide mixture. Alternatively, dry etching may be performed on the conductive film with the use of a gas containing chlorine ($Cl_2$), boron chloride ($BCl_3$), or the like.

Note that in order to reduce the number of photomasks used in a photolithography process and to reduce the number of processes, etching may be performed using a multi-tone mask through which light is transmitted to have a plurality of intensities. A resist mask formed using a multi-tone mask has a plurality of thicknesses and can be changed in shape by etching; thus, the resist mask can be used in a plurality of etching processes for processing films into different patterns. Accordingly, a resist mask corresponding to at least two or more kinds of different patterns can be formed by one multi-tone mask. Thus, the number of exposure masks and the number of corresponding photolithography processes can be reduced, so that the process can be simplified.

Next, plasma treatment is performed using a gas such as $N_2O$, $N_2$, or Ar. With this plasma treatment, water and the like which attach to a surface of the oxide semiconductor layer 7150 exposed are removed. Alternatively, plasma treatment may be performed using a mixture gas of oxygen and argon.

After the plasma treatment, as illustrated in FIG. 19C, the insulating film 7220 is formed to cover the conductive films 7160, 7170, 7180, 7190, 7200, and 7210 and the oxide semiconductor layer 7150. The insulating film 7220 preferably includes impurities such as moisture, hydrogen, or oxygen as little as possible, and the insulating film 7220 may be formed using a single-layer insulating film or a plurality of insulating films stacked. When hydrogen is contained in the insulating film 7220, hydrogen enters the oxide semiconductor layer or oxygen in the oxide semiconductor layer is extracted by hydrogen, whereby a back channel portion of the oxide semiconductor layer has lower resistance (n-type conductivity)

and a parasitic channel might be formed. Thus, it is important that a deposition method in which hydrogen is not used be employed in order to form the insulating film 7220 containing hydrogen as little as possible. A material having a high barrier property is preferably used for the insulating film 7220. As the insulating film having a high barrier property, a silicon nitride film, a silicon nitride oxide film, an aluminum nitride film, or an aluminum nitride oxide film can be used, for example. When a plurality of insulating films stacked are used, an insulating film having low proportion of nitrogen, such as a silicon oxide film or a silicon oxynitride film, is formed on a side which is closer to the oxide semiconductor layer 7150 than the insulating film having a high barrier property. Then, the insulating film having a high barrier property is formed to overlap with the conductive films 7160, 7170, 7180, 7190, 7200, and 7210 and the oxide semiconductor layer 7150 with the insulating film having low proportion of nitrogen placed therebetween. When the insulating film having a high barrier property is used, impurities such as moisture or hydrogen can be prevented from entering the oxide semiconductor layer 7150, the gate insulating film 7140, or the interface between the oxide semiconductor layer 7150 and another insulating film and the vicinity thereof. In addition, the insulating film having low proportion of nitrogen, such as a silicon oxide film or a silicon oxynitride film, is formed to be in contact with the oxide semiconductor layer 7150, so that the insulating film having a high barrier property can be prevented from being in direct contact with the oxide semiconductor layer 7150.

In this embodiment, the insulating film 7220 with a structure in which a 100-nm-thick silicon nitride film formed by sputtering is stacked over a 200-nm-thick silicon oxide film formed by sputtering is formed. The substrate temperature during deposition is in the range of room temperature to 300° C., and is 100° C. in this embodiment.

After the insulating film 7220 is formed, heat treatment may be performed. The heat treatment is performed in a nitrogen atmosphere, ultra-dry air, or a rare gas (e.g., argon or helium) atmosphere preferably at 200 to 400° C., for example, 250 to 350° C. It is preferable that the content of water in the gas be 20 ppm or lower, preferably 1 ppm or lower, more preferably 10 ppb or lower. In this embodiment, for example, heat treatment is performed at 250° C. for 1 hour in a nitrogen atmosphere. Alternatively, RTA treatment may be performed at a high temperature for a short time before the formation of the conductive films 7160, 7170, 7180, 7190, 7200, and 7210 in a manner similar to that of the heat treatment performed on the oxide semiconductor layer for reduction of moisture or hydrogen. Even when oxygen defects are generated in the oxide semiconductor layer 7150 by the heat treatment performed on the oxide semiconductor layer 7150, oxygen is supplied to the oxide semiconductor layer 7150 from the insulating film 7220 by performing heat treatment after provision of the insulating film 7220 containing oxygen. By the supply of oxygen to the oxide semiconductor layer 7150, oxygen defects that serve as donors can be reduced in the oxide semiconductor layer 7150. It is preferable that the proportion of oxygen in the oxide semiconductor layer 7150 be higher than the stoichiometric proportion. As a result, the oxide semiconductor layer 7150 can be made close to intrinsic and variations in electrical characteristics of the transistor due to oxygen defects can be reduced; thus, the electrical characteristics can be improved. The timing of this heat treatment is not particularly limited as long as it is after the formation of the insulating film 7220. When this heat treatment serves as heat treatment in another step (e.g., heat treatment during formation of a resin film or heat treatment for lowering the resistance of a transparent conductive film), the oxide semiconductor layer 7150 can be made close to intrinsic without an increase in the number of steps.

Alternatively, the oxygen defects that serve as donors in the oxide semiconductor layer 7150 may be reduced by performing heat treatment on the oxide semiconductor layer 7150 in an oxygen atmosphere so that oxygen is added to the oxide semiconductor. The heat treatment is performed at, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably 6N (99.9999%) or higher, more preferably 7N (99.99999%) or higher (that is, the impurity concentration in oxygen is 1 ppm or lower, preferably 0.1 ppm or lower).

Alternatively, oxygen may be added to the oxide semiconductor layer 7150 by ion implantation, ion doping, or the like so that oxygen defects that serve as donors are reduced. For example, oxygen made to be plasma with a microwave of 2.45 GHz may be added to the oxide semiconductor layer 7150.

Note that a back gate electrode may be formed to overlap with the oxide semiconductor layer 7150 by forming a conductive film over the insulating film 7220 and then patterning the conductive film. In the case where the back gate electrode is formed, an insulating film is preferably formed to cover the back gate electrode. The back gate electrode can be formed using a material and a structure similar to those of the gate electrode 7130 or the conductive films 7160, 7170, 7180, 7190, 7200, and 7210.

The thickness of the back gate electrode is 10 to 400 nm, preferably 100 to 200 nm. For example, the back gate electrode may be formed in such a manner that a conductive film in which a titanium film, an aluminum film, and a titanium film are stacked is formed, a resist mask is formed by photolithography or the like, and unnecessary portions are removed by etching so that the conductive film is processed (patterned) into a desired shape.

Through the above steps, a transistor 7240 is formed.

The transistor 7240 includes the gate electrode 7130, the gate insulating film 7140 over the gate electrode 7130, the oxide semiconductor layer 7150 that overlaps with the gate electrode 7130 with the gate insulating film 7140 placed therebetween, and a pair of the conductive films (the conductive films 7200 and 7210) formed over the oxide semiconductor layer 7150. The transistor 7240 may further include the insulating film 7220. The transistor 7240 in FIG. 19C has a channel-etched structure in which part of the oxide semiconductor layer 7150 that is placed between the conductive film 7200 and the conductive film 7210 is etched.

Although the transistor 7240 is a single-gate transistor, a multi-gate transistor including a plurality of channel formation regions can be formed using a plurality of gate electrodes electrically connected to each other, when needed.

Note that insulating films which are in contact with the oxide semiconductor layer 7150 (in this embodiment, corresponding to the gate insulating film 7140 and the insulating film 7220) may be formed using an insulating material containing a Group 13 element and oxygen. Many oxide semiconductor materials contain a Group 13 element, and an insulating material containing a Group 13 element works well with an oxide semiconductor. By using such an insulating material containing a Group 13 element for the insulating films which are in contact with the oxide semiconductor layer, the state of an interface with the oxide semiconductor layer can be kept well.

An insulating material containing a Group 13 element is an insulating material containing one or more Group 13 elements. Examples of the insulating material containing a Group 13 element include gallium oxide, aluminum oxide, aluminum gallium oxide, and gallium aluminum oxide. Here, aluminum gallium oxide is a material whose content of aluminum is larger than the content of gallium in an atomic percent, and gallium aluminum oxide is a material whose content of gallium is larger than or equal to the content of aluminum in an atomic percent.

Alternatively, the insulating films which are in contact with the oxide semiconductor layer 7150 may be formed using an inorganic material containing oxygen (e.g., silicon oxide, silicon oxynitride, or silicon nitride oxide). By using an inorganic material containing oxygen for the insulating films, oxygen can be supplied from the insulating films to the oxide semiconductor layer and oxygen vacancies serving as donors can be reduced even when oxygen vacancies occur in the oxide semiconductor layer by heat treatment for reducing moisture or hydrogen.

For example, in the case where an insulating film is formed in contact with an oxide semiconductor layer containing gallium, when a material containing gallium oxide is used for the insulating film, favorable characteristics can be kept at the interface between the oxide semiconductor layer and the insulating film. For example, when the oxide semiconductor layer and the insulating film containing gallium oxide are provided in contact with each other, pile up of hydrogen at the interface between the oxide semiconductor layer and the insulating film can be reduced. Note that a similar effect can be obtained in the case where an element that belongs to the same group as a constituent element of the oxide semiconductor layer is used for the insulating film. For example, it is effective to form an insulating film with the use of a material containing aluminum oxide. Aluminum oxide does not easily transmit water. Thus, it is preferable to use the material including aluminum oxide in order to prevent water from entering the oxide semiconductor layer.

The insulating film which is in contact with the oxide semiconductor layer 7150 preferably contains oxygen in a proportion higher than the stoichiometric proportion by heat treatment in an oxygen atmosphere or oxygen doping. Oxygen doping is addition of oxygen to a bulk. Note that the term "bulk" is used in order to clarify that oxygen is added not only to a surface of a thin film but also to the inside of the thin film. The term "oxygen doping" also means "oxygen plasma doping" in which oxygen which is made to be plasma is added to a bulk. The oxygen doping may be performed by ion implantation or ion doping.

For example, in the case where the insulating film which is in contact with the oxide semiconductor layer 7150 is formed using gallium oxide, the composition of gallium oxide can be $Ga_2O_X$ ($X=3+\alpha$, $0<\alpha<1$) by heat treatment in an oxygen atmosphere or oxygen doping.

In the case where the insulating film which is in contact with the oxide semiconductor layer 7150 is formed using aluminum oxide, the composition of aluminum oxide can be $Al_2O_X$ ($X=3+\alpha$, $0<\alpha<1$) by heat treatment in an oxygen atmosphere or oxygen doping.

In the case where the insulating film which is in contact with the oxide semiconductor layer 7150 is formed using gallium aluminum oxide (aluminum gallium oxide), the composition of gallium aluminum oxide (aluminum gallium oxide) can be $Ga_XAl_{2-X}O_{3+\alpha}$ ($0<X<2$, $0<\alpha<1$) by heat treatment in an oxygen atmosphere or oxygen doping.

By oxygen doping, an insulating film including a region where the proportion of oxygen is higher than the stoichiometric proportion can be formed. When the insulating film including such a region is in contact with the oxide semiconductor layer, oxygen that exists excessively in the insulating film is supplied to the oxide semiconductor layer, and oxygen vacancies in the oxide semiconductor layer or at the interface between the oxide semiconductor layer and the insulating film are reduced. Thus, the oxide semiconductor layer can be an intrinsic or substantially intrinsic oxide semiconductor.

The insulating film including a region where the proportion of oxygen is higher than the stoichiometric proportion may be applied to either the insulating film placed on an upper side of the oxide semiconductor layer or the insulating film placed on a lower side of the oxide semiconductor layer of the insulating films which are in contact with the oxide semiconductor layer 7150; however, it is preferable to apply such an insulating film to both the insulating films. The above effect can be enhanced with a structure where the oxide semiconductor layer 7150 is sandwiched between the insulating films each including a region where the proportion of oxygen is higher than the stoichiometric proportion, which are used as the insulating films in contact with the oxide semiconductor layer 7150 and positioned on the upper side and the lower side of the oxide semiconductor layer 7150.

The insulating films on the upper side and the lower side of the oxide semiconductor layer 7150 may contain the same constituent element or different constituent elements. For example, the insulating films on the upper side and the lower side may be both formed using gallium oxide whose composition is $Ga_2O_X$ ($X=3+\alpha$, $0<\alpha<1$). Alternatively, one of the insulating films on the upper side and the lower side may be formed using $Ga_2O_X$ ($X=3+\alpha$, $0<\alpha<1$) and the other may be formed using aluminum oxide whose composition is $Al_2O_X$ ($X=3+\alpha$, $0<\alpha<1$).

The insulating film which is in contact with the oxide semiconductor layer 7150 may be formed by a stack of insulating films each including a region where the proportion of oxygen is higher than the stoichiometric proportion. For example, the insulating film on the upper side of the oxide semiconductor layer 7150 may be formed as follows: gallium oxide whose composition is $Ga_2O_X$ ($X=3+\alpha$, $0<\alpha<1$) is formed and gallium aluminum oxide (aluminum gallium oxide) whose composition is $Ga_XAl_{2-X}O_{3+\alpha}$ ($0<X<2$, $0<\alpha<1$) may be formed thereover. Note that the insulating film on the lower side of the oxide semiconductor layer 7150 may be formed by a stack of insulating films each including a region where the proportion of oxygen is higher than the stoichiometric proportion. Alternatively, both the insulating films on the upper side and the lower side of the oxide semiconductor layer 7150 may be formed by a stack of insulating films each including a region where the proportion of oxygen is higher than the stoichiometric proportion.

The photodiode 7040 can be used as the photodiode 402 illustrated in FIG. 3, FIGS. 17A and 17B, and the like. The n-channel transistor 7050 can be used as the transistors 404 and 405 illustrated in FIG. 3, FIGS. 17A and 17B, and the like. The transistor 7240 can be used as the transistor 403 illustrated in FIG. 3, FIGS. 17A and 17B, and the like. The transistor 7240 may be used as the transistors 404 and 405 illustrated in FIG. 3, FIGS. 17A and 17B, and the like.

This embodiment can be combined with any of the above embodiments.

(Embodiment 9)

In this embodiment, a transistor whose channel is formed in an oxide semiconductor layer and which has a structure different from that in Embodiment 8 is described.

Figure 20A:
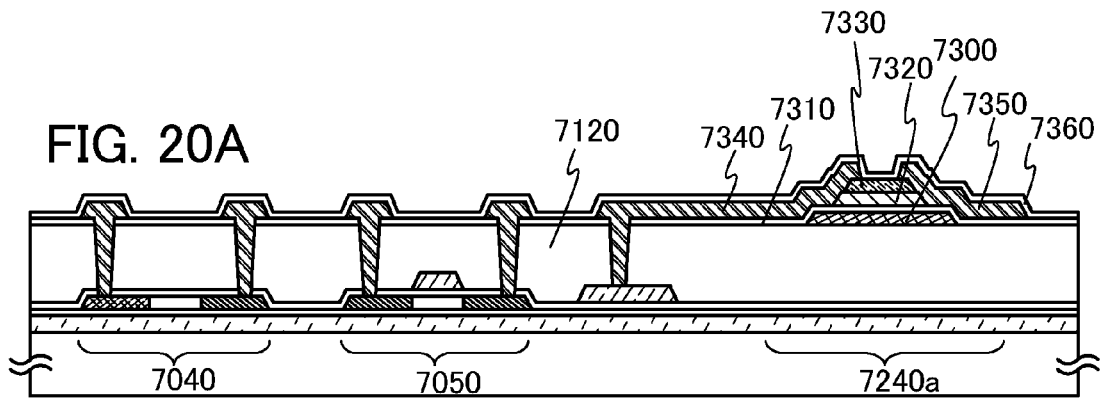
FIGS. 20A to 20D are cross-sectional views of photosensors.

A photosensor in FIG. 20A includes the photodiode 7040 and the n-channel transistor 7050 as in Embodiment 8. In addition, in FIG. 20A, a bottom-gate transistor 7240a with a channel protective structure is formed over the photodiode 7040 and the n-channel transistor 7050.

The transistor 7240a includes a gate electrode 7300 formed over the insulating film 7120, a gate insulating film 7310 over the gate electrode 7300, an oxide semiconductor layer 7320 overlapping with the gate electrode 7300 with the gate insulating film 7310 placed therebetween, a channel protective film 7330 formed over the oxide semiconductor layer 7320 to overlap with the gate electrode 7300, and a conductive film 7340 and a conductive film 7350 formed over the oxide semiconductor layer 7320. The transistor 7240a may further include an insulating film 7360 formed over the conductive film 7340, the conductive film 7350, and the channel protective film 7330.

The channel protective film 7330 can prevent a portion serving as a channel formation region of the oxide semiconductor layer 7320 from being damaged in a later step (e.g., from being reduced in thickness due to plasma or an etchant at the time of etching). Thus, the reliability of the transistor 7240a can be improved.

The channel protective film 7330 can be formed using an inorganic material containing oxygen (e.g., silicon oxide, silicon nitride oxide, silicon oxynitride, aluminum oxide, or aluminum oxynitride). The channel protective film 7330 can be formed by vapor deposition such as plasma-enhanced CVD or thermal CVD, or sputtering. After the deposition, the shape of the channel protective film 7330 is processed by etching. Here, the channel protective film 7330 is formed in such a manner that a silicon oxide film is formed by sputtering and processed by etching using a mask formed by photolithography.

By using an inorganic material containing oxygen for the channel protective film 7330, oxygen can be supplied from the channel protective film 7330 to the oxide semiconductor layer 7320 and oxygen vacancies serving as donors can be reduced even when oxygen vacancies occur in the oxide semiconductor layer 7320 by heat treatment for reducing moisture or hydrogen. Thus, the channel formation region can be made close to intrinsic and variations in electrical characteristics of the transistor 7240a due to oxygen vacancies can be reduced, which results in improvement in electrical characteristics.

Figure 20B:
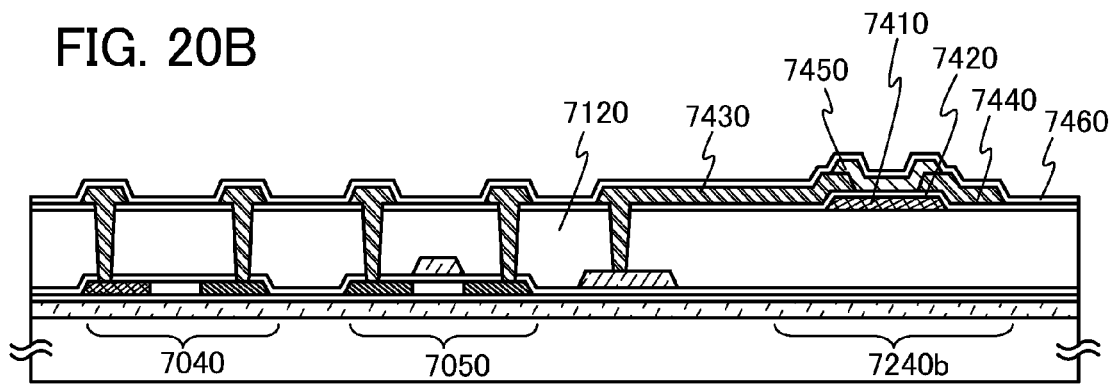

A photosensor in FIG. 20B includes the photodiode 7040 and the n-channel transistor 7050 as in Embodiment 8. In FIG. 20B, a bottom-contact transistor 7240b is formed over the photodiode 7040 and the n-channel transistor 7050.

The transistor 7240b includes a gate electrode 7410 formed over the insulating film 7120, a gate insulating film 7420 over the gate electrode 7410, a conductive film 7430 and a conductive film 7440 over the gate insulating film 7420, and an oxide semiconductor layer 7450 overlapping with the gate electrode 7410 with the gate insulating film 7420 placed therebetween. The transistor 7240b may further include an insulating film 7460 formed over the oxide semiconductor layer 7450.

Note that each of the transistors 7240a and 7240b in FIGS. 20A and 20B may further include a back gate electrode.

Figure 20C:
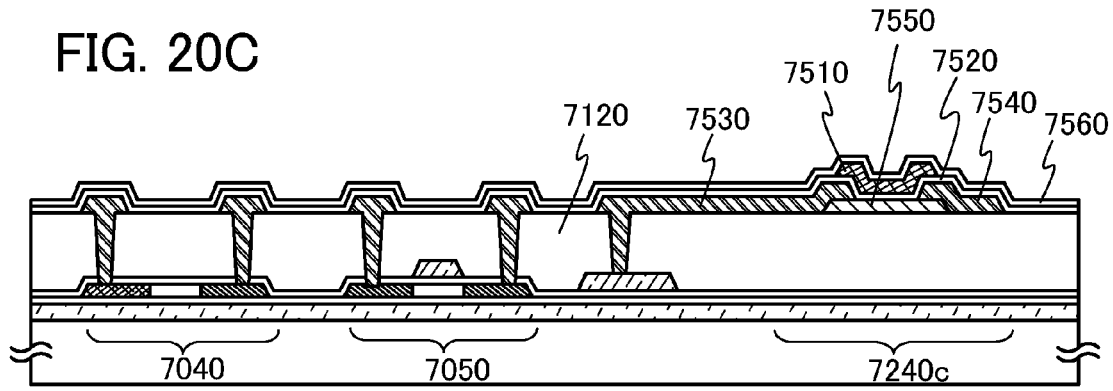

A photosensor in FIG. 20C includes the photodiode 7040 and the n-channel transistor 7050 as in Embodiment 8. In FIG. 20C, a top-contact transistor 7240c is formed over the photodiode 7040 and the n-channel transistor 7050.

The transistor 7240c includes an oxide semiconductor layer 7550 formed over the insulating film 7120, a conductive film 7530 and a conductive film 7540 over the oxide semiconductor layer 7550, a gate insulating film 7520 over the oxide semiconductor layer 7550 and the conductive films 7530 and 7540, and a gate electrode 7510 overlapping with the oxide semiconductor layer 7550 with the gate insulating film 7520 placed therebetween. The transistor 7240c may further include an insulating film 7560 formed over the gate electrode 7510.

Figure 20D:
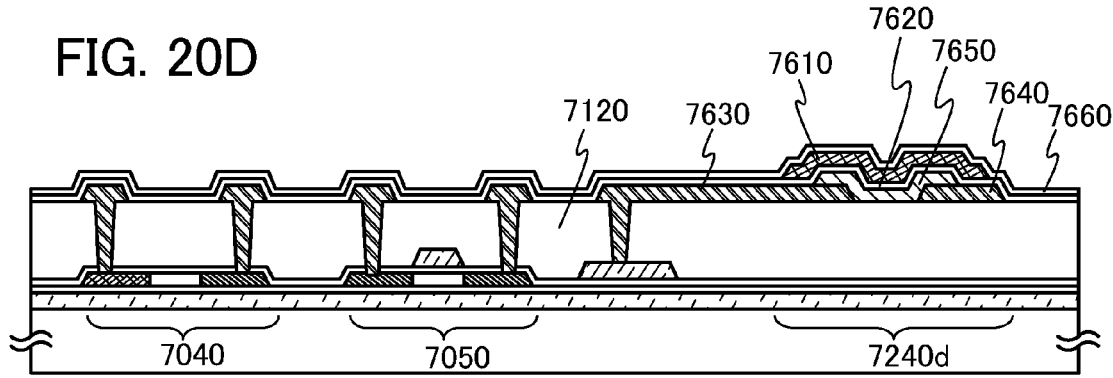

A photosensor in FIG. 20D includes the photodiode 7040 and the n-channel transistor 7050 as in Embodiment 8. In FIG. 20D, a top-contact transistor 7240d is formed over the photodiode 7040 and the n-channel transistor 7050.

The transistor 7240d includes a conductive film 7630 and a conductive film 7640 formed over the insulating film 7120, an oxide semiconductor layer 7650 over the conductive films 7630 and 7640, a gate insulating film 7620 over the oxide semiconductor layer 7650 and the conductive films 7630 and 7640, and a gate electrode 7610 overlapping with the oxide semiconductor layer 7650 with the gate insulating film 7620 placed therebetween. The transistor 7240d may further include an insulating film 7660 formed over the gate electrode 7610.

The photodiode 7040 can be used as the photodiode 402 illustrated in FIG. 3, FIGS. 17A and 17B, and the like. The n-channel transistor 7050 can be used as the transistors 404 and 405 illustrated in FIG. 3, FIGS. 17A and 17B, and the like. Each of the transistors 7240a to 7240d can be used as the transistor 403 illustrated in FIG. 3, FIGS. 17A and 17B, and the like. Each of the transistors 7240a to 7240d may be used as the transistors 404 and 405 illustrated in FIG. 3, FIGS. 17A and 17B, and the like.

This embodiment can be combined with any of the above embodiments.

(Embodiment 10)

In this embodiment, the structures of the photosensor 700_n and the photosensor 700_(n+1) adjacent to each other in Embodiment 3 are described in more detail. A structure example of an imaging device including photosensors arranged in a matrix of m rows and k columns is described with reference to FIG. 21, and a structure example that is different from the structure example in FIG. 21 is described with reference to FIG. 22.

Figure 21:
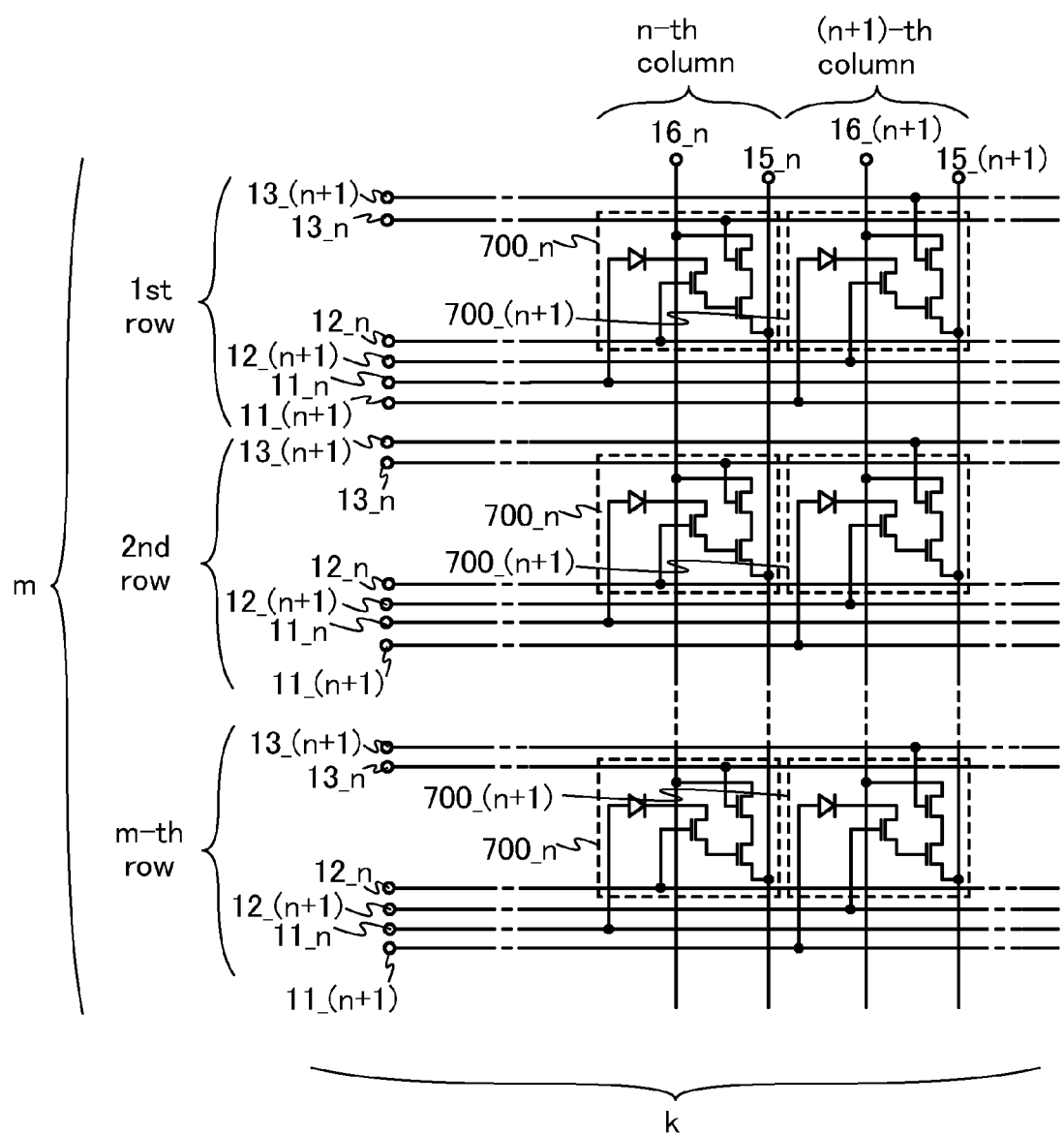
FIG. 21 is a circuit diagram of a plurality of photosensors arranged in matrix.
Figure 22:
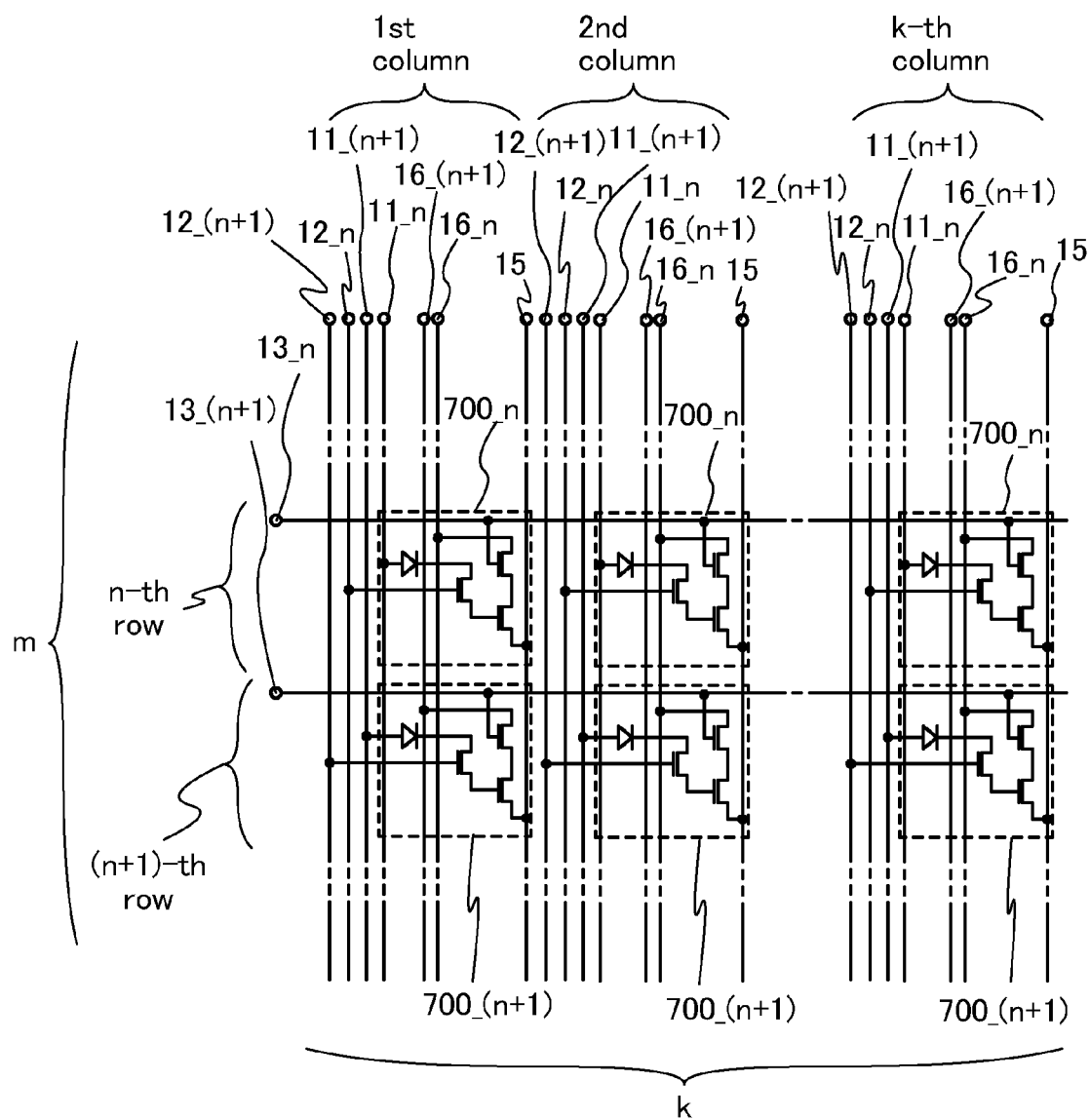
FIG. 22 is a circuit diagram of a plurality of photosensors arranged in matrix.

FIG. 21 illustrates the case where the photosensor 700_n and the photosensor 700_(n+1) in adjacent columns detect reflected light from the same point of an object. FIG. 22 illustrates the case where the photosensor 700_n and the photosensor 700_(n+1) in adjacent rows detect reflected light from the same point of an object. Note that these structures produce the same effect; thus, either of these structures can be used.

In FIG. 21, a plurality of photosensors are arranged in a matrix of m rows (m is a natural number of 2 or more) and k columns (k is a natural number of 2 or more). For example, the photosensor 700_n and the photosensor 700_(n+1) adjacent to each other in a first row detect reflected light from the same point of an object. Similarly, the photosensor 700_n and the photosensor 700_(n+1) adjacent to each other in an n-th row detect reflected light from the same point of an object.

Each of the photosensors 700_n in an n-th column (the photosensors 700_n in the first to m-th rows) is electrically connected to any one of the plurality of signal lines 11_n (the signal lines 11_n in the first to m-th rows), any one of the plurality of signal lines 12_n (the signal lines 12_n in the first to m-th rows), and any one of the plurality of signal lines 13_n (the signal lines 13_n in the first to m-th rows).

Each of the photosensors 700_(n+1) in an_(n+1)th column (the photosensors 700_(n+1) in the first to m-th rows) is electrically connected to any one of the plurality of signal lines 11_(n+1) (the signal lines 11_(n+1) in the first to m-th rows), any one of the plurality of signal lines 12_(n+1) (the signal lines 12_(n+1) in the first to m-th rows), and any one of the plurality of signal lines 13_(n+1) (the signal lines 13_(n+1) in the first to m-th rows).

The photosensors 700_n in the n-th column (the photosensors 700_n in the first to m-th rows) share a photosensor output signal line and a photosensor reference signal line. For example, the photosensor output signal line 16_n in the n-th column is electrically connected to the photosensors 700_n in the n-th column (the photosensors 700_n in the first to m-th rows). The photosensor reference signal line 15_n in the n-th column is electrically connected to the photosensors 700_n in the n-th column (the photosensors 700_n in the first to m-th rows).

The photosensors 700_(n+1) in the (n+1)th column (the photosensors 700_(n+1) in the first to m-th rows) share a photosensor output signal line and a photosensor reference signal line. For example, the photosensor output signal line 16_(n+1) in the (n+1)th column is electrically connected to the photosensors 700_(n+1) in the (n+1)th column (the photosensors 700_(n+1) in the first to m-th rows). The photosensor reference signal line 15_(n+1) in the (n+1)th column is electrically connected to the photosensors 700_(n+1) in the (n+1)th column (the photosensors 700_(n+1) in the first to m-th rows).

In FIG. 21, the photosensors in the n-th column share the photosensor reference signal line 15_n. The photosensors in the (n+1)th column share the photosensor reference signal line 15_(n+1). The photosensors in the n-th column share the photosensor output signal line 16_n. The photosensors in the (n+1)th column share the photosensor output signal line 16_(n+1).

However, the present invention is not limited thereto. For example, the plurality of photosensor reference signal lines 15 may be provided in each column and electrically connected to different photosensors. The plurality of photosensor output signal lines 16 may be provided in each column and electrically connected to different photosensors.

Although the photosensor reference signal line 15 and the photosensor output signal line 16 are shared by the photosensors in each column in FIG. 21, the present invention is not limited thereto. The photosensor reference signal line 15 and the photosensor output signal line 16 may be shared by the photosensors in each row.

As described above, wirings are shared between photosensors to reduce the number of wirings, so that a driver circuit for driving the photosensors arranged in the matrix of m rows and k columns can be simplified.

Next, a structure example of an imaging device including photosensors arranged in a matrix of m rows and k columns that is different from the structure example in FIG. 21 is described with reference to FIG. 22. In FIG. 22, a plurality of photosensors are arranged in a matrix of m rows (m is a natural number of 2 or more) and k columns (k is a natural number of 2 or more). For example, the photosensor 700_n and the photosensor 700_(n+1) adjacent to each other in the first column detect reflected light from the same point of an object. Similarly, the photosensor 700_n and the photosensor 700_(n+1) adjacent to each other in the n-th column detect reflected light from the same point of an object.

Each of the photosensors 700_n in the n-th row (the photosensors 700_n in the first to k-th columns) is electrically connected to any one of the plurality of signal lines 11_n (the signal lines 11_n in the first to k-th columns), any one of the plurality of signal lines 12_n (the signal lines 12_n in the first to k-th columns), and any one of the plurality of photosensor output signal lines 16_n (the photosensor output signal lines 16_n in the first to k-th columns).

Each of the photosensors 700_(n+1) in the (n+1)th row (the photosensors 700_(n+1) in the first to k-th columns) is electrically connected to any one of the plurality of signal lines 11_(n+1) (the signal lines 11_(n+1) in the first to k-th columns), any one of the plurality of signal lines 12_(n+1) (the signal lines 12_(n+1) in the first to k-th columns), and any one of the plurality of photosensor output signal lines 16_(n+1) (the photosensor output signal lines 16_(n+1) in the first to k-th columns).

The photosensors 700_n in the n-th row (the photosensors 700_n in the first to k-th columns) share the signal line 13_n. The photosensors 700_(n+1) in the (n+1)th row (the photosensors 700_(n+1) in the first to k-th columns) share the signal line 13_(n+1). For example, the signal line 13_n in the n-th row is electrically connected to the photosensors 700_n in the n-th row (the photosensors 700_n in the first to k-th columns). The signal line 13_(n+1) in the (n+1)th row is electrically connected to the photosensors 700_(n+1) in the (n+1)th row (the photosensors 700_(n+1) in the first to k-th columns).

The photosensors in each column share the photosensor reference signal line 15. For example, as illustrated in FIG. 22, the photosensors in the first column share the photosensor reference signal line 15. The photosensors in the second column share the photosensor reference signal line 15. The photosensors in the k-th column share the photosensor reference signal line 15.

However, the present invention is not limited thereto. For example, the plurality of photosensor reference signal lines 15 may be provided in each column and electrically connected to different photosensors.

Although the photosensor reference signal line 15 is shared by the photosensors in each column and the signal line 13 is shared by the photosensors in each row in FIG. 22, the present invention is not limited thereto. The photosensor reference signal line 15 may be shared by the photosensors in each row and the signal line 13 may be shared by the photosensors in each column.

As described above, wirings are shared between photosensors to reduce the number of wirings, so that a driver circuit for driving the photosensors arranged in the matrix of m rows and k columns can be simplified.

Note that the structures of the photosensor 700_n and the photosensor 700_(n+1) are similar to that of the photosensor 400. Thus, FIGS. 18A and 18B can be referred to for a top view and a cross-sectional view of these photosensors.

Note that this embodiment can be combined with any of the other embodiments in this specification as appropriate.

(Embodiment 11)

In this embodiment, an example of a structure where a plurality of photosensors are arranged in matrix in an imaging device is described with reference to FIGS. 23A and 23B. Note that Embodiment 4 can be referred to for the structures of the photosensors and the driving method.

Figure 23A:
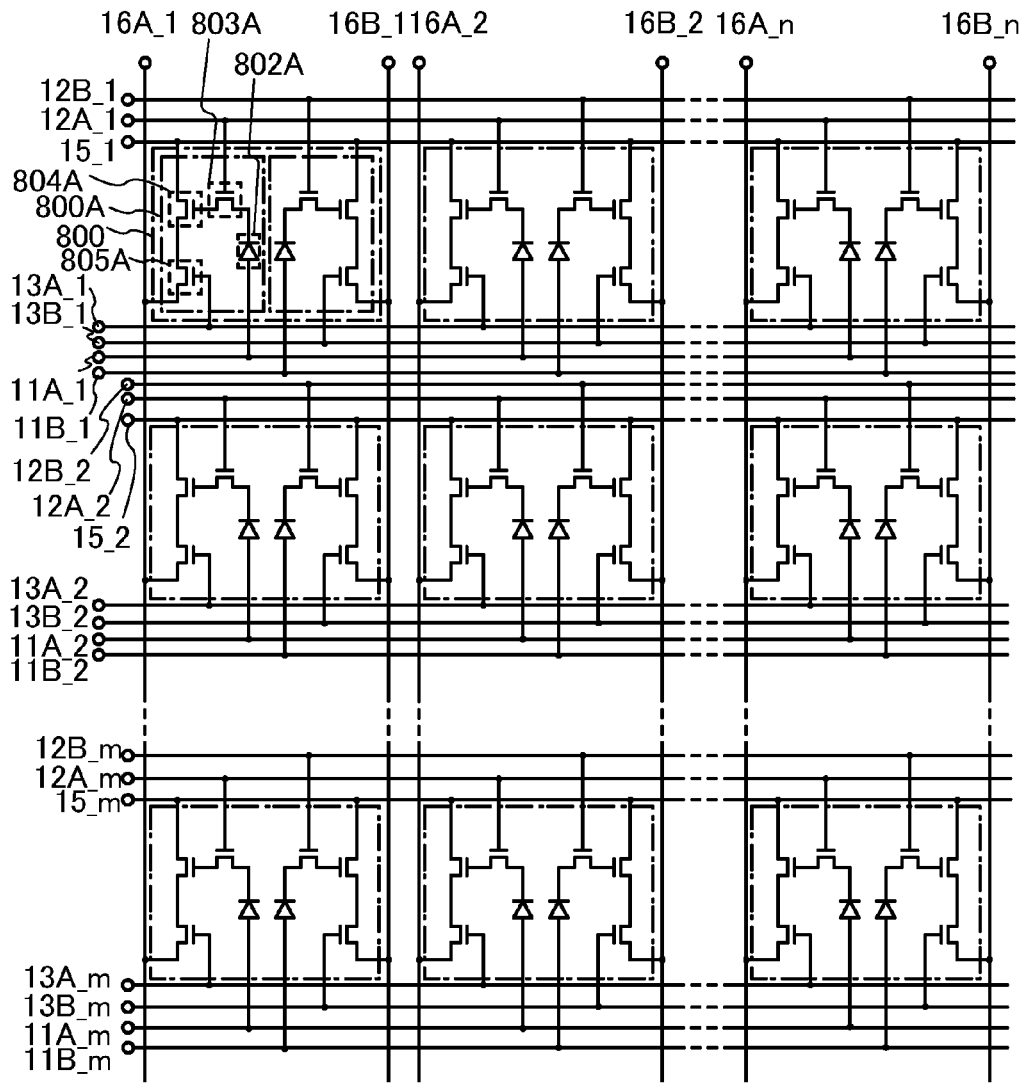
FIGS. 23A and 23B are circuit diagrams of a plurality of photosensors arranged in matrix.

In FIG. 23A, the plurality of photosensors 800 are arranged in a matrix of m rows (m is a natural number of 2 or more) and n columns (n is a natural number of 2 or more). The photosensors 800 in each row are electrically connected to any one of the plurality of signal lines (reset signal lines) 11A (11A_1 to 11A_m), any one of the plurality of signal lines (electric charge accumulation signal lines) 12A (12A_1 to 12A_m), any one of the plurality of signal lines (selection signal lines) 13A (13A_1 to 13A_m), any one of the plurality of signal lines (reset signal lines) 11B (11B_1 to 11B_m), any one of the plurality of signal lines (electric charge accumulation signal lines) 12B (12B_1 to 12B_m), any one of the plurality of signal lines (selection signal lines) 13B (13B_1 to 13B_m), and any one of the plurality of signal lines (photosensor reference signal lines) 15 (15_1 to 15_n). The photosensors 800 in each column are electrically connected to any one of the plurality of signal lines (photosensor output signal lines) 16A (16A_1 to 16A_n), and any one of the plurality of signal lines (photosensor output signal lines)$_{1-6}$B (16B_1 to 16B_n).

Figure 23B:
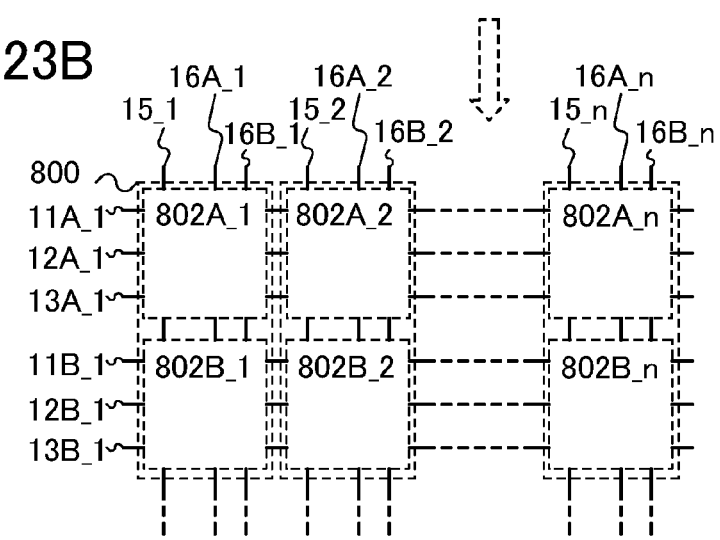

In FIGS. 23A and 23B, the photosensors 800 in each row share the signal line 11A (reset signal line), the signal line 12A (electric charge accumulation signal line), the signal line 13A (selection signal line), the signal line 11B (reset signal line), the signal line 12B (electric charge accumulation signal line), the signal line 13B (selection signal line), and the signal line 15 (photosensor reference signal line). Further, the photosensors 800 in each row share the signal line 16B (photosensor output signal line) and the signal line 16A (photosensor output signal line). Note that the connections to the signal lines are not limited to the above example.

In FIGS. 23A and 23B, the photosensors 800 in each row share the signal line 15 (photosensor reference signal line); however, the present invention is not limited to this structure. The signal line 15 (photosensor reference signal line) can be shared by the photosensors 800 in each column.

FIG. 23B illustrates arrangement of the first photodiodes 802A (802A_1 to 802A_n) in the first photosensors 800A and the second photodiodes 802B (802B_1 to 802B_n) in the second photosensors 800B. Here, light reflected off an object enters the first photodiodes 802A (802A_1 to 802A_n) before entering the second photodiodes 802B (802B_1 to 802B_n). Thus, light reflected off the object includes visible light that is reflected off the object irradiated with light from a light source or natural light, or both, and then enters the first photodiodes 802A; and infrared light that is reflected off the object irradiated with light from a light source, and then enters the second photodiodes 802B.

Further, amorphous silicon used for semiconductor layers of the first photodiodes 802A serving as visible light sensors absorb visible light that enters from the outside and transmit infrared light that enters from the outside. Thus, the first photodiodes 802A (802A_1 to 802A_n) can absorb mainly visible light, and the second photodiodes 802B (802B_1 to 802B_n) can absorb mainly infrared light. Further, entry of visible light into the second photodiode serving as the infrared light sensor can be reduced. Consequently, the first photosensors 800A can be used for 2D imaging using visible light, and the second photosensors 800B can be used for 3D imaging using infrared light, which reduces the area of the photosensors.

As described above, with the structure in this embodiment, the first photosensor 800A serving as a visible light sensor and the second photosensor 800B serving as an infrared light sensor overlap with each other, so that the area of the photosensor 800 in the imaging device can be reduced. As a result, pixel size can be reduced, and 2D imaging and 3D TOF imaging can be performed concurrently.

Note that this embodiment can be combined with any of the other embodiments in this specification as appropriate.
(Embodiment 12)

Figure 24:
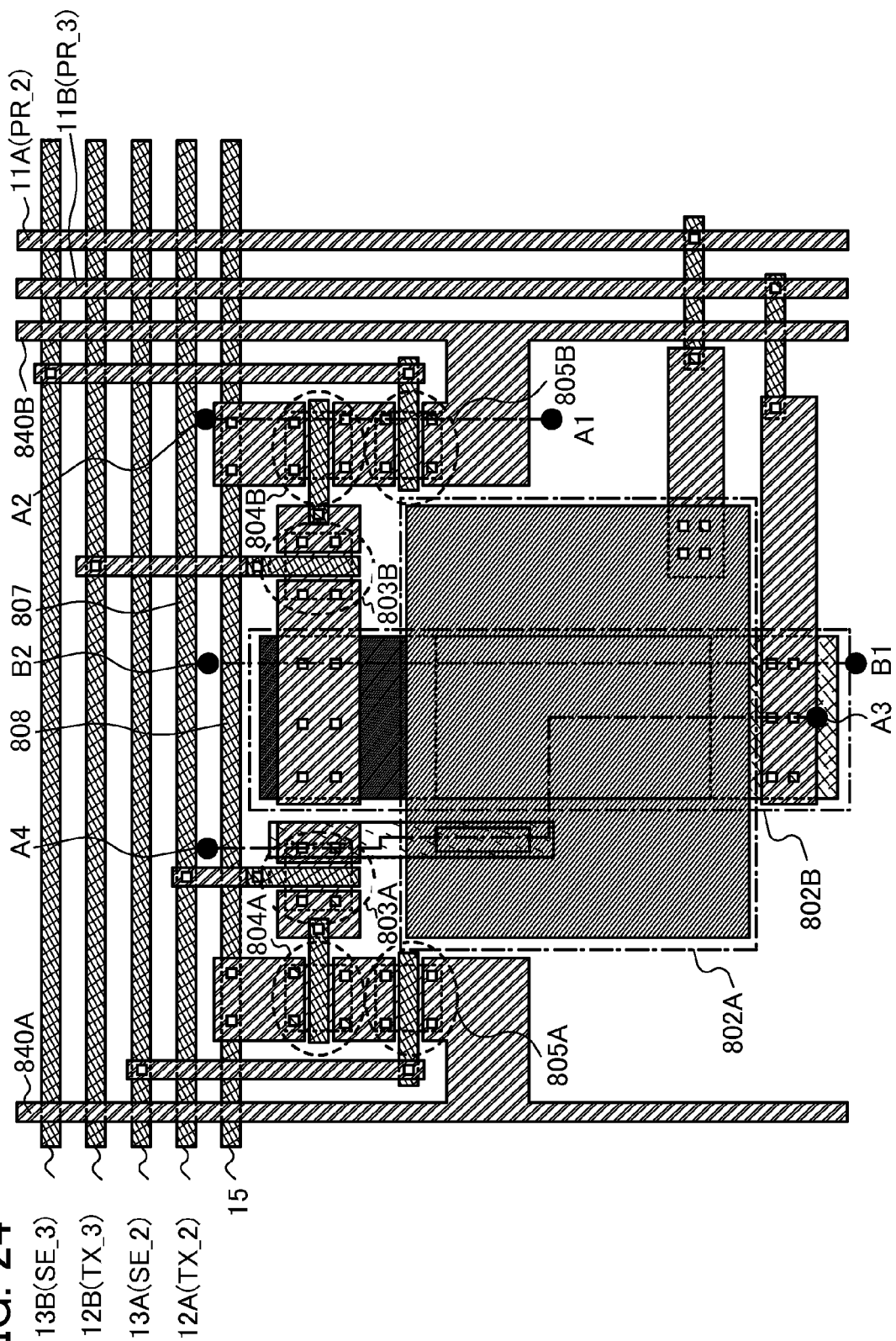
FIG. 24 is a top view of a photosensor.

In this embodiment, FIG. 24 is a top view of the photosensor in FIG. 3 and FIG. 4. FIG. 25A is a cross-sectional view taken along dashed line A1-A2 and dashed line A3-A4 in FIG. 24. FIG. 25B is a cross-sectional view taken along dashed line B1-B2 in FIG. 24.

FIG. 25A is described. In FIG. 25A, a light-blocking layer 831 and a base film 832 are provided over a light-transmitting substrate 880. A p-type semiconductor region 883 and an i-type semiconductor region 884 of the second photodiode 802B are provided over the light-blocking layer 831 with the base film 832 placed therebetween. An n-type semiconductor region 885 and an i-type semiconductor region 886 which form a semiconductor layer of the first transistor 804B are provided in the same layer as a semiconductor layer serving as the p-type semiconductor region 883 and the i-type semiconductor region 884 of the second photodiode 802B. Similarly, an n-type semiconductor region 887 and an i-type semiconductor region 888 which form a semiconductor layer of the second transistor 805B are provided in the same layer as the semiconductor layer serving as the p-type semiconductor region 883 and the i-type semiconductor region 884 of the second photodiode 802B. Similarly, an n-type semiconductor region 889 which forms a semiconductor layer of the third transistor 803A is provided in the same layer as the semiconductor layer serving as the p-type semiconductor region 883 and the i-type semiconductor region 884 of the second photodiode 802B.

Note that the light-transmitting substrate 880 is preferably a substrate formed using a material that transmits visible light and infrared light. For example, a plastic substrate that transmits visible light and infrared light or a glass substrate that transmits visible light and infrared light can be used.

Note that the light-blocking layer 831 prevents infrared light and visible light from a backlight from entering the first photodiode 802A and the second photodiode 802B. The light-blocking layer 831 is formed in such a manner that a metal material such as aluminum or chromium, which can block infrared light and visible light, is deposited by sputtering, CVD, or a coating method, and then is processed by photolithography and etching. It is preferable that the light-blocking layer 831 be provided not only in a region overlapping with the second photodiode 802B but also in a region overlapping with the semiconductor layers of the transistors 803, 804, and 805. By shielding the semiconductor layers of the transistors from light by the light-blocking film, deterioration in characteristics, such as a shift in threshold voltage of the transistor, due to entry of infrared light and visible light from the backlight can be prevented. Note that the backlight may include a light source that can emit infrared light and visible light from the light-transmitting substrate 880 side. Specifically, the backlight may have a structure in which a light-emitting diode that emits infrared light and a light-emitting diode that emits visible light are disposed.

Here, the backlight is provided on the light-transmitting substrate 880 side in order to deliver visible light and infrared light for detection of light to the first photodiode 802A and the second photodiode 802B. Note that a light-emitting diode that emits infrared light may be separately provided on a counter substrate side.

The base film 832 prevents an alkali metal such as Na or an alkaline earth metal included in the light-transmitting substrate 880 from diffusing into the second photodiode 802B and adversely affecting the characteristics. The base film 832 is formed by CVD, sputtering, or the like to have a single-layer or layered structure using a light-transmitting insulating material such as silicon oxide, silicon nitride, silicon oxynitride, or silicon nitride oxide. Note that a surface of the base film 832 preferably has a high degree of flatness in order to prevent defects at the time of formation of the semiconductor layer of the second photodiode 802B.

The semiconductor layer of the second photodiode 802B can be formed using crystalline silicon such as polycrystalline silicon. The second photodiode 802B including the semiconductor layer formed using crystalline silicon is provided so that the p-type semiconductor region 883, the i-type semiconductor region 884, and an n-type semiconductor region (not illustrated) are horizontal to the light-transmitting substrate 880. Further, the semiconductor layers of the transistors 803, 804, and 805 are formed using crystalline silicon such as polycrystalline silicon, and the n-type semiconductor region, the i-type semiconductor region, and the n-type semiconductor region are provided. The semiconductor layers of the second photodiode 802B and the transistors are formed in the following manner: deposited crystalline silicon is processed by photolithography and etching; a mask is formed by photolithography; and then a p-type or n-type impurity region is formed by ion implantation or ion doping.

Note that the semiconductor layer of the second photodiode 802B can be formed using crystalline silicon such as single crystal silicon obtained by bonding and separation. First, hydrogen ions (e.g., H+, $H_2$+, or $H_3$+) or a set of hydrogen ions and helium ions are added into a semiconductor wafer such as a silicon wafer, so that a fragile layer is formed in the semiconductor wafer. The semiconductor wafer is bonded onto the base film 832 and is separated along the fragile layer by heat treatment, so that a semiconductor layer is formed on the base film 832. The depth from a surface of the semiconductor wafer to the fragile layer corresponds to the thickness of the semiconductor layer; thus, the thickness of the semiconductor layer can be adjusted by controlling conditions of addition of hydrogen ions or the like.

In FIG. 24 and FIG. 25A, an insulating layer 810 is provided over the semiconductor layer of the second photodiode 802B, the semiconductor layer of the first transistor 804B, the semiconductor layer of the second transistor 805B, and the semiconductor layer of the third transistor 803A. Over the i-type semiconductor region 886, a gate electrode 811 is formed in the same layer as a transfer control line 807 and a power supply line 808 with the insulating layer 810 placed therebetween. Over the i-type semiconductor region 888, a gate electrode 812 is formed in the same layer as the transfer control line 807 and the power supply line 808 with the insulating layer 810 placed therebetween. Over the insulating layer 810, the power supply line 808 is formed in the same layer as the transfer control line 807.

The insulating layer 810 prevents an alkali metal such as Na or an alkaline earth metal from the outside from diffusing into the second photodiode 802B and adversely affecting the characteristics. The insulating layer 810 is formed by plasma-enhanced CVD, sputtering, or the like to have a single-layer or layered structure using a light-transmitting insulating material such as a silicon oxide film, a silicon oxynitride film, a silicon nitride oxide film, or an organic resin film.

Note that a variety of wirings formed in the same layer as the gate electrode 811 and the gate electrode 812 may be formed using a conductive metal material. The wirings are formed to have a single-layer or layered structure using any of the following as the conductive metal material: a metal material such as molybdenum, titanium, chromium, tantalum, tungsten, aluminum, copper, neodymium, or scandium; and an alloy material which includes any of these metal materials as its main component. The wirings are formed by sputtering or vacuum vapor deposition.

In FIG. 24 and FIG. 25A, an insulating layer 813 is provided over the insulating layer 810, the gate electrode 811, the gate electrode 812, and the power supply line 808. Between the n-type semiconductor region 885 and the n-type semiconductor region 887, a conductive layer 814 is formed in the same layer as a first output signal line 840A and a second output signal line 840B with the insulating layer 810 and the insulating layer 813 placed therebetween. The second output signal line 840B is formed over the n-type semiconductor region 887 with the insulating layer 810 and the insulating layer 813 placed therebetween. Between the n-type semiconductor region 885 and the power supply line 808, a conductive layer 815 is formed in the same layer as the first output signal line 840A and the second output signal line 840B with the insulating layer 810 and the insulating layer 813 placed therebetween. Over the p-type semiconductor region 883, a conductive layer 816 is formed in the same layer as the first output signal line 840A and the second output signal line 840B with the insulating layer 810 and the insulating layer 813 placed therebetween. Over the n-type semiconductor region 889, a conductive layer 817 is formed in the same layer as the first output signal line 840A and the second output signal line 840B with the insulating layer 810 and the insulating layer 813 placed therebetween.

Note that the insulating layer 813 is formed by plasma-enhanced CVD, sputtering, or the like to have a single-layer or layered structure using a light-transmitting insulating material such as a silicon oxide film, a silicon oxynitride film, a silicon nitride oxide film, or an organic resin film.

The conductive layers 814 to 817 are each formed by sputtering or vacuum vapor deposition to have a single-layer or layered structure using any of the following materials: a metal such as molybdenum, titanium, chromium, tantalum, tungsten, aluminum, copper, or yttrium; an alloy material including any of these metals as its main component; a conductive metal oxide such as indium oxide; and the like.

In FIG. 25A, a p-type semiconductor region 818, an i-type semiconductor region 819, and an n-type semiconductor region 820 of the first photodiode 802A are provided over the insulating layer 813 and the conductive layer 816. Note that the p-type semiconductor region 818 of the first photodiode 802A is provided so that an end portion thereof is stacked over the conductive layer 816.

The semiconductor layer of the first photodiode 802A can be formed using amorphous silicon. The first photodiode 802A including the semiconductor layer formed using amorphous silicon is provided so that the p-type semiconductor region 818, the i-type semiconductor region 819, and the n-type semiconductor region 820 are stacked perpendicularly to the light-transmitting substrate 880.

The p-type semiconductor region 818 is formed using amorphous silicon including an impurity element imparting p-type conductivity. The p-type semiconductor region 818 is formed by plasma-enhanced CVD with the use of a semiconductor source gas including an impurity element that belongs to Group 13 of the periodic table (e.g., boron (B)). As the semiconductor material gas, silane ($SiH_4$) may be used. Alternatively, $S1_2H_6$, $SiH_2Cl_2$, $SiHCl_3$, $SiCl_4$, $SiF_4$, or the like may be used. The p-type semiconductor region 818 is preferably formed to a thickness of 10 to 50 nm.

The i-type semiconductor region 819 is formed using amorphous silicon. In the formation of the i-type semiconductor region 819, amorphous silicon is deposited by plasma-enhanced CVD with the use of a semiconductor source gas. As the semiconductor material gas, silane ($SiH_4$) may be used. Alternatively, $S1_2H_6$, $SiH_2Cl_2$, $SiHCl_3$, $SiCl_4$, $SiF_4$, or the like may be used. The i-type semiconductor region 819 is preferably formed to a thickness of 880 to 8000 nm.

The n-type semiconductor region 820 is formed using amorphous silicon including an impurity element imparting n-type conductivity. The n-type semiconductor region 820 is formed by plasma-enhanced CVD with the use of a semiconductor source gas including an impurity element that belongs to Group 15 of the periodic table (e.g., phosphorus (P)). As the semiconductor material gas, silane ($SiH_4$) may be used. Alternatively, $S1_2H_6$, $SiH_2Cl_2$, $SiHCl_3$, $SiCl_4$, $SiF_4$, or the like may be used. The n-type semiconductor region 820 is preferably formed to a thickness of 20 to 880 nm.

In FIG. 25A, an insulating layer 821 is provided over the first photodiode 802A, the second output signal line 840B, the conductive layer 814, the conductive layer 815, the conductive layer 816, and the conductive layer 817. Between the n-type semiconductor region 820 and the conductive layer 817, a conductive layer 822 is formed in the same layer as a conductive layer serving as a pixel electrode with the insulating layer 821 placed therebetween.

The insulating layer 821 is formed by plasma-enhanced CVD, sputtering, or the like to have a single-layer or layered structure using a light-transmitting insulating material such as a silicon oxide film, a silicon oxynitride film, a silicon nitride oxide film, or an organic resin film. It is preferable that the insulating layer 821 be an insulating layer having a flat surface.

Note that the conductive layer 822 is a light-transmitting conductive layer and formed using a material such as indium tin oxide (ITO), indium tin oxide including silicon oxide (ITSO), or indium zinc oxide (IZO).

Next, FIG. 25B is described. In the cross-sectional view in FIG. 25B, the light-blocking layer 831 and the base film 832 are provided over the light-transmitting substrate 880. Over the light-blocking layer 831, the p-type semiconductor region 883, the i-type semiconductor region 884, and an n-type semiconductor region 823 of the second photodiode 802B are provided with the base film 832 placed therebetween.

In FIG. 25B, the insulating layer 810 is provided over the semiconductor layer of the second photodiode 802B. Over the insulating layer 810, the power supply line 808 is formed in the same layer as the transfer control line 807.

In FIG. 24 and FIG. 25B, the insulating layer 813 is provided over the insulating layer 810 and the power supply line 808. Over the p-type semiconductor region 883, the conductive layer 816 is formed in the same layer as the first output signal line 840A and the second output signal line 840B with the insulating layer 810 and the insulating layer 813 placed therebetween. Over the n-type semiconductor region 823, a conductive layer 824 is formed in the same layer as the first output signal line 840A and the second output signal line 840B with the insulating layer 810 and the insulating layer 813 placed therebetween.

In FIG. 25B, the p-type semiconductor region 818, the i-type semiconductor region 819, and the n-type semiconductor region 820 of the first photodiode 802A are provided over the insulating layer 813 and the conductive layer 816. Note that the p-type semiconductor region 818 of the first photodiode 802A is provided so that an end portion thereof is stacked over the conductive layer 816.

In FIG. 25B, the insulating layer 821 is provided over the first photodiode 802A, the conductive layer 816, and the conductive layer 824.

Note that this embodiment can be combined with any of the other embodiments in this specification as appropriate.

Reference Numerals

1: calling number, 2: calling number, 3: calling number, 11: signal line, 12: signal line, 13: signal line, 14: node, 15: signal line, 16: signal line, 17: signal line, 18: node, 100: motion recognition device, 101: imaging device, 102: image processor, 103: information processor, 104: imaging data, 105: output data, 110: image storage, 111: storage, 112: storage, 113: storage, 114: storage, 115: object data detector, 116: motion data detector, 117: output controller, 210: conductive film, 211: conductive film, 212: conductive film, 213: conductive film, 214: conductive film, 215: semiconductor film, 216: semiconductor film, 217: semiconductor film, 218: conductive film, 219: conductive film, 220: conductive film, 221: conductive film, 222: conductive film, 223: conductive film, 224: conductive film, 225: conductive film, 226: conductive film, 227: conductive film, 228: gate insulating film, 250: semiconductor layer, 251: substrate, 281: insulating film, 282: insulating film, 301: step, 302: step, 303: step, 304: step, 305: step, 306: step, 307: step, 308: step, 309: step, 310: step, 311: step, 312: step, 313: step, 314: step, 315: step, 316: step, 317: step, 318: step, 319: step, 400: photosensor, 401: circuit, 402: photodiode, 403: transistor, 404: transistor, 405: transistor, 406: transistor, 501: pulse, 502: pulse, 601: pulse, 602: pulse, 700: photosensor, 702: photodiode, 703: transistor, 704: transistor, 705: transistor, 800: photosensor, 800A: photosensor, 800B: photosensor, 802: photodiode, 802A: photodiode, 802B: photodiode, 803: transistor, 803A: transistor, 803B: transistor, 804: transistor, 804A: transistor, 804B: transistor, 805: transistor, 805A: transistor, 805B: transistor, 807: transfer control line, 808: power supply line, 810: insulating layer, 811: gate electrode, 812: gate electrode, 813: insulating layer, 814: conductive layer, 815: conductive layer, 816: conductive layer, 817: conductive layer, 818: p-type semiconductor region, 819: i-type semiconductor region, 820: n-type semiconductor region, 821: insulating layer, 822: conductive layer, 823: n-type semiconductor region, 824: conductive layer, 831: light-blocking layer, 832: base film, 840A: output signal line, 840B: output signal line, 880: light-transmitting substrate, 883: p-type semiconductor region, 884: i-type semiconductor region, 885: n-type semiconductor region, 886: i-type semiconductor region, 887: n-type semiconductor region, 888: i-type semiconductor region, 889: n-type semiconductor region, 901: pulse, 902: pulse, 5000: cellular phone, 5001: speaker, 5002: housing, 5003: display portion, 5004: operation button, 5005: recognition range, 6000: IH cooking heater, 6001: display portion, 6001a: display portion, 6001b: display portion, 6001c: display portion, 6002a: IH heater, 6002b: IH heater, 6002c: IH heater, 6003: plate, 6004: power lamp, 6005: operation button, 6006: exhaust port, 6007a: recognition range, 6007b: recognition range, 6007c: recognition range, 7000: microwave oven, 7001: display portion, 7002: operation button, 7003: window, 7004: door handle, 7005: housing, 7006: door, 7007: recognition range, 7008: power lamp, 7010: insulating film, 7020: semiconductor film, 7030: semiconductor film, 7040: photodiode, 7050: n-channel transistor, 7060: substrate, 7070: gate electrode, 7080: insulating film, 7110: wiring, 7120: insulating film, 7130: gate electrode, 7140: gate insulating film, 7150: oxide semiconductor layer, 7160: conductive film, 7170: conductive film, 7180: conductive film, 7190: conductive film, 7200: conductive film, 7210: conductive film, 7220: insulating film, 7240: transistor, 7240a: transistor, 7240b: transistor, 7240c: transistor, 7240d: transistor, 7270: region, 7280: region, 7290: region, 7300: gate electrode, 7310: gate insulating film, 7320: oxide semiconductor layer, 7330: channel protective film, 7340: conductive film, 7350: conductive film, 7360: insulating film, 7410: gate electrode, 7420: gate insulating film, 7430: conductive film, 7440: conductive film, 7450: oxide semiconductor layer, 7460: insulating film, 7510: gate electrode, 7520: gate insulating film, 7530: conductive film, 7540: conductive film, 7550: oxide semiconductor layer, 7560: insulating film, 7610: gate electrode, 7620: gate insulating film, 7630: conductive film, 7640: conductive film, 7650: oxide semiconductor layer, and 7660: insulating film.

This application is based on Japanese Patent Application serial No. 2011-284139 filed with Japan Patent Office on Dec. 26, 2011, Japanese Patent Application serial No. 2012-007680 filed with Japan Patent Office on Jan. 18, 2012, and Japanese Patent Application serial No. 2012-014533 filed with Japan Patent Office on Jan. 26, 2012, the entire contents of which are hereby incorporated by reference.

The invention claimed is:

1. A motion recognition device comprising:
an image processor;
an imaging device; and
a light source,
wherein the image processor is configured to extract first object data of an object at a first motion time from first range image information at the first motion time using specific object patterns,
wherein the image processor is configured to extract second object data of the object at a second motion time from second range image information at the second motion time using the specific object patterns,
wherein the image processor is configured to extract motion data of the object in a period from the first motion time to the second motion time using specific motion patterns,
wherein each of the first range image information and the second range image information is acquired by the imaging device comprising a photosensor comprising a photodiode,
wherein the photosensor is configured to acquire range image information by:
performing first reset operation by supplying a first signal to a first terminal of the photodiode from a first time to a second time;
performing first irradiation of the object with first light from the light source from the second time to a fourth time;
performing first imaging by detecting the first light reflected off the object from the second time to the fourth time;
performing second irradiation of the object with second light from the light source from an eighth time to an eleventh time;
performing second reset operation by supplying the first signal to the first terminal of the photodiode from tenth time to the eleventh time; and
performing second imaging by detecting the second light reflected off the object from the eleventh time to a thirteenth time,
wherein a time length from the second time to the fourth time and a time length from the eighth time to the eleventh time are the same, and
wherein a distance x from the light source to the object is obtained by a first detection signal S1 obtained by the first imaging, a second detection signal S2 obtained by the second imaging, a period of each of the first irradiation and the second irradiation T, and light speed c by:

$$x = \frac{c \times T \times S2}{2 \times (S1 + S2)}.$$

2. The motion recognition device according to claim 1,
wherein the photosensor comprises a first transistor and a second transistor,
wherein a first terminal of the first transistor is electrically connected to a second terminal of the photodiode,
wherein a second terminal of the first transistor is electrically connected to a gate of the second transistor, and
wherein the imaging device is configured to acquire the range image information by:

performing the first imaging by supplying a second signal to a gate of the first transistor from the second time to the fourth time; and
performing the second imaging by supplying the second signal to the gate of the first transistor from the eleventh time to the thirteenth time.

3. The motion recognition device according to claim 2,
wherein the first transistor comprises an oxide semiconductor layer comprising a channel formation region.

4. A motion recognition device comprising:
an image processor;
an imaging device; and
a light source,
wherein the image processor is configured to extract first object data of an object at a first motion time from first range image information at the first motion time using specific object patterns,
wherein the image processor is configured to extract second object data of the object at a second motion time from second range image information at the second motion time using the specific object patterns,
wherein the image processor is configured to extract motion data of the object in a period from the first motion time to the second motion time using specific motion patterns,
wherein each of the first range image information and the second range image information is acquired by the imaging device comprising a first photosensor and a second photosensor adjacent to each other,
wherein the first photosensor comprises a first photodiode,
wherein the second photosensor comprises a second photodiode,
wherein the imaging device is configured to acquire range image information by:
performing first reset operation for the first photosensor from a first time to a second time;
performing first irradiation of the object with first light from the light source from the second time to a fifth time;
performing first imaging for the first photosensor by detecting the first light reflected off the object from the second time to the fifth time;
performing second reset operation for the second photosensor from a fourth time to the fifth time; and
performing second imaging for the second photosensor by detecting the first light reflected off the object from the fifth time to a seventh time,
wherein a distance x from the light source to the object is obtained by a first detection signal S1 obtained by the first imaging, a second detection signal S2 obtained by the second imaging, a period of the first irradiation T, and light speed c by:

$$x = \frac{c \times T \times S2}{2 \times (S1 + S2)}.$$

5. The motion recognition device according to claim 4,
wherein the first photosensor comprises a first transistor and a second transistor,
wherein the second photosensor comprises a third transistor and a fourth transistor,
wherein a first terminal of the first transistor is electrically connected to a second terminal of the first photodiode,
wherein a second terminal of the first transistor is electrically connected to a gate of the second transistor, wherein a first terminal of the third transistor is electrically connected to a second terminal of the second photodiode, wherein a second terminal of the third transistor is electrically connected to a gate of the fourth transistor, and wherein the imaging device is configured to acquire the range image information by:

performing the first imaging for the first photosensor by supplying a second signal to a gate of the first transistor from the second time to the fifth time; and performing the second imaging for the second photosensor by supplying the second signal to a gate of the third transistor from the fifth time to the seventh time.

6. The motion recognition device according to claim 5, wherein the first transistor comprises an oxide semiconductor layer comprising a channel formation region, and wherein the third transistor comprises an oxide semiconductor layer comprising a channel formation region.

7. A motion recognition device comprising:

an image processor;

an imaging device; and a light source, wherein the image processor is configured to extract first object data of an object at a first motion time from first range image information at the first motion time using specific object patterns, wherein the image processor is configured to extract second object data of the object at a second motion time from second range image information at the second motion time using the specific object patterns, wherein the image processor is configured to extract motion data of the object in a period from the first motion time to the second motion time using specific motion patterns, wherein each of the first range image information and the second range image information is acquired by the imaging device comprising a first photosensor and a second photosensor, wherein the first photosensor comprises a first photodiode, wherein the second photosensor comprises a second photodiode formed over the first photodiode, wherein the imaging device is configured to acquire range image information by:

performing first reset operation for the first photosensor from a first time to a second time;

performing first irradiation of the object with first light from the light source from the second time to a fourth time;

performing first imaging for the first photosensor by detecting the first light reflected off the object from the second time to the fourth time;

performing second irradiation of the object with second light from the light source from an eighth time to an eleventh time;

performing second reset operation for the first photosensor from a tenth time to the eleventh time;

performing second imaging for the first photosensor by detecting the second light reflected off the object from the eleventh time to a thirteenth time; and performing third imaging for the second photosensor by detecting third light from the second time to the fourth time and from the eleventh time to the thirteenth time, wherein a time length from the second time to the fourth time and a time length from the eighth time to the eleventh time are the same, and wherein a distance x from the light source to the object is obtained by a first detection signal S1 obtained by the first imaging, a second detection signal S2 obtained by the second imaging, a period of each of the first irradiation and the second irradiation T, and light speed c by:

$$x = \frac{c \times T \times S2}{2 \times (S1 + S2)}.$$

8. The motion recognition device according to claim 7, wherein the first photosensor comprises a first transistor and a second transistor, wherein a first terminal of the first transistor is electrically connected to a second terminal of the first photodiode, wherein a second terminal of the first transistor is electrically connected to a gate of the second transistor, and wherein the imaging device is configured to acquire the range image information by:

performing the first imaging for the first photosensor by supplying a third signal to a gate of the first transistor from the second time to the fourth time; and performing the second imaging for the first photosensor by supplying the third signal to the gate of the first transistor from the eleventh time to the thirteenth time.

9. The motion recognition device according to claim 8, wherein the first transistor comprises an oxide semiconductor layer comprising a channel formation region.

10. The motion recognition device according to claim 9, wherein the first light comprises first infrared light, wherein the second light comprises second infrared light, and wherein the imaging device is configured to acquire the range image information by:

performing the first imaging for the first photosensor by detecting the first infrared light reflected off the object and transmitted through the second photodiode; and performing the second imaging for the first photosensor by detecting the second infrared light reflected off the object and transmitted through the second photodiode.

11. The motion recognition device according to claim 10, wherein the first photodiode comprises a single crystal silicon, and wherein the second photodiode comprises an amorphous silicon.

* * * * *